United States Patent
Chang

(10) Patent No.: US 10,985,190 B2
(45) Date of Patent: Apr. 20, 2021

(54) ACTIVE DEVICE SUBSTRATE AND FABRICATING METHOD THEREOF

(71) Applicant: Au Optronics Corporation, Hsinchu (TW)

(72) Inventor: Chi-Ho Chang, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 101 days.

(21) Appl. No.: 16/197,382

(22) Filed: Nov. 21, 2018

(65) Prior Publication Data

US 2019/0157306 A1    May 23, 2019

(30) Foreign Application Priority Data

Nov. 22, 2017   (TW) .................................. 106140483

(51) Int. Cl.
*H01L 27/12*    (2006.01)
*H01L 29/786*    (2006.01)
(Continued)

(52) U.S. Cl.
CPC ........ *H01L 27/124* (2013.01); *H01L 27/1218* (2013.01); *H01L 27/1222* (2013.01); *H01L 27/1262* (2013.01); *H01L 27/1288* (2013.01); *H01L 29/41733* (2013.01); *H01L 29/42384* (2013.01); *H01L 29/78603* (2013.01); *H01L 29/78696* (2013.01); *G02F 1/1368* (2013.01)

(58) Field of Classification Search
CPC ............. H01L 29/78603; H01L 29/786; H01L 29/0603; H01L 29/0657; H01L 29/78618; H01L 29/78642; H01L 29/0847; H01L 29/78696

See application file for complete search history.

(56) References Cited

U.S. PATENT DOCUMENTS 6,933,527 B2 * 8/2005 Isobe ................. H01L 21/2022
                                                257/59
7,190,419 B2 * 3/2007 Park .................. G02F 1/136209
                                                349/106

(Continued)

FOREIGN PATENT DOCUMENTS

| CN | 105810691 | 7/2016 |
|---|---|---|
| CN | 106068567 | 11/2016 |
| WO | 2015134082 | 9/2015 |

*Primary Examiner* — Sophia T Nguyen
(74) *Attorney, Agent, or Firm* — JCIPRNET

(57) ABSTRACT

An active device substrate including a substrate and an active device is provided. The active device includes a protrusion, a gate disposed on the protrusion, a semiconductor layer, a gate insulation layer disposed between the gate and the semiconductor layer, a first electrode and a second electrode electrically connected to the semiconductor layer. The protrusion has a first upper surface, a second upper surface, an inner surface and an outer surface. The inner surface and the first upper surface define a concave portion. The inner surface, the second upper surface and the outer surface define a convex portion. The semiconductor layer is disposed on the first upper surface, the inner surface, the second upper surface and the outer surface. The first electrode is disposed on at least one portion of the outer surface. The second electrode is disposed in the concave portion of the protrusion.

20 Claims, 43 Drawing Sheets

(51) Int. Cl.
*H01L 29/417* (2006.01)
*H01L 29/423* (2006.01)
*G02F 1/1368* (2006.01)

(56) References Cited

U.S. PATENT DOCUMENTS

| | | | | |
|---|---|---|---|---|
| 8,247,818 B2* | 8/2012 | Ishii | H01L 29/78642 | 257/59 |
| 8,823,082 B2* | 9/2014 | Yanagisawa | H01L 29/42384 | 257/329 |
| 9,012,913 B2* | 4/2015 | Noda | H01L 27/1255 | 257/57 |
| 9,853,059 B2* | 12/2017 | Sasaki | H01L 27/1237 | |
| 9,859,308 B1* | 1/2018 | Ellinger | H01L 29/78696 | |
| 10,163,937 B2* | 12/2018 | Chang | H01L 27/124 | |
| 10,431,701 B2* | 10/2019 | Sun | H01L 31/1884 | |
| 2006/0209222 A1* | 9/2006 | Yasuda | G02F 1/136286 | 349/43 |
| 2008/0111955 A1* | 5/2008 | Lu | G02F 1/134309 | 349/106 |
| 2009/0057731 A1* | 3/2009 | Kitajima | H01L 29/1037 | 257/288 |
| 2010/0301337 A1* | 12/2010 | Rider | H01L 29/41733 | 257/57 |
| 2011/0063260 A1* | 3/2011 | Wang | G09G 3/3677 | 345/204 |
| 2011/0121284 A1* | 5/2011 | Yamazaki | H01L 29/7869 | 257/43 |
| 2011/0136301 A1* | 6/2011 | Yamazaki | H01L 29/78648 | 438/156 |
| 2011/0140303 A1* | 6/2011 | Jang | B82Y 10/00 | 264/293 |
| 2011/0147756 A1* | 6/2011 | Moriguchi | H01L 29/78645 | 257/60 |
| 2011/0303917 A1* | 12/2011 | Lee | H01L 27/1218 | 257/59 |
| 2012/0056180 A1* | 3/2012 | Chen | H01L 29/6675 | 257/57 |
| 2012/0105787 A1* | 5/2012 | Gotoh | G02F 1/1368 | 349/139 |
| 2012/0223311 A1* | 9/2012 | Endo | H01L 29/7869 | 257/57 |
| 2012/0286264 A1* | 11/2012 | Suzuki | H01L 27/1292 | 257/43 |
| 2013/0015436 A1* | 1/2013 | Yamazaki | H01L 29/45 | 257/43 |
| 2013/0228779 A1* | 9/2013 | Lan | H01L 29/786 | 257/49 |
| 2014/0061869 A1* | 3/2014 | Nelson | H01L 21/02315 | 257/635 |
| 2014/0312352 A1* | 10/2014 | Nakagawa | G02F 1/136227 | 257/72 |
| 2014/0370668 A1* | 12/2014 | Niebojewski | H01L 21/02667 | 438/166 |
| 2015/0171113 A1* | 6/2015 | Honjo | H01L 29/78612 | 257/72 |
| 2015/0277199 A1* | 10/2015 | Chang | G02F 1/136286 | 349/12 |
| 2015/0340512 A1* | 11/2015 | Li | H01L 29/78606 | 257/72 |
| 2016/0027812 A1* | 1/2016 | Kim | H01L 21/76831 | 257/43 |
| 2016/0035903 A1* | 2/2016 | Okachi | H01L 29/78603 | 257/66 |
| 2016/0131954 A1* | 5/2016 | Li | G09G 3/3614 | 349/46 |
| 2016/0133754 A1* | 5/2016 | Moon | H01L 29/42384 | 349/43 |
| 2016/0197099 A1* | 7/2016 | Sasaki | H01L 29/66969 | 257/43 |
| 2016/0284774 A1* | 9/2016 | Zhang | H01L 29/78603 | |
| 2016/0300941 A1* | 10/2016 | Cheng | H01L 29/7789 | |
| 2016/0336419 A1* | 11/2016 | Oh | H01L 27/1222 | |
| 2016/0351724 A1* | 12/2016 | Zhao | H01L 29/10 | |
| 2016/0365369 A1* | 12/2016 | Ellinger | H01L 27/1225 | |
| 2016/0365459 A1* | 12/2016 | Hong | G02F 1/1368 | |
| 2016/0380114 A1* | 12/2016 | Kong | H01L 29/78603 | 257/72 |
| 2017/0110516 A1* | 4/2017 | Harding | H01L 51/0003 | |
| 2017/0170160 A1* | 6/2017 | Yen | H01L 25/50 | |
| 2017/0229483 A1* | 8/2017 | Chang | H01L 29/78642 | |
| 2017/0243972 A1* | 8/2017 | Lee | H01L 29/1037 | |
| 2017/0317110 A1* | 11/2017 | Lee | G02F 1/136209 | |
| 2018/0294361 A1* | 10/2018 | An | H01L 29/10 | |
| 2018/0350889 A1* | 12/2018 | Son | H01L 27/3248 | |
| 2019/0035334 A1* | 1/2019 | Lin | G09G 3/3258 | |
| 2019/0115368 A1* | 4/2019 | Li | G09G 3/3648 | |
| 2019/0157306 A1* | 5/2019 | Chang | H01L 27/1288 | |
| 2019/0296138 A1* | 9/2019 | Hayashi | H01L 21/3065 | |
| 2020/0234647 A1* | 7/2020 | Lin | G09G 3/3275 | |

* cited by examiner

ACTIVE DEVICE SUBSTRATE AND FABRICATING METHOD THEREOF

CROSS-REFERENCE TO RELATED APPLICATION

This application claims the priority benefit of Taiwan application serial no. 106140483, filed on Nov. 22, 2017. The entirety of the above-mentioned patent application is hereby incorporated by reference herein and made a part of this specification.

BACKGROUND OF THE INVENTION

Field of the Invention

The invention relates to a device substrate and a fabricating method thereof, and particularly relates to an active device substrate and a fabricating method thereof.

Description of Related Art

Among various flat panel displays (FPDs), thin film transistor liquid crystal display (TFT-LCD) is particularly popular for features, such as high space utilization, low power consumption, free of radiation, low electromagnetic interference, and so on. Such TFT-LCD is mainly composed of an active array substrate, a color filter substrate, and a liquid crystal (LC) layer between the two substrates. The active array substrate has a display region and a peripheral region. An active array is disposed in the display region and a driving circuit is disposed in the peripheral region.

Take the active array on the active region as an example, a thin film transistor with a high W/L ratio (channel width to channel length ratio) is often used. In general, the on-current (Ion) of the thin film transistor is proportional to the W/L ratio and satisfies the equation: $Ion = U*W/L*(VG-Vth)*VD$, wherein U represents the carrier mobility, W represents the channel width, L represents the channel length, VG represents the gate voltage, Vth represents the threshold voltage, and VD represents the drain voltage. From the above equation, it can be known that the on-current (Ion) can be raised by increasing the W/L ratio. However, due to limitation of the existing exposure and development processes, currently the channel length can only be reduced to about 3.5 μm.

Another option for effectively increasing the W/L ratio is to increase the channel width, but the increase of the channel width may often lead to a substantial increase of the component layout area and result in loss of the aperture ratio. Therefore, some have proposed to form the thin film transistor on a protrusion, so as to increase the W/L ratio without compromising the aperture ratio. However, in the process of forming the thin film transistor on the protrusion, it is required to form a thin photoresist material on the substrate and the protrusion and use the height of the protrusion to divide the thin photoresist material into a first photoresist portion on the upper surface of the protrusion and a second photoresist portion on the substrate and a partial outer surface of the protrusion; and then use the first photoresist portion and the second photoresist portion as etching masks to pattern the conductive layer, so as to form a source and a drain and further to define the channel size of the thin film transistor. The channel size of the thin film transistor is substantially equal to the size of the gap between the first photoresist portion and the second photoresist portion. However, the size of the gap between the first photoresist portion and the second photoresist portion is closely related to the processes of applying the thin photoresist material, such as the tape angle and height of the protrusion and the distance to the protrusion. It is not easy to control the tape angle of the protrusion and stability of the processes of applying the thin photoresist material, which results in variations among the channels of thin film transistors formed on the same substrate (i.e., large variation in electrical characteristics, such as on-current) and makes it difficult to carry out mass production.

SUMMARY OF THE INVENTION

The invention provides an active device substrate suitable for mass production.

An active device substrate according to one or some embodiments of the invention includes a substrate, an active device disposed on the substrate, and a pixel electrode electrically connected to a second electrode of the active device. The active device includes a protrusion, a semiconductor layer, a gate insulation layer, a first electrode, and the second electrode. The protrusion has a first upper surface, a second upper surface, an inner surface, and an outer surface. A distance between the second upper surface and the substrate is longer than a distance between the first upper surface and the substrate. The inner surface connects between the first upper surface and the second upper surface. The inner surface and the first upper surface define a concave portion of the protrusion. The outer surface is connected to at least one side of the second upper surface. The inner surface, the second upper surface, and the outer surface define a convex portion of the protrusion. A gate covers the protrusion. The semiconductor layer is disposed on the first upper surface, the inner surface, the second upper surface, and the outer surface of the protrusion. The gate insulation layer is disposed between the gate and the semiconductor layer. The first electrode is disposed on at least a portion of the outer surface of the protrusion and is electrically connected to the semiconductor layer. The second electrode is disposed in the concave portion of the protrusion and is electrically connected to the semiconductor layer. The first electrode and the second electrode are separated by the convex portion of the protrusion.

Based on the above, the fabricating method of the active device substrate according to an embodiment of the invention includes: forming a photoresist layer to cover the concave-convex structure (i.e., the aforementioned concave portion and convex portion) of the protrusion and the conductive layer disposed on the concave-convex structure of the protrusion; thinning the photoresist layer to form a patterned photoresist layer that exposes the convex portion of the protrusion; and patterning the conductive layer with the patterned photoresist layer as an etching mask to form the first electrode and the second electrode of the active device. In other words, the size of the gap between the first electrode and the second electrode is determined by the convex portion of the protrusion. The portion of the semiconductor layer that overlaps the gap between the first electrode and the second electrode may be regarded as a channel of the active device. Since there are readily available processes for forming the protrusion having the concave portion and the convex portion, the size of the convex portion of the protrusion can be precisely controlled. Thus, the channel size defined by the convex portion of the protrusion can be precisely controlled as well. Therefore, the variations among the channel sizes of multiple active devices of the active device substrate are suppressed to make the electrical characteristics of the active devices more consistent, and thus the active device substrate is suitable for mass production.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1I are schematic cross-sectional views showing a fabricating process of an active device substrate according to an embodiment of the invention. FIG. 2A is a schematic top view of the active device substrate according to an embodiment of the invention. FIG. 2B is a schematic enlarged view of a portion of a display region of the active device substrate of FIG. 2A. Particularly, FIG. 1I corresponds to the section line A-A' of FIG. 2B, and a common electrode 194 is omitted from FIG. 2B.

Figure 1A:
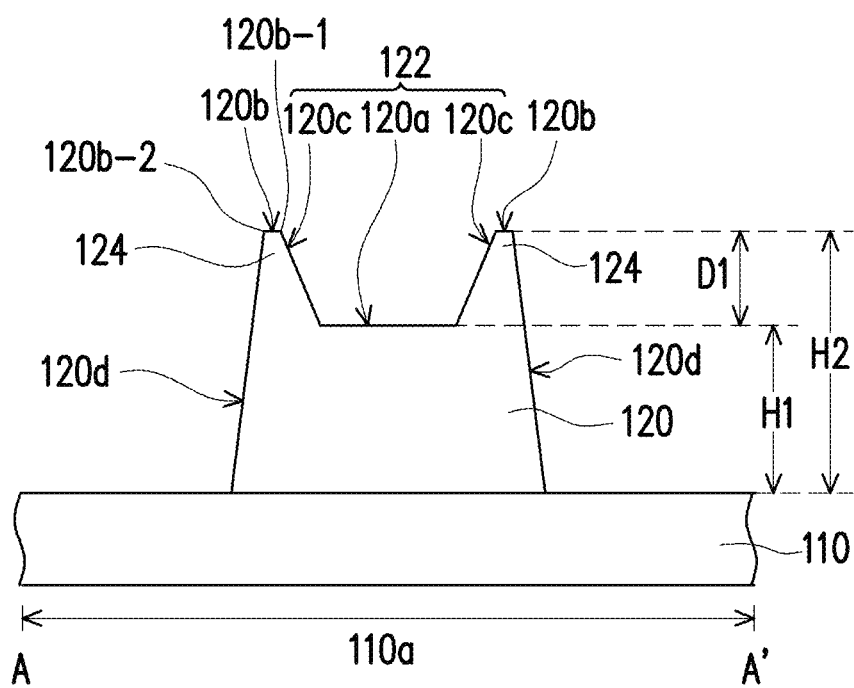
FIG. 1A to FIG. 1I are schematic cross-sectional views showing a fabricating process of an active device substrate according to an embodiment of the invention.
Figure 2A:
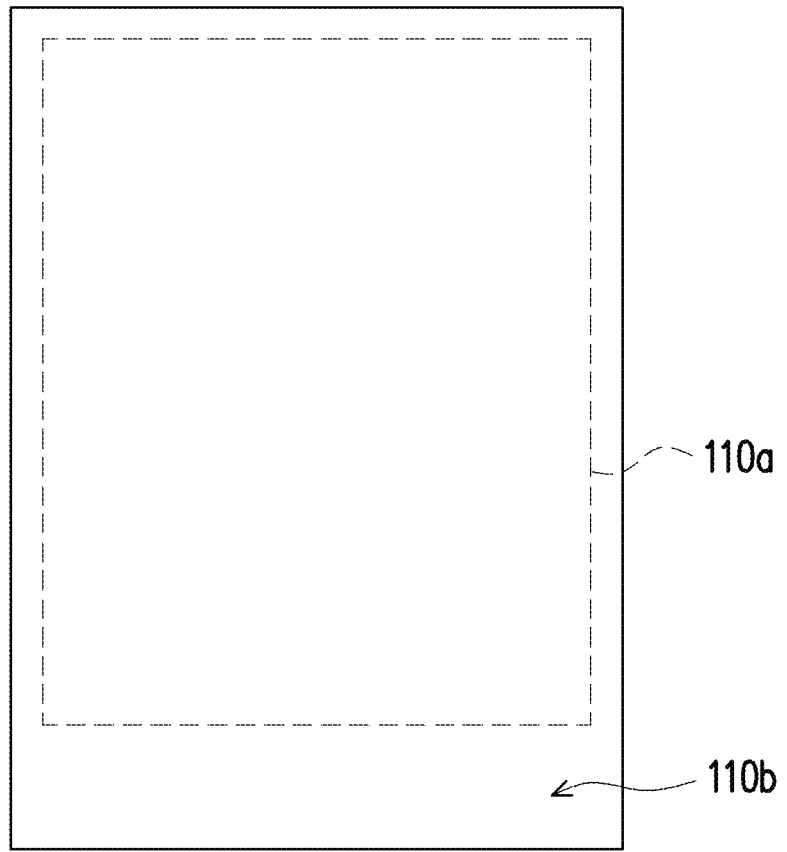
FIG. 2A is a schematic top view of an active device substrate according to an embodiment of the invention.
Figure 2B:
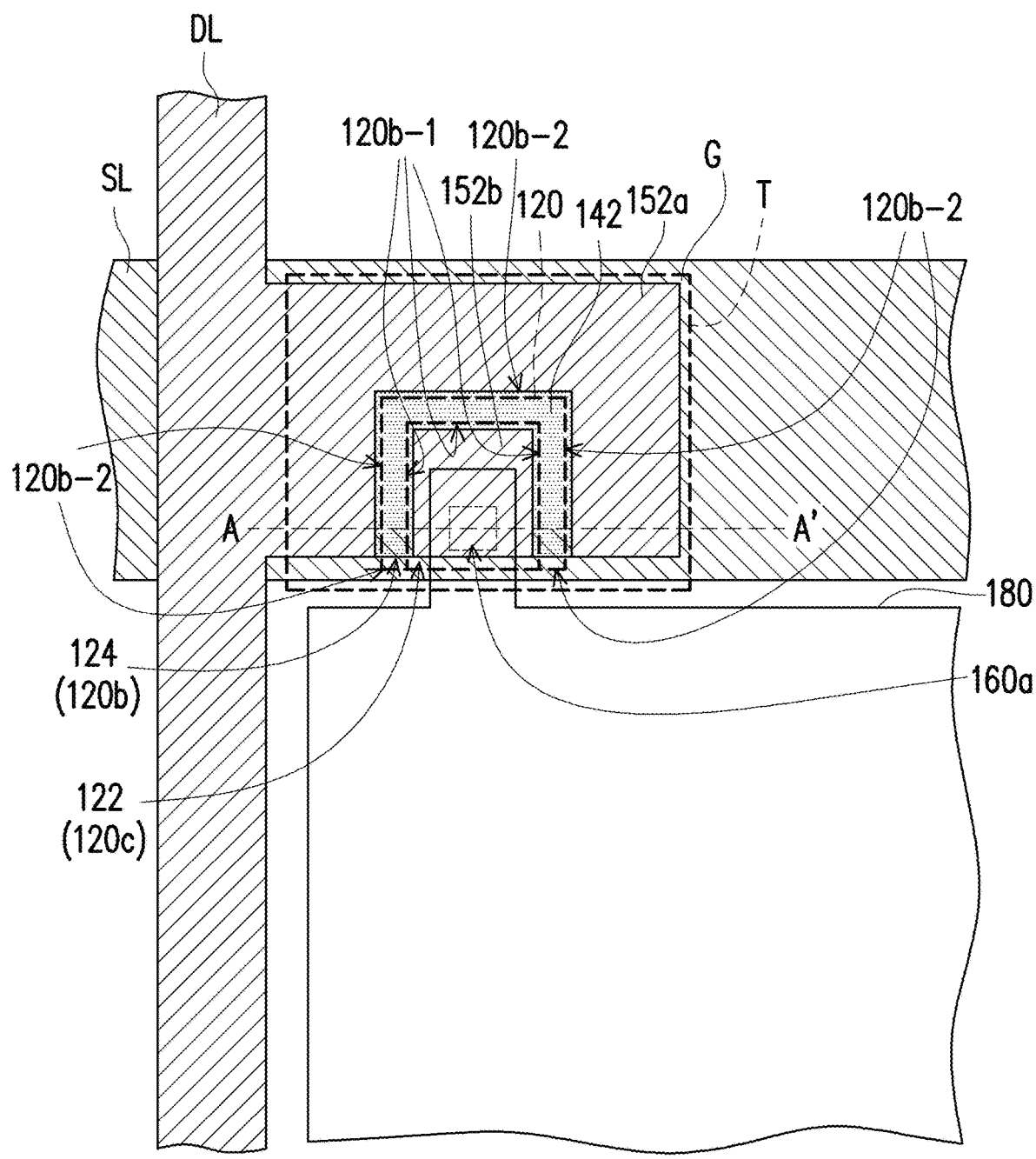
FIG. 2B is a schematic enlarged view of a portion of a display region of the active device substrate of FIG. 2A.

Referring to FIG. 1A, first, a substrate 110 is provided. In this embodiment, the substrate 110 may include a display region 110a and a peripheral region 110b outside the display region 110a (as shown in FIG. 2A). In this embodiment, a material of the substrate 110 may be glass, quartz, an organic polymer, an opaque/reflective material (e.g., a conductive material, a metal, a wafer, ceramics, or other suitable materials), or other suitable materials. If the material of the substrate 110 is a conductive material, an insulation layer (not shown) may be disposed to cover the substrate 110 to prevent a short circuit.

Referring to FIG. 1A, then, a protrusion 120 is formed on the substrate 110. The protrusion 120 has a first upper surface 120a, a second upper surface 120b, an inner surface 120c, and an outer surface 120d. A distance H2 between the second upper surface 120b and the substrate 110 is longer than a distance H1 between the first upper surface 120a and the substrate 110. The inner surface 120c connects between the first upper surface 120a and the second upper surface 120b. The inner surface 120c and the first upper surface 120a define a concave portion 122 of the protrusion 120. The outer surface 120d and the second upper surface 120b are connected on at least one side 120b-2 (as shown in FIG. 2B). The inner surface 120c, the second upper surface 120b, and the outer surface 120d define a convex portion 124 of the protrusion 120. A height difference between the second upper surface 120b and the first upper surface 120a is a depth D1 of the concave portion 122.

Referring to FIG. 1A and FIG. 2B, for example, in this embodiment, the second upper surface 120b (e.g., a ⊓-shaped surface as shown in FIG. 2B) has an inner side 120b-1 and an outer side 120b-2 opposite to each other. The inner side 120b-1 of the second upper surface 120b is directly connected to the inner surface 120c of the concave portion 122 and is not directly connected to the first upper surface 120a of the concave portion 122. The outer side 120b-2 of the second upper surface 120b is located outside the area of the first upper surface 120a. The outer surface 120d of the protrusion 120 is directly connected to the outer side 120b-2 of the second upper surface 120b. The outer surface 120d, the second upper surface 120b, and the inner surface 120c define the convex portion 124 of the protrusion 120. Referring to FIG. 2B, in this embodiment, the convex portion 124 of the protrusion 120 located in the display region 110a may be selectively designed as a non-closed bump. For example, in this embodiment, the convex portion 124 may be designed as a ⊓-shaped bump, but the invention is not limited thereto. In other embodiments, the non-closed convex portion 124 may also be designed as bumps in other suitable shapes (e.g., a U-shaped bump, an inverted U-shaped bump, an I-shaped bump, an L-shaped bump, an inverted L-shaped bump, or bumps in other suitable forms). In addition, the convex portion 124 of the invention is not necessarily a non-closed bump. In other embodiments, the convex portion 124 may also be designed as a closed bump (e.g., a hollow square bump, an O-shaped bump, or bumps in other suitable forms).

For example, in this embodiment, a patterning process may be performed on a protrusion material layer disposed on the substrate 110 with a half tone mask, so as to form the protrusion 120 having the concave portion 122 and the convex portion 124. The patterning process may include lithography and etching processes, but the invention is not limited thereto. In this embodiment, a material of the protrusion 120 may include an inorganic material (e.g., silicon oxide, silicon nitride, silicon oxynitride, other suitable materials, or a stack layer of at least two of the foregoing materials), an organic material, a conductive material, a non-conductive material, other suitable materials, or a combination of the foregoing. In an embodiment, an insulation layer (not shown) may be disposed to cover the protrusion 120 after the protrusion 120 is completed, so as to protect the integrity of the structure of the protrusion 120 in the subsequent processes.

Figure 1B:
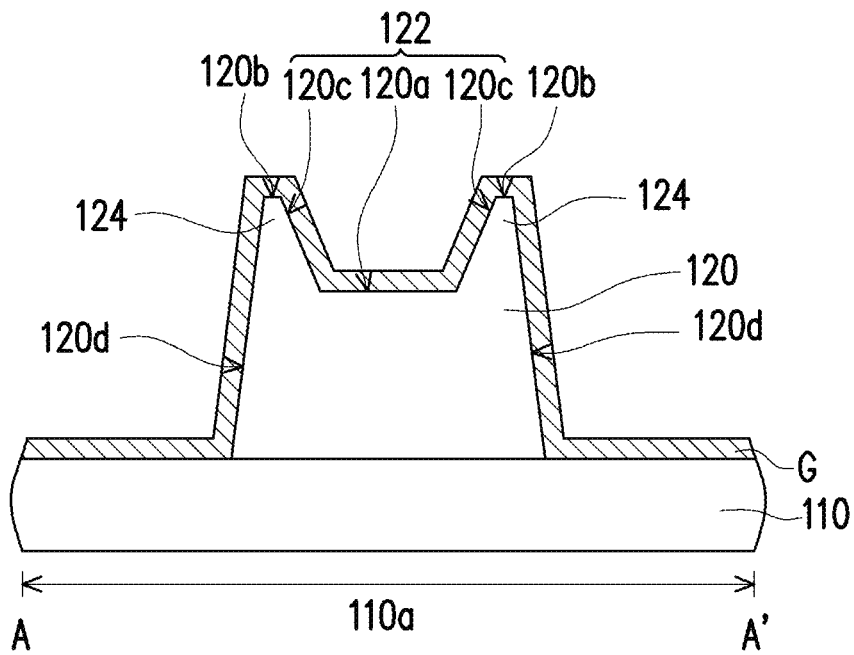

Referring to FIG. 1B and FIG. 2B, next, a gate G may be formed on the substrate 110 and the protrusion 120. The gate G covers the protrusion 120. For example, in this embodiment, the gate G may completely cover the protrusion 120. The gate G may be located on the first upper surface 120a, the second upper surface 120b, the inner surface 120c, and the outer surface 120d of the protrusion 120. In this embodiment, the gate G may further extend from the protrusion 120 to be above a portion of the substrate 110, but the invention is not limited thereto. In this embodiment, as the gate G is formed, a scan line SL (as shown in FIG. 2B) may be formed, wherein the scan line SL and the gate G are electrically connected. In this embodiment, the gate G may be a portion of the scan line SL. However, the invention is not limited thereto. In other embodiments, the gate G may be a branch that extends outward from the scan line SL.

For example, in this embodiment, a patterning process may be performed on a first conductive layer disposed on the substrate 110 and the protrusion 120, so as to form the gate G and the scan line SL at the same time. The patterning process may include lithography and etching processes, for example, but the invention is not limited thereto. In this embodiment, a material of the gate G and the scan line SL includes a metal, a metal oxide, an organic conductive material, or a combination of the foregoing. In this embodiment, the gate G and the scan line SL are single-layer structures, for example, but the invention is not limited thereto. In other embodiments, the gate G and the scan line SL may be double-layer structures or multi-layer stack structures.

Figure 1C:
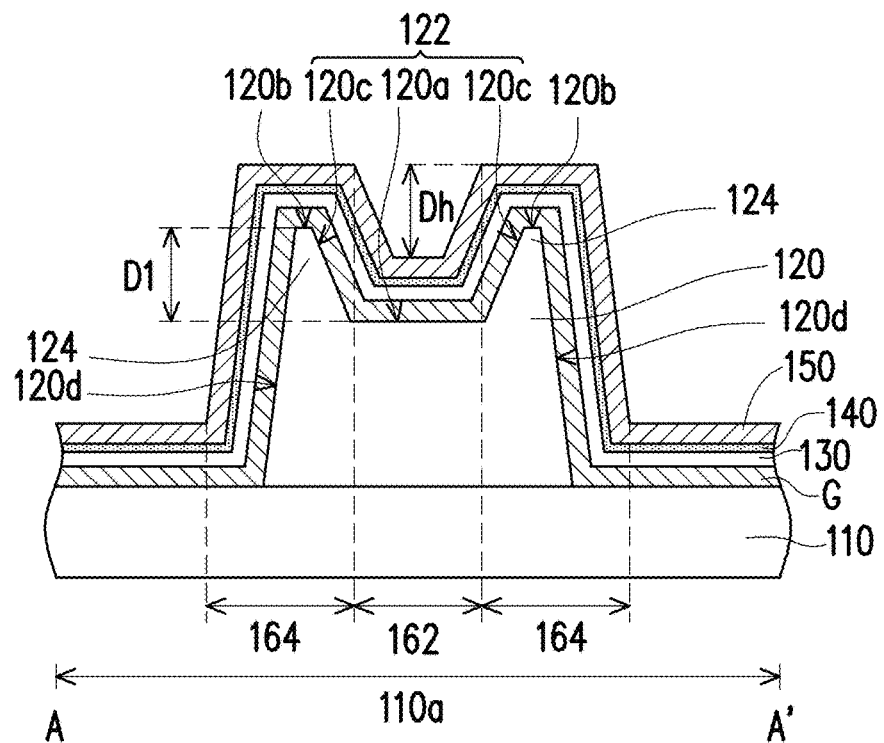
Figure 1D:
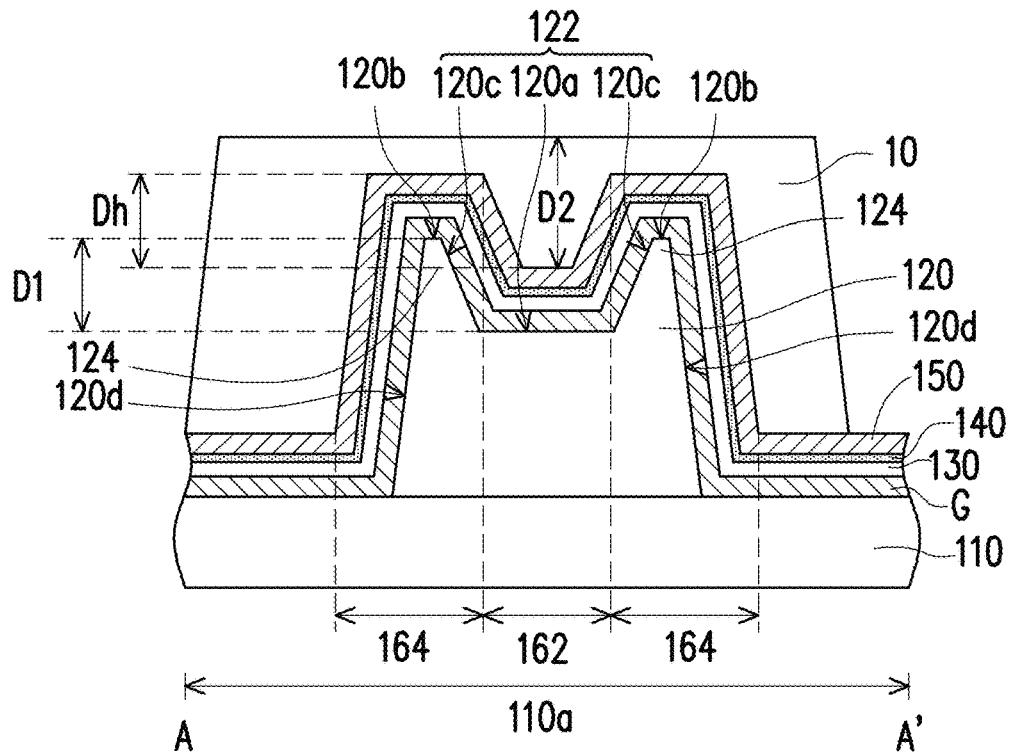

Thereafter, referring to FIG. 1C, a gate insulation layer 130, a semiconductor material layer 140, and a conductive material layer 150 may be formed sequentially on the substrate 110 and the gate G. The gate insulation layer 130, the semiconductor material layer 140, and the conductive material layer 150 cover the protrusion 120, the gate G, and the substrate 110. Since the protrusion 120 has the concave portion 122 and the convex portion 124, the layers formed to cover the protrusion 120 are formed with a concave portion 162 and a convex portion 164 corresponding to the shape of the protrusion 120, and a depth Dh of the concave portion 162 is substantially equal to or slightly smaller than the depth D1 of the concave portion 122. Referring to FIG. 1D, then, a photoresist layer 10 is formed on the conductive material layer 150. The photoresist layer 10 covers the protrusion 120 and a portion of the conductive material layer 150. The photoresist layer 10 may cover the portion of the conductive material layer 150 that is located on the first upper surface 120a, the second upper surface 120b, the inner surface 120c, and the outer surface 120d of the protrusion 120. A thickness D2 of the photoresist layer 10 located on the concave portion 122 exceeds the depth Dh of the concave portion 162. That is, the thickness D2 of the photoresist layer 10 located on the concave portion 122 exceeds the depth D1 of the concave portion 122.

Figure 1E:
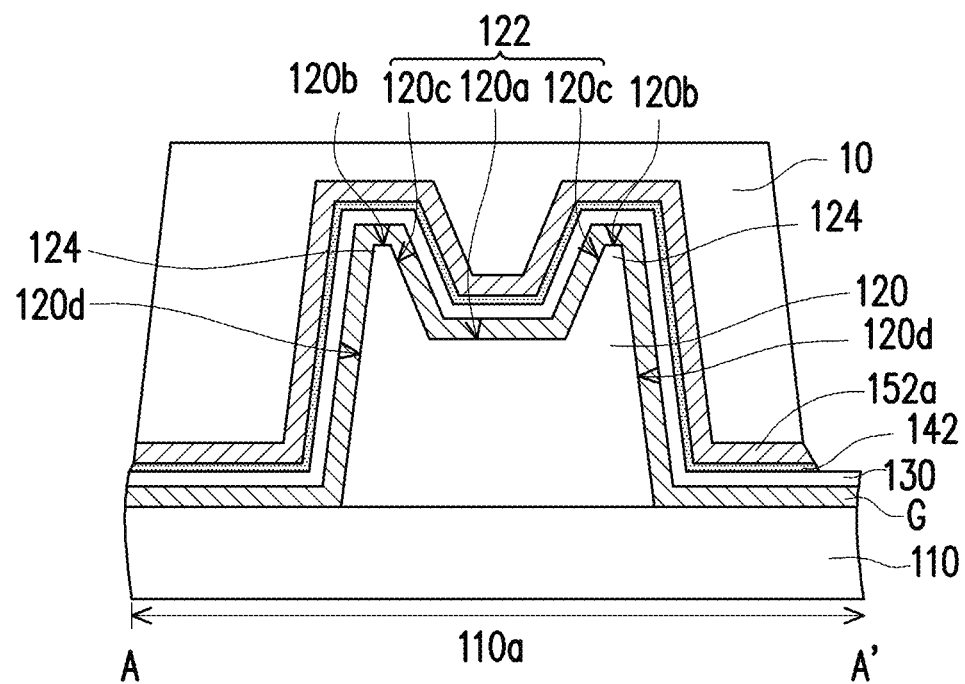

Referring to FIG. 1D and FIG. 1E, next, the conductive material layer 150 and the semiconductor material layer 140 are patterned with the photoresist layer 10 as an etching mask, so as to form a conductive layer 152 and a semiconductor layer 142. In this embodiment, since the conductive layer 152 and the semiconductor layer 142 are Mimed by using the same photoresist layer 10 as an etching mask, the conductive layer 152 and the semiconductor layer 142 are substantially flush with each other, but the invention is not limited thereto. In other embodiments, the conductive layer 152 and the semiconductor layer 142 may be patterned separately, for example, so as to form the required pattern. For example, the semiconductor layer 142 may be patterned first, and thereafter the conductive material layer 150 is formed and then patterned.

In this embodiment, a material of the gate insulation layer 130 includes an inorganic material (e.g., silicon oxide, silicon nitride, silicon oxynitride, other suitable materials, or a stack layer of at least two of the foregoing materials), an organic material, other suitable materials, or a combination of the foregoing. In this embodiment, a material of the semiconductor layer 142 may be amorphous silicon, polycrystalline silicon, microcrystalline silicon, monocrystalline silicon, an organic semiconductor material, an oxide semiconductor material (e.g., indium zinc oxide, indium gallium zinc oxide, other suitable materials, or a combination of the foregoing), other suitable materials, one of the foregoing that contains a dopant, or a combination of the foregoing. The conductive layer 152 includes a metal, a metal oxide, an organic conductive material, or a combination of the foregoing. In this embodiment, the gate insulation layer 130, the semiconductor layer 142, and the conductive layer 152 are single-layer structures, for example, but the invention is not limited thereto. In other embodiments, the gate insulation layer 130, the semiconductor layer 142, and the conductive layer 152 may be double-layer structures or multi-layer stack structures.

Figure 1F:
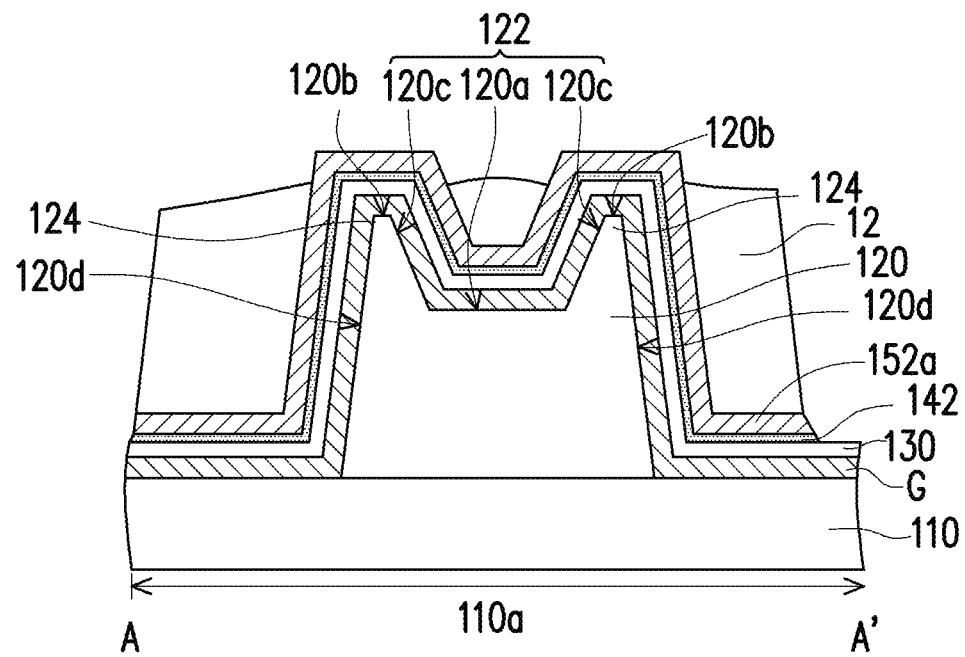

Referring to FIG. 1E and FIG. 1F, then, the photoresist layer 10 is thinned, so as to form a patterned photoresist layer 12. The patterned photoresist layer 12 covers the portion of the conductive layer 152 located on the first upper surface 120a, the inner surface 120c, and the outer surface 120d of the protrusion 120 and exposes the portion of the conductive layer 152 located on the second upper surface 120b of the protrusion 120. For example, in this embodiment, the process parameters may be adjusted properly to thin the photoresist layer 10 properly by a thickness D (not shown), wherein (D2−D1)≤D<D2, such that the thinned photoresist layer 10 (i.e., the patterned photoresist layer 12) exposes the portion of the conductive layer 152 on the convex portion 124 and covers the portion of the conductive layer 152 on the concave portion 122, the outer surface 120d, and a portion of the substrate 110. In this embodiment, the photoresist layer 10 may be thinned by an ashing process, so as to form the patterned photoresist layer 12, but the invention is not limited thereto. Referring to FIG. 1E, in this embodiment, the semiconductor layer 142 is located on the first upper surface 120a, the inner surface 120c, the second upper surface 120b, and the outer surface 120d of the protrusion 120. In this embodiment, the semiconductor layer 142 may further extend from the protrusion 120 to be above a portion of the substrate 110. The gate insulation layer 130 is located between the gate G and the semiconductor layer 142. The conductive layer 152 is located on a portion of the substrate 110 and the first upper surface 120a, the inner surface 120c, the second upper surface 120b, and the outer surface 120d of the protrusion 120.

Figure 1G:
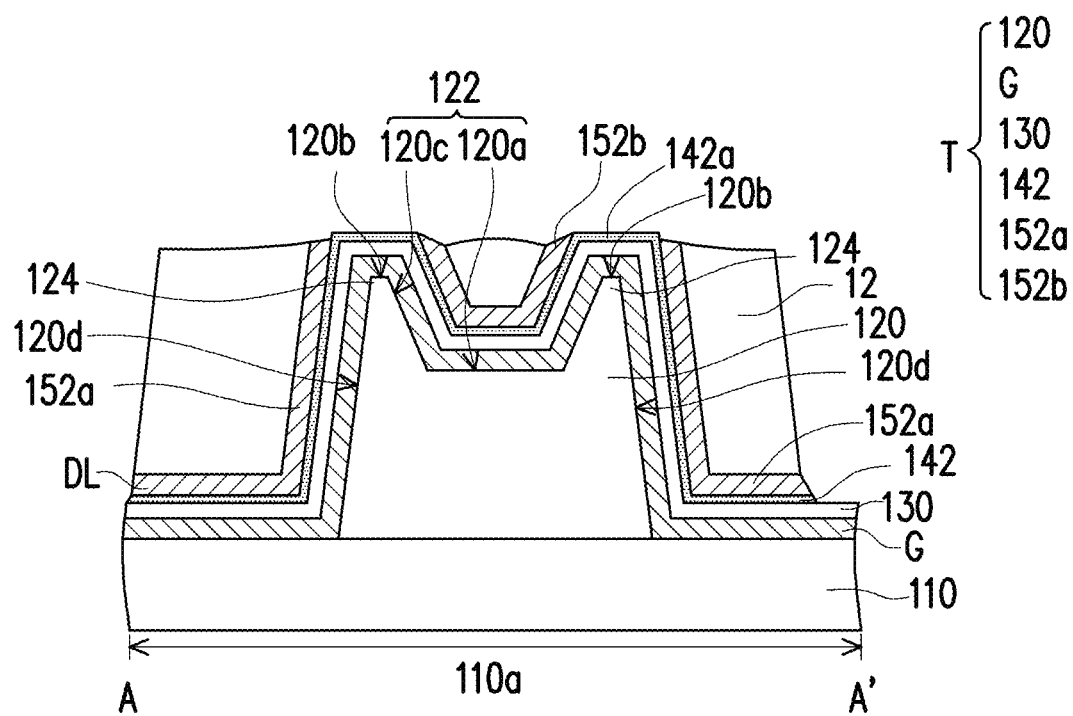

Referring to FIG. 1F and FIG. 1G, then, the conductive layer 152 is patterned with the patterned photoresist layer 12 as an etching mask, so as to remove the portion of the conductive layer 152 on the convex portion 124 and form a first electrode 152a on the outer surface 120d of the protrusion 120 and form a second electrode 152b on the concave portion 122 of the protrusion 120. The first electrode 152a and the second electrode 152b are separated by the convex portion 124 of the protrusion 120. Specifically, in this embodiment, the first electrode 152a and the second electrode 152b may be separated by the portion of the semiconductor layer 142a and the portion of the gate insulation layer 130 on the convex portion 124, but the invention is not limited thereto. In this embodiment, the first electrode 152a covers the outer surface 120d of the protrusion 120 and the second electrode 152b covers the first upper surface 120a and the inner surface 120c of the protrusion 120, and neither of the first electrode 152a and the second electrode 152b covers the second upper surface 120b of the protrusion 120. The first electrode 152a is electrically connected to a data line DL (as shown in FIG. 2B). The first electrode 152a and the second electrode 152b are electrically connected to two different regions of the semiconductor layer 142 respectively. A portion of the semiconductor layer 142a between the first electrode 152a and the second electrode 152b may be regarded as a channel, and one of the first electrode 152a and the second electrode 152b (e.g., the second electrode 152b) may be regarded as a source while the other one of the first electrode 152a and the second electrode 152b (e.g., the first electrode 152a) may be regarded as a drain. Thereby, an active device T of this embodiment is completed.

Referring to FIG. 1G, in this embodiment, the gate G is located on the first upper surface 120a, the inner surface 120c, the second upper surface 120b, and the outer surface 120d of the protrusion 120. The gate insulation layer 130 covers the gate G. The semiconductor layer 142 covers the portion of the gate insulation layer 130 that is located on the first upper surface 120a, the inner surface 120c, the second upper surface 120b, and the outer surface 120d of the protrusion 120. The first electrode 152a is disposed on the portion of the semiconductor layer 142 located on the outer surface 120d of the protrusion 120. The second electrode 152b is disposed on the portion of the semiconductor layer 142 located on the first upper surface 120a and the inner surface 120c of the protrusion 120. In this embodiment, the gate G is located under the semiconductor layer 142, and the active device T is a bottom gate TFT, for example. However, the invention is not limited thereto. In other embodiments, the active device T may be a top gate TFT or other possible thin film transistors, which will be described in the following paragraphs with reference to other drawings.

Figure 1H:
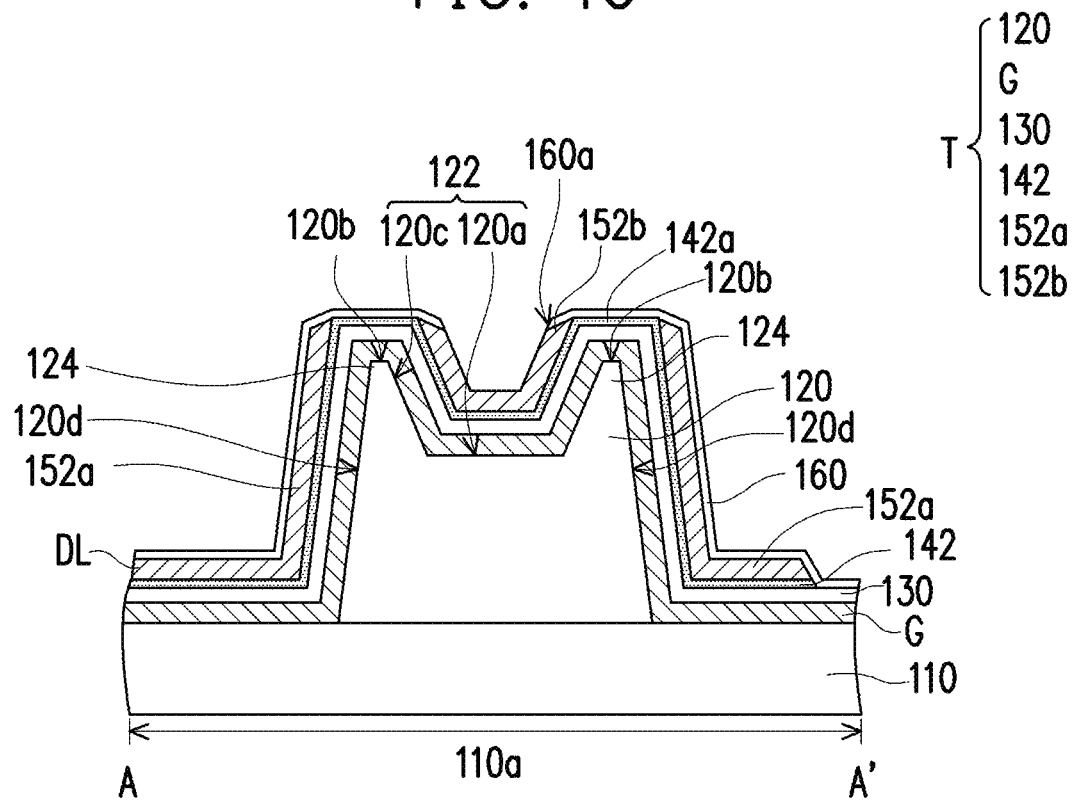

Referring to FIG. 1G and FIG. 1H, next, the patterned photoresist layer 12 may be selectively removed. Referring to FIG. 1H, thereafter, a protection layer 160 is formed on the active device T. The protection layer 160 covers the data line DL (as shown in FIG. 2B), the first electrode 152a, the portion of the semiconductor layer 142a located on the second upper surface 120b of the protrusion 120, and a portion of the second electrode 152b. The protection layer 160 has an opening 160a, and the opening 160a overlaps the second electrode 152b in a direction perpendicular to the substrate 110. In this embodiment, a material of the protection layer 160 includes an inorganic material (e.g., silicon oxide, silicon nitride, silicon oxynitride, other suitable materials, or a stack layer of at least two of the foregoing materials), an organic material, other suitable materials, or a combination of the foregoing.

Figure 1I:
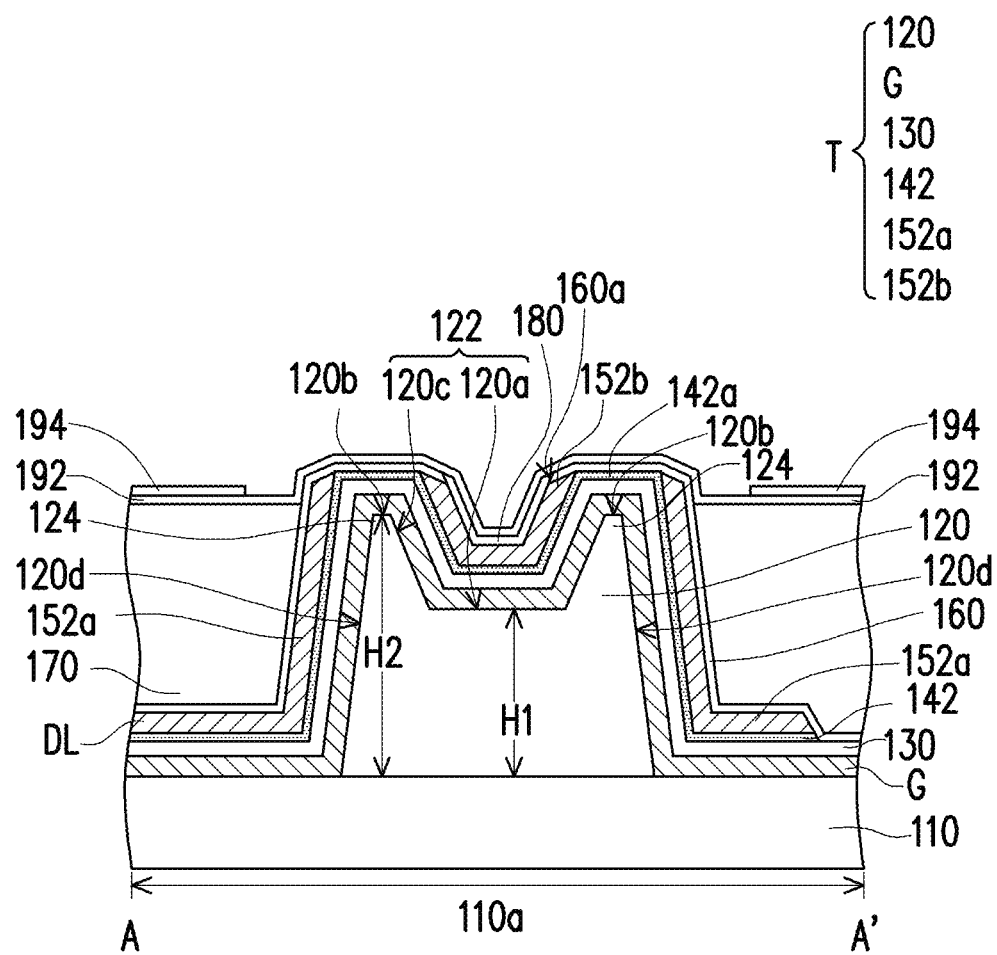

Referring to FIG. 1I and FIG. 2B, next, in this embodiment, a planarization layer 170 and a pixel electrode 180 may be formed sequentially. The pixel electrode 180 is electrically connected to the second electrode 152b of the active device T. For example, in this embodiment, the pixel electrode 180 may be electrically in contact with the second electrode 152b via the opening 160a of the protection layer 160. However, the invention is not limited thereto. In other embodiments, the pixel electrode 180 may be electrically connected to the second electrode 152b of the active device T in other manners.

In this embodiment, a material of the planarization layer 170 includes an inorganic material (e.g., silicon oxide, silicon nitride, silicon oxynitride, other suitable materials, or a stack layer of at least two of the foregoing materials), an organic material (e.g., polyesters (PET), polyolefins, polypropylenes, polycarbonates, polyalkylene oxides, polystyrenes, polyethers, polyketones, polyols, polyaldehydes, other suitable materials, or a combination of the foregoing), or other suitable materials. Specifically, in this embodiment, the planarization layer 170 may selectively be a color filter pattern, wherein the color filter pattern overlaps the pixel electrode 180, such that the active device array substrate 100 has a structure of color filter on array (COA). However, the invention is not limited thereto. In other embodiments, the planarization layer 170 may be a transparent insulation layer that has no color. In this embodiment, the pixel electrode 180 may be a transmissive pixel electrode, a reflective pixel electrode, or a transflective pixel electrode. A material of the transmissive pixel electrode includes a metal oxide, such as indium tin oxide, indium zinc oxide, aluminum tin oxide, aluminum zinc oxide, indium zinc germanium oxide, or other suitable oxides, or a stack layer of at least two of the foregoing. A material of the reflective pixel electrode includes a metal material that has high reflectance.

Referring to FIG. 1I, thereafter, in this embodiment, a dielectric layer 192 and a common electrode 194 may be selectively formed sequentially. Thereby, the active device substrate 100 of this embodiment is completed. In this embodiment, the dielectric layer 192 covers the pixel electrode 180, and the common electrode 194 is disposed on the dielectric layer 192 and overlaps the pixel electrode 180. The common electrode 194 may have a plurality of openings (not shown), and an electric field between the edges of the openings and the pixel electrode 180 may be used to drive a display medium. The active device array substrate 100 of this embodiment may be used in a liquid crystal display panel in a fringe field switching (FFS) mode. However, the invention is not limited thereto. In another embodiment, the pixel electrode and the common electrode may be selectively disposed on the same surface of the active device substrate 100, and the active device array substrate 100 may be used in a liquid crystal display panel of in-plane switching (IPS). In yet another embodiment, the pixel electrode and the common electrode may be selectively disposed on the active device array substrate 100 and an opposite substrate (not shown) respectively, and the active device array substrate 100 may be used in a liquid crystal display panel in modes, such as twisted nematic (TN), super twisted nematic (STN), vertical alignment (VA), polymer sustained alignment (PSA), optically compensated birefringence (OCB), and so on. It should be noted that, although the active device array substrate 100 described above is used in a liquid crystal display panel, the invention is not limited thereto. In other embodiments, the active device array substrate 100 may also be used in other types of display panels, such as organic light emitting diode (OLED) display panel, electro-phoretic display (EPD) panel, electrowetting display (EWD) panel, and so on.

Figure 3:
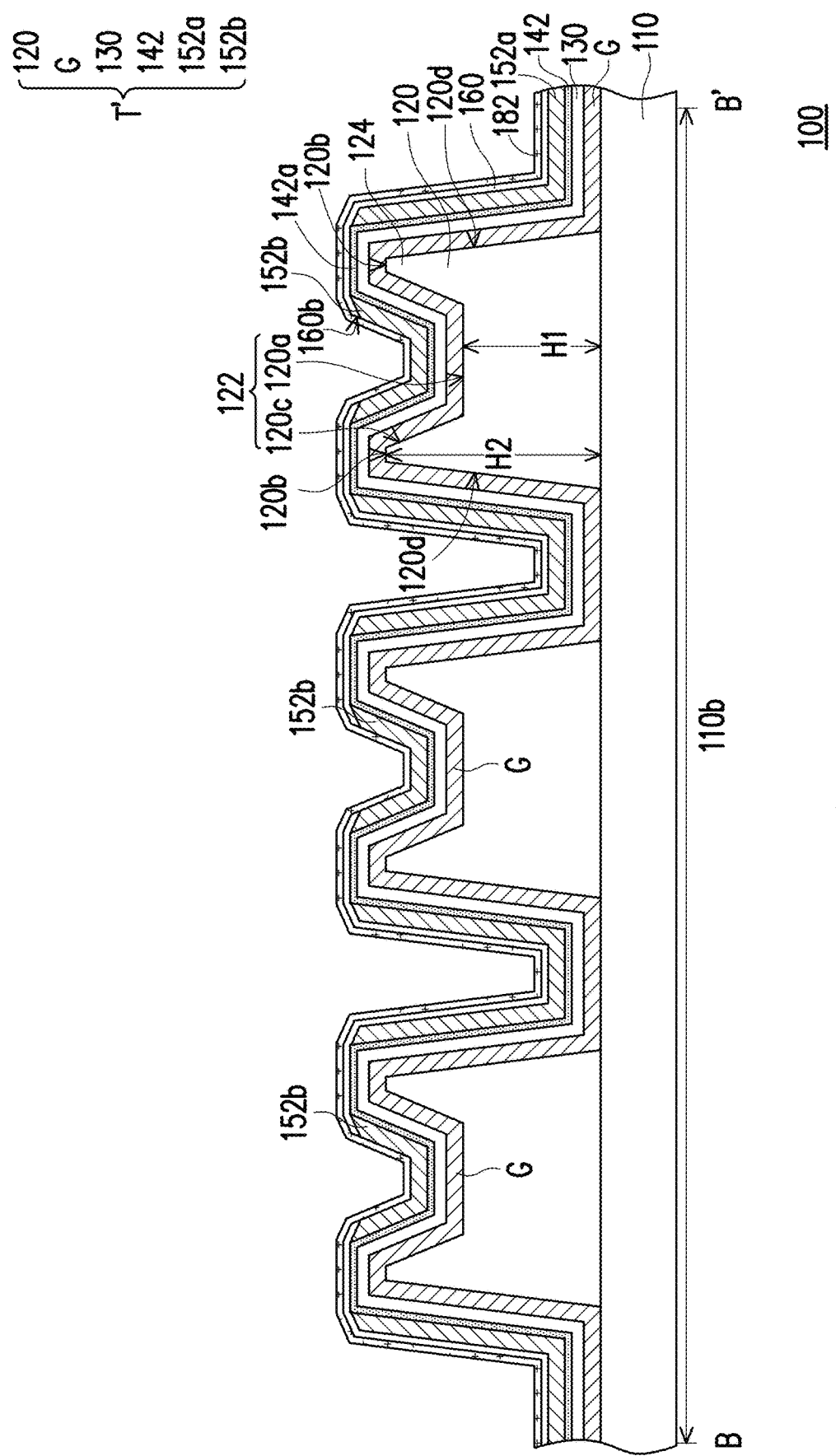
FIG. 3 is a schematic cross-sectional view of a portion of a peripheral region of the active device substrate of FIG. 2A.
Figure 4:
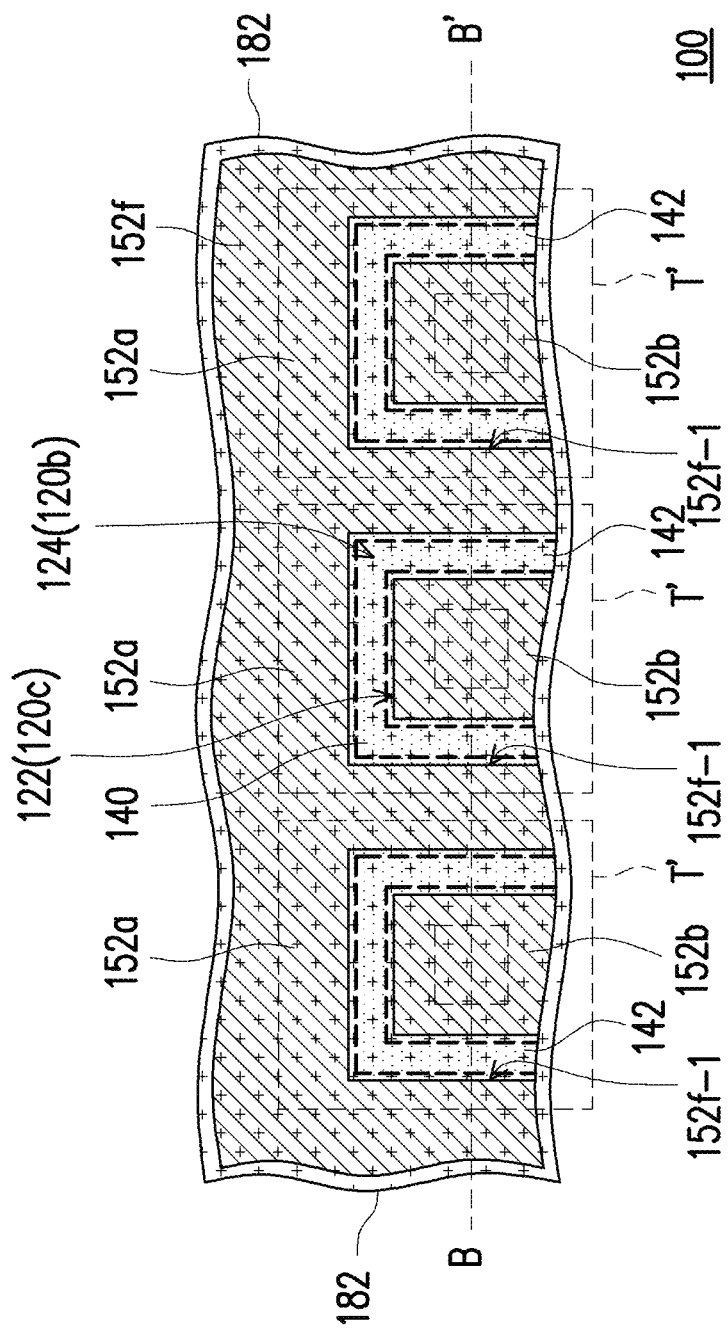
FIG. 4 is a schematic top view of a portion of the peripheral region of the active device substrate of FIG. 2A.

FIG. 1A to FIG. 1I and FIG. 2B illustrate the display region 100a of the active device substrate 100 of FIG. 2A and the fabricating process thereof as an example. FIG. 3 is a schematic cross-sectional view of a portion of the peripheral region 100*b* of the active device substrate 100 of FIG. 2A. FIG. 4 is a schematic top view of the portion of the peripheral region 100*b* of the active device substrate 100 of FIG. 2A. Particularly, FIG. 3 corresponds to the section line B-B' of FIG. 4.

Referring to FIG. 3 and FIG. 4, in this embodiment, a gate driver-on-array GOA electrically connected to the scan line SL (as shown in FIG. 2B) may be disposed on the peripheral region 100*b* of the active device substrate 100. The gate driver-on-array GOA includes a plurality of peripheral active devices T'. In this embodiment, three active devices are shown as an example, but the invention is not limited thereto. In other embodiments, one, two, or more peripheral active devices may have the active device structure of the invention. The peripheral active devices T' may be fabricated together with the active device T located in the display region 100*a*, and the peripheral active devices T' may have structures the same as or similar to the structure of the active device T located in the display region 100*a*. In other words, the peripheral active device T' also includes the protrusion 120 (i.e., peripheral protrusion), the gate G, the gate insulation layer 130, the semiconductor layer 142, the first electrode 152*a*, and the second electrode 152*b*. The protrusion 120 has the first upper surface 120*a*, the second upper surface 120*b*, the inner surface 120*c*, and the outer surface 120*d*. A distance H2 between the second upper surface 120*b* and the substrate 110 is longer than a distance H1 between the first upper surface 120*a* and the substrate 110. The inner surface 120*c* connects between the first upper surface 120*a* and the second upper surface 120*b*. The inner surface 120*c* and the first upper surface 120*a* define the concave portion 122 of the protrusion 120. The outer surface 120*d* is connected to at least one side of the second upper surface 120*b*. The inner surface 120*c*, the second upper surface 120*b*, and the outer surface 120*d* define the convex portion 124 of the protrusion 120. The gate G covers the protrusion 120. The semiconductor layer 142 is located on the first upper surface 120*a*, the inner surface 120*c*, the second upper surface 120*b*, and the outer surface 120*d* of the protrusion 120. The gate insulation layer 130 is located between the gate G and the semiconductor layer 142. The first electrode 152*a* is located on at least a portion of the outer surface 120*d* of the protrusion 120 and is electrically connected to the semiconductor layer 142. The second electrode 152*b* is located in the concave portion 122 of the protrusion 120 and is electrically connected to the semiconductor layer 142. The first electrode 152*a* and the second electrode 152*b* are separated by the convex portion 124 of the protrusion 120.

Referring to FIG. 2B and FIG. 4, in this embodiment, the convex portion 124 of the protrusion 120 of the peripheral active device T' and the convex portion 124 of the protrusion 120 of the active device T may be selectively designed to have the same shape. For example, in this embodiment, the convex portion 124 of the protrusion 120 of the peripheral active device T' and the convex portion 124 of the protrusion 120 of the active device T may both be designed as non-closed bumps (e.g., an ⊓-shaped bump, a U-shaped bump, an inverted U-shaped bump, an I-shaped bump, an L-shaped bump, an inverted L-shaped bump, or bumps in other suitable forms). However, the invention is not limited thereto. In another embodiment, the convex portion 124 of the protrusion 120 of the peripheral active device T' and the convex portion 124 of the protrusion 120 of the active device T may both be designed as closed bumps (e.g., a hollow square bump, an O-shaped bump, and so on). In yet another embodiment, the convex portion 124 of the protrusion 120 of the peripheral active device T' and the convex portion 124 of the protrusion 120 of the active device T may partially be designed as non-closed bumps and partially be designed as closed bumps. In addition, the convex portions 124 of the invention are not necessarily identical. For example, in an embodiment, the convex portions 124 of the protrusions 120 of the peripheral active devices T' may be U-shaped and inverted U-shaped bumps that are arranged sequentially and repeatedly. In other embodiments, the convex portion 124 of the protrusion 120 of the peripheral active device T' and the convex portion 124 of the protrusion 120 of the active device T may also be designed to have different shapes. For example, in another embodiment, the convex portion 124 of the protrusion 120 of the peripheral active device T' and the convex portion 124 of the protrusion 120 of the active device T may be designed as a non-closed bump and a closed bump respectively. However, the invention is not limited thereto.

Referring to FIG. 3 and FIG. 4, in this embodiment, a plurality of gates G of the peripheral active devices T' may be electrically connected, a plurality of first electrodes 152*a* of the peripheral active devices T' may be electrically connected, and a plurality of second electrodes 152*b* of the peripheral active devices T' may be electrically connected. In brief, in this embodiment, the peripheral active devices T may be selectively connected in parallel, such that the gate driver-on-array GOA may provide a larger current, but the invention is not limited thereto.

For example, in this embodiment, the gates G of the peripheral active devices T' are continuous conductive patterns and are electrically connected; and the first electrodes 152*a* of the peripheral active devices T' are continuous conductive patterns 152*f* (as shown in FIG. 4) and are electrically connected. The continuous conductive patterns 152*f* including the first electrodes 152*a* may have a plurality of openings 152*f*-1 that are separated from one another. The second electrodes 152*b* of the peripheral active devices T' may be located in the openings 152*f*-1 respectively, and the second electrodes 152*b* of the peripheral active devices T' may be connected to one another via a conductive pattern 182. In this embodiment, the protection layer 160 may further have openings 160*b* that overlap the second electrodes 152*b* of the peripheral active devices T' respectively. Referring to FIG. 1I and FIG. 3, in this embodiment, when the pixel electrode 180 located in the display region 100*a* is formed, the conductive pattern 182 may be simultaneously formed on the protection layer 160 of the peripheral region 100*b*. The conductive pattern 182 may be electrically connected to the second electrodes 152*b* of the peripheral active devices T' via the openings 160*b* of the protection layer 160.

Figure 5A:
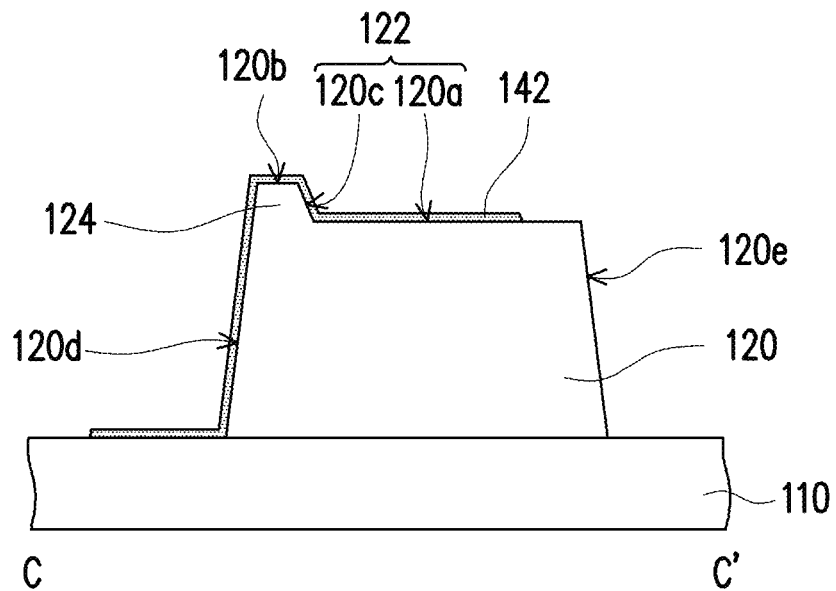
FIG. 5A to FIG. 5H are schematic cross-sectional views showing a fabricating process of an active device substrate according to another embodiment of the invention.
Figure 5B:
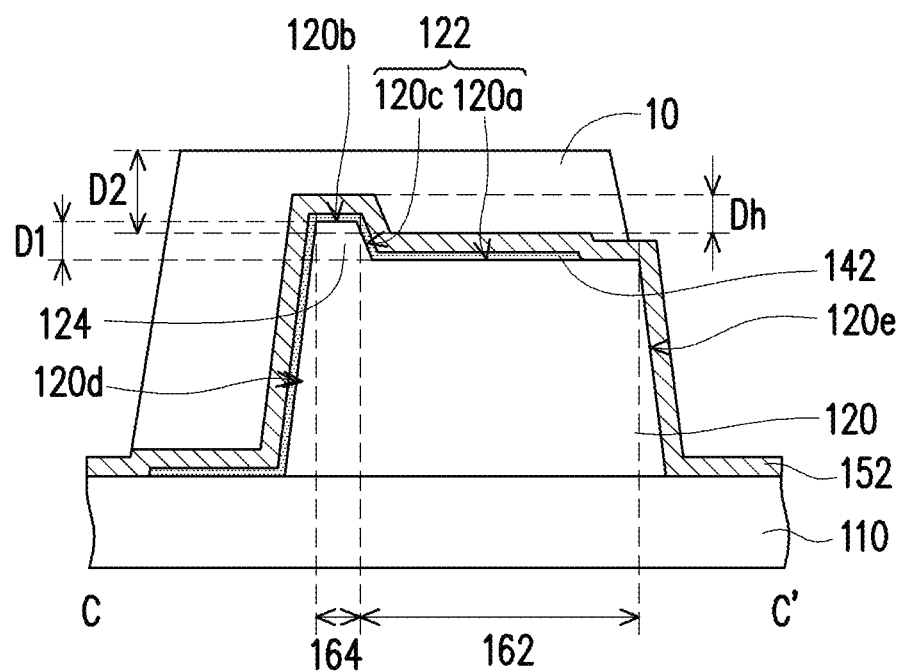
Figure 5C:
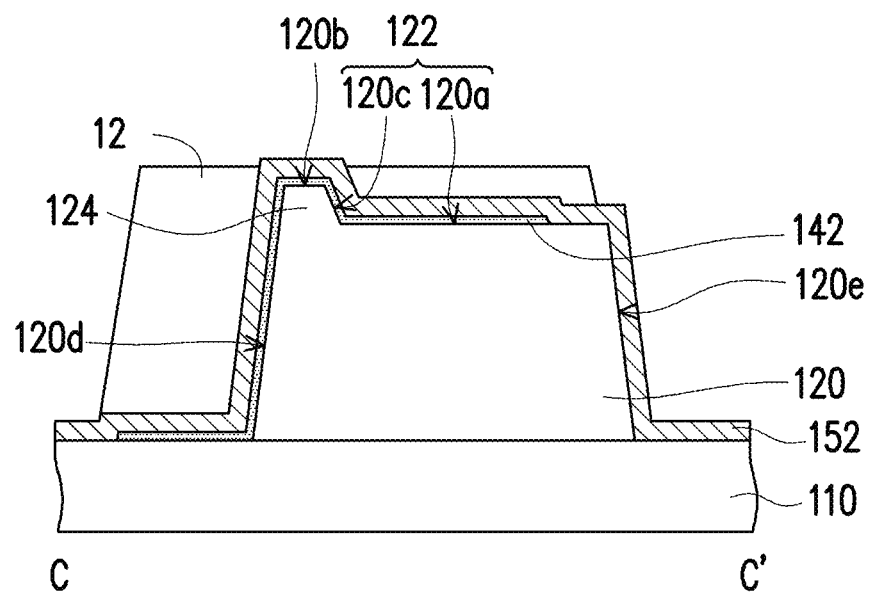
Figure 5D:
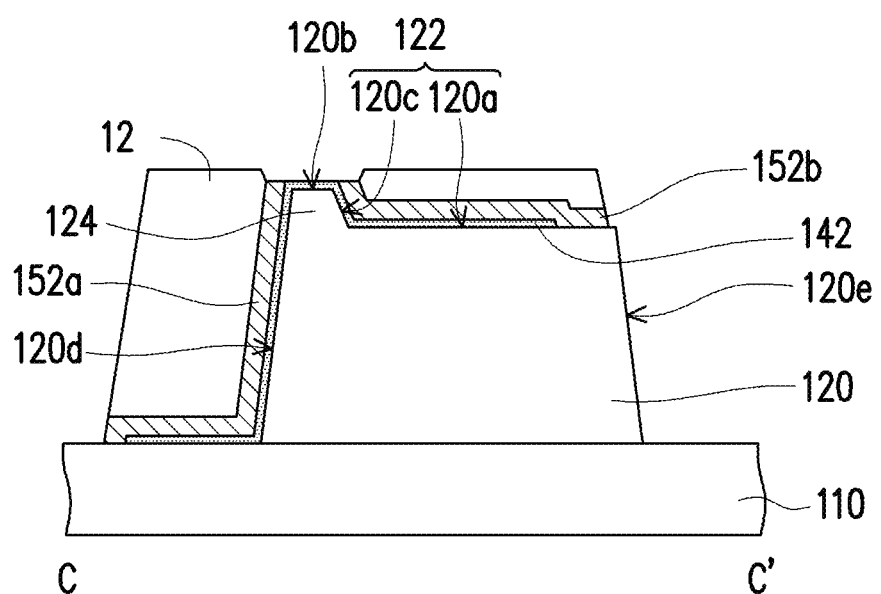
Figure 5E:
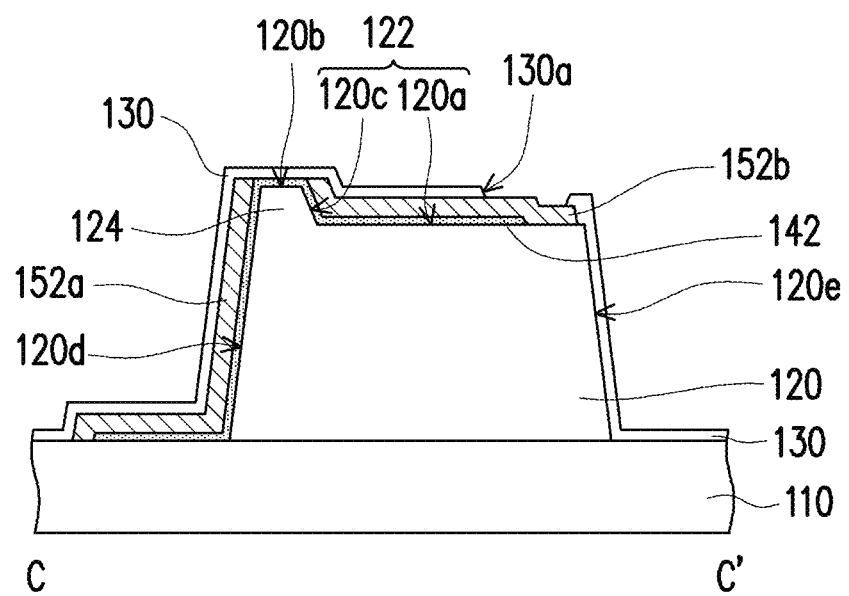
Figure 5F:
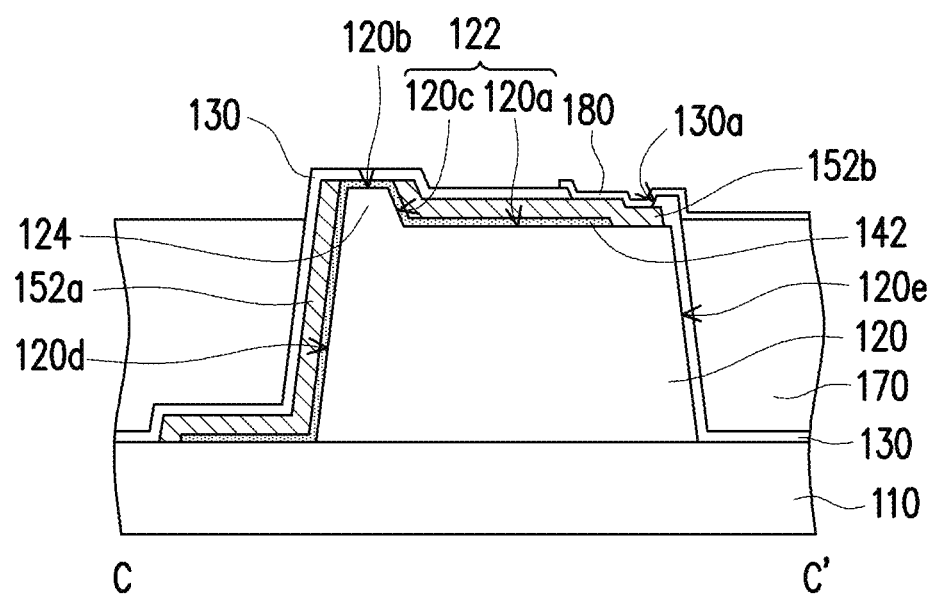
Figure 5G:
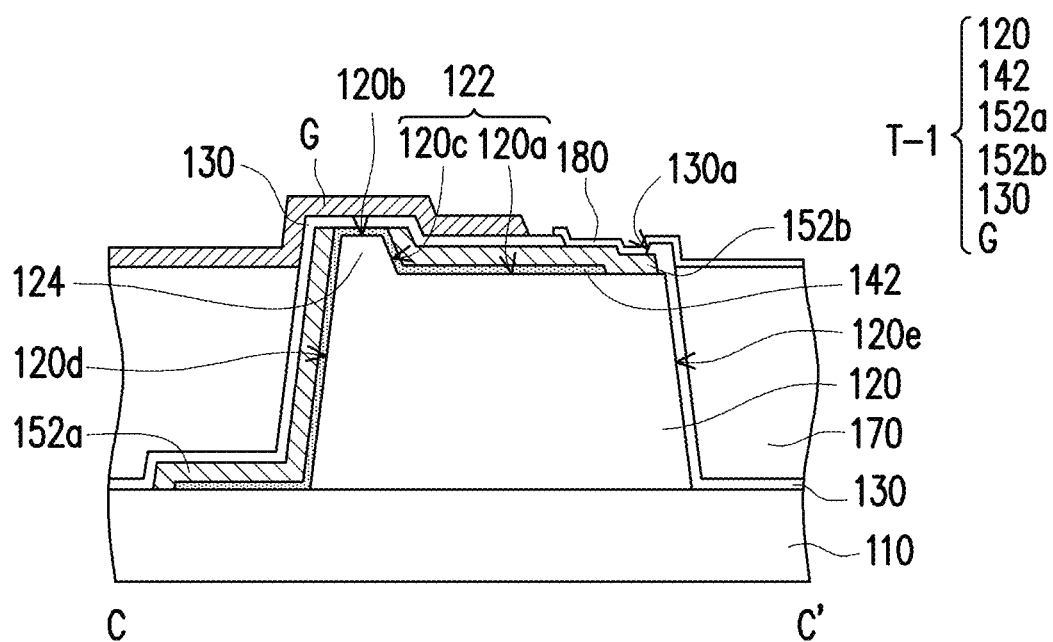
Figure 5H:
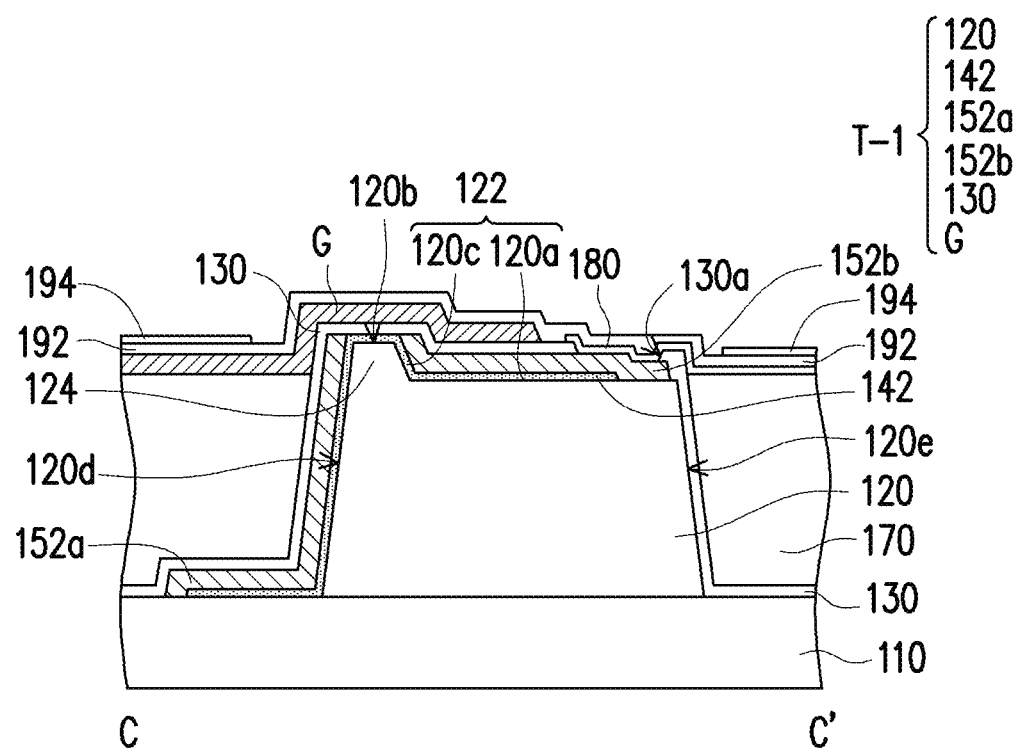
Figure 6:
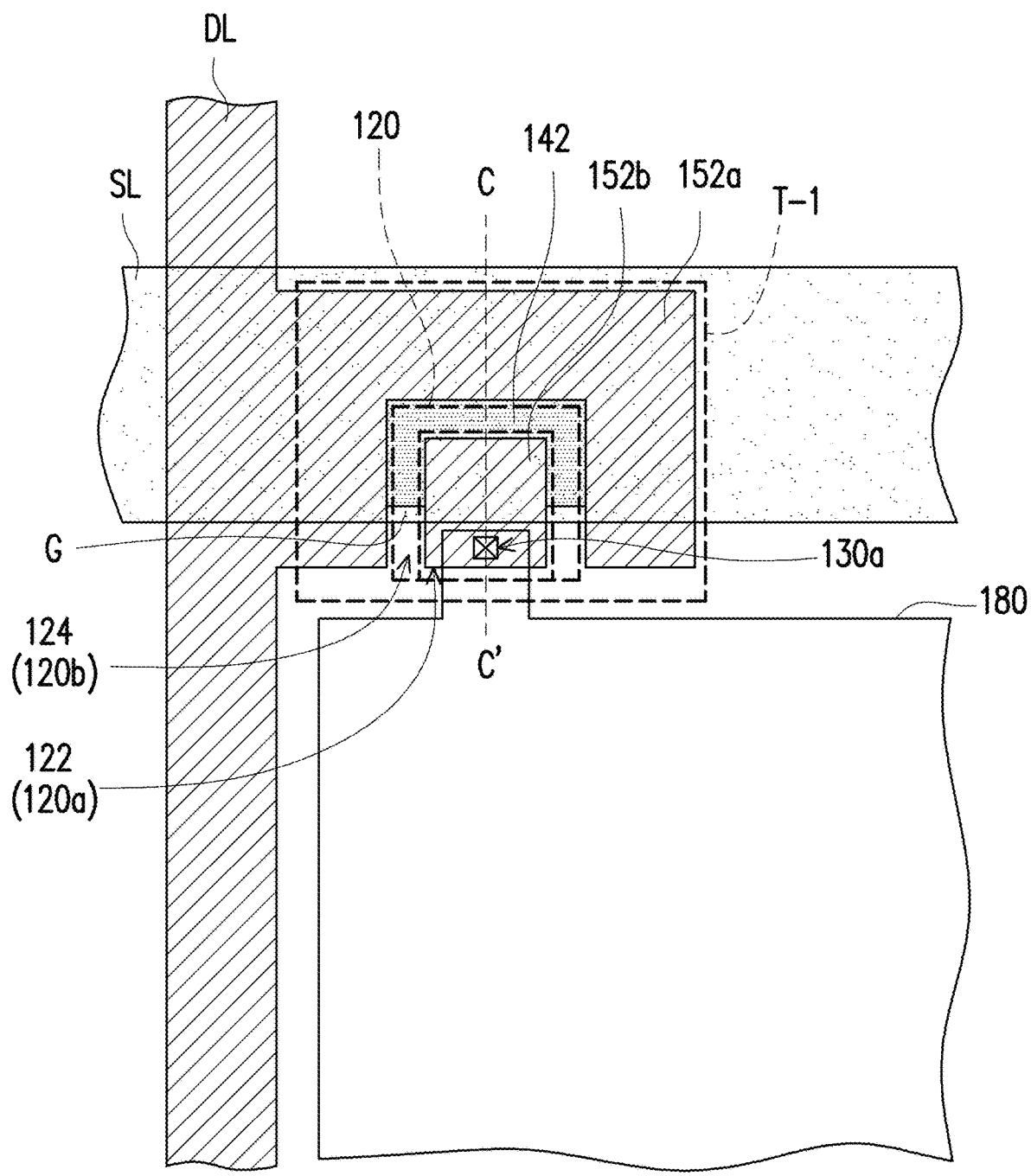
FIG. 6 is a schematic top view of the active device substrate of FIG. 5H.

FIG. 5A to FIG. 5H are schematic cross-sectional views showing a fabricating process of an active device substrate according to another embodiment of the invention. FIG. 6 is a schematic top view of the active device substrate of FIG. 5H. Particularly, FIG. 5H corresponds to the section line C-C' of FIG. 6, and a common electrode 194 of FIG. 5H is omitted from FIG. 6. An active device substrate 100-1 and a fabricating process thereof of this embodiment are similar to the active device substrate 100 and the fabricating process thereof as described above, and thus the same or similar components are assigned with the same or similar reference numerals. The following mainly describes the difference, and what the two substrates have in common or the similar parts will be omitted.

Referring to FIG. 5A, first, the protrusion 120 is formed on the substrate 110. Then, the semiconductor layer 142 is formed on the protrusion 120. In this embodiment, the semiconductor layer 142 is located on the first upper surface 120a, the inner surface 120c, the second upper surface 120b, and the outer surface 120d of the protrusion 120. Referring to FIG. 5A and FIG. 6, for example, in this embodiment, the semiconductor layer 142 may cover a portion of the first upper surface 120a, a portion of the inner surface 120c, a portion of the second upper surface 120b, and a portion of the outer surface 120d that is directly connected to the portion of the second upper surface 120b, and not cover an outer surface 120e that is directly connected to the first upper surface 120a. In this embodiment, the semiconductor layer 142 may further extend from the outer surface 120d to be above the substrate 110, but the invention is not limited thereto.

Referring to FIG. 5B, next, the conductive layer 152 is formed to cover the semiconductor layer 142. In this embodiment, the conductive layer 152 may cover the semiconductor layer 142, the portion of the first upper surface 120a not covered by the semiconductor layer 142, the outer surface 120e, and the portion of the substrate 110 not covered by the semiconductor layer 142. Thereafter, the photoresist layer 10 is formed on the conductive material layer 150. The photoresist layer 10 that has been patterned covers the protrusion 120, the semiconductor layer 142, and a portion of the conductive material layer 150. Since the protrusion 120 has the concave portion 122 and the convex portion 124, the layers formed to cover the protrusion 120 are formed with the concave portion 162 and the convex portion 164 corresponding to the shape of the protrusion 120, and the depth Dh of the concave portion 162 is substantially equal to the depth D1 of the concave portion 122. The thickness D2 of the photoresist layer 10 located on the concave portion 122 exceeds the depth Dh of the concave portion 162. That is, the thickness D2 of the photoresist layer 10 located on the concave portion 122 exceeds the depth D1 of the concave portion 122.

Referring to FIG. 5B and FIG. 5C, then, the photoresist layer 10 is thinned, so as to form the patterned photoresist layer 12. The patterned photoresist layer 12 covers the conductive layer 152 located on the first upper surface 120a, the inner surface 120c, and the outer surface 120d of the protrusion 120 and exposes the conductive layer 152 located on the second upper surface 120b of the protrusion 120 and the conductive layer 152 located on the outer surface 120e of the protrusion 120. It should be noted that, in another embodiment, a thinner photoresist layer (having a thickness similar to the thickness of the patterned photoresist layer 12 of FIG. 5C) may be applied directly and then patterned to form the patterned photoresist layer, such that the process of thinning the photoresist layer may be omitted.

Referring to FIG. 5C and FIG. 5D, next, the conductive layer 152 is patterned with the patterned photoresist layer 12 as an etching mask, so as to remove the portion of the conductive layer 152 not covered by the patterned photoresist layer 12 and to form the first electrode 152a on the outer surface 120d of the protrusion 120 and form the second electrode 152b on the concave portion 122 of the protrusion 120. The first electrode 152a and the second electrode 152b are separated by the convex portion 124 of the protrusion 120. Referring to FIG. 5D, in this embodiment, the first electrode 152a is disposed on the semiconductor layer 142 located on the outer surface 120d of the protrusion 120 and is electrically connected to the semiconductor layer 142, and the second electrode 152b is disposed on the semiconductor layer 142 located on the first upper surface 120a and the inner surface 120c of the protrusion 120 and is electrically connected to the semiconductor layer 142.

Referring to FIG. 5D and FIG. 5E, next, the patterned photoresist layer 12 may be selectively removed. Referring to FIG. 5E, then, the gate insulation layer 130 is formed to cover the first electrode 152a, the semiconductor layer 142 located on the second upper surface 120b of the protrusion 120, a portion of the second electrode 152b, and the outer surface 120e of the protrusion 120. In this embodiment, the gate insulation layer 130 may have the opening 130a that overlaps the second electrode 152b, and the opening 130a may be located on the concave portion 122 of the protrusion 120, but the invention is not limited thereto.

Referring to FIG. 5F, thereafter, in this embodiment, the planarization layer 170 and the pixel electrode 180 may be formed sequentially. The pixel electrode 180 is electrically connected to the second electrode 152b of the active device T. In this embodiment, the pixel electrode 180 may be electrically connected to the second electrode 152b via the opening 130a of the gate insulation layer 130. Referring to FIG. 5G, then, the gate G may be formed on the gate insulation layer 130. Thereby, an active device T-1 of this embodiment is completed. In this embodiment, the gate G is located above the semiconductor layer 142, and the active device T-1 is a top gate TFT, for example. Specifically, in this embodiment, the first electrode 152a, the second electrode 152b, and the gate G are all located above the semiconductor layer 142 (or located on the same side of the semiconductor layer 142), and the active device T-1 may be a coplanar top gate TFT.

Referring to FIG. 5H, next, in this embodiment, the dielectric layer 192 and the common electrode 194 may be selectively formed sequentially. Thereby, the active device substrate 100-1 of this embodiment is completed. The dielectric layer 192 covers the pixel electrode 180. The common electrode 194 is disposed on the dielectric layer 192 and overlaps the pixel electrode 180. The common electrode 194 may have a plurality of openings (not shown), and an electric field between the edges of the openings and the pixel electrode 180 may be used to drive a display medium. The active device array substrate 100-1 of this embodiment may be used in a liquid crystal display panel in a fringe field switching (FFS) mode. However, the invention is not limited thereto. The active device array substrate 100-1 including the active device T-1 may also be used in a liquid crystal display panel in modes, such as in-plane switching (IPS), twisted nematic (TN), super twisted nematic (STN), vertical alignment (VA), polymer sustained alignment (PSA), optically compensated birefringence (OCB), or other suitable modes. The active device array substrate 100-1 including the active device T-1 may also be used in a non-liquid crystal display panel, such as organic light emitting diode (OLED) display panel, electro-phoretic display (EPD) panel, electrowetting display (EWD) panel, or other types of display panels.

FIG. 7A to FIG. 7H are schematic cross-sectional views showing a fabricating process of an active device substrate according to yet another embodiment of the invention. FIG. 8 is a schematic top view of the active device substrate of FIG. 7H. Particularly, FIG. 7A to FIG. 7H correspond to the section line D-D' of FIG. 8. An active device substrate 100-2 and a fabricating process thereof of this embodiment are similar to the active device substrate 100-1 and the fabricating process thereof as described above, and thus the same or similar components are assigned with the same or similar reference numerals. The following mainly describes the difference, and what the two substrates have in common or the similar parts will be omitted.

Figure 7A:
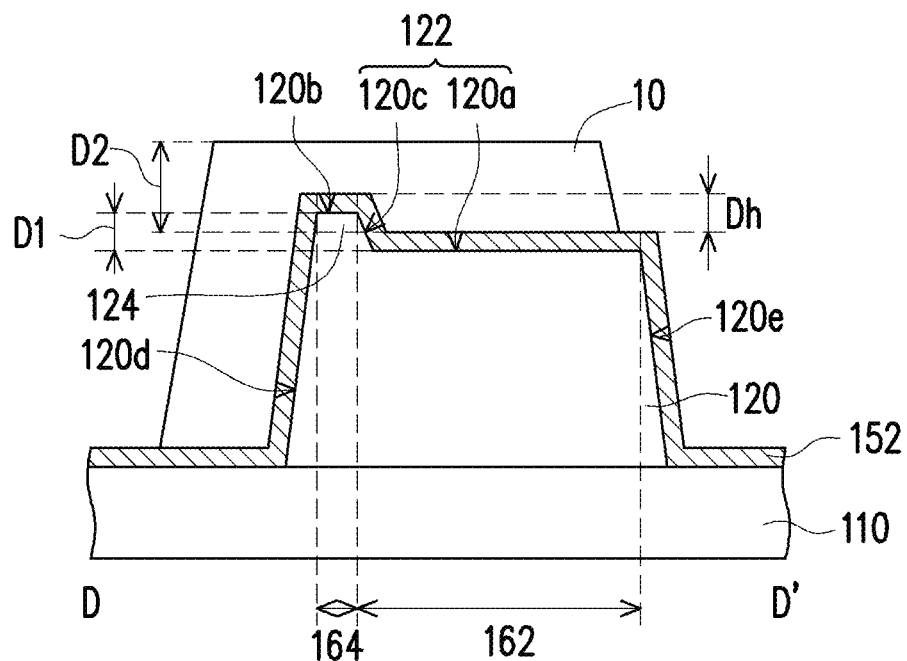
FIG. 7A to FIG. 7H are schematic cross-sectional views showing a fabricating process of an active device substrate according to yet another embodiment of the invention.
Figure 8:
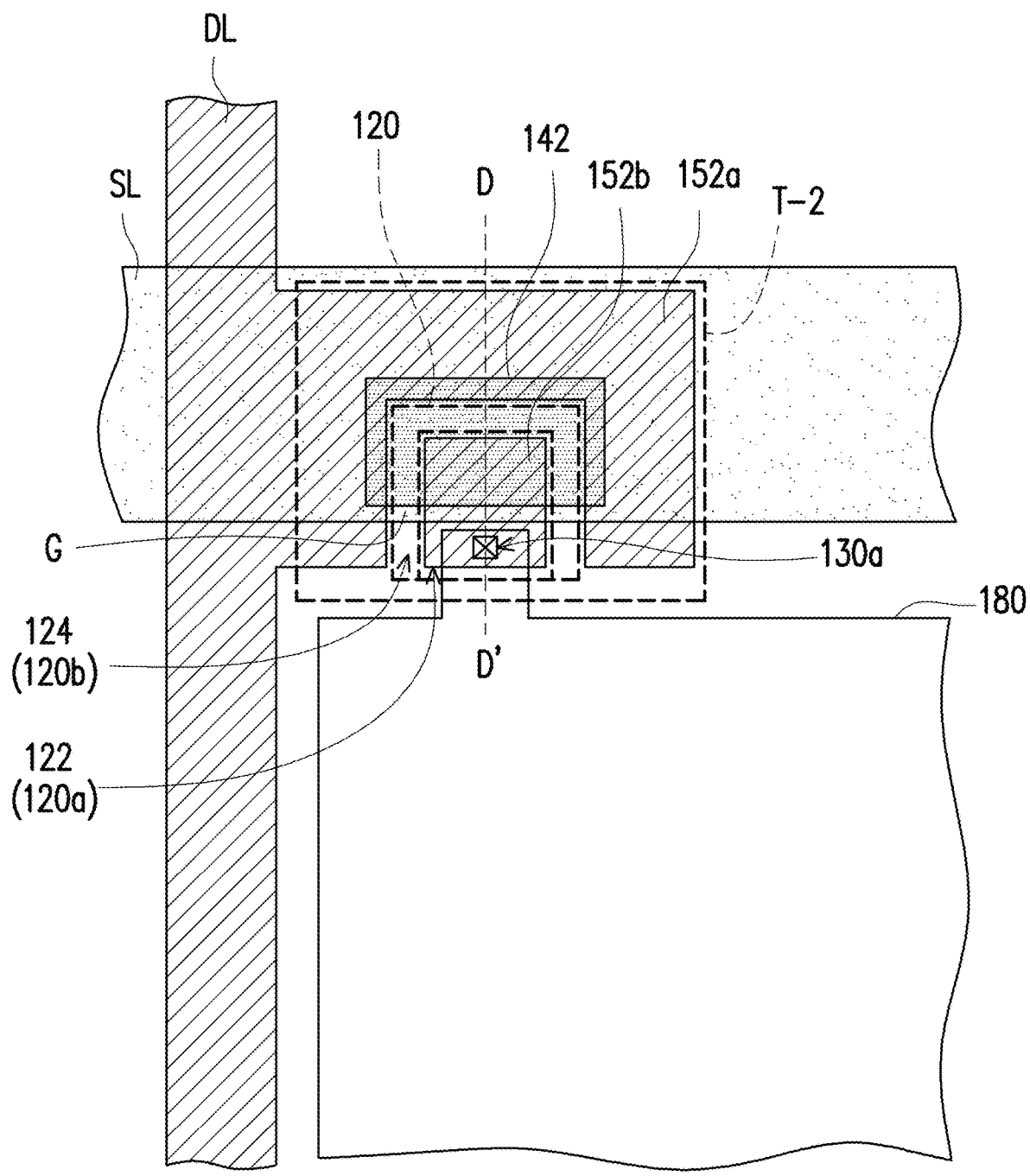
FIG. 8 is a schematic top view of the active device substrate of FIG. 7H.

Referring to FIG. 7A, first, the protrusion 120 is formed on the substrate 110. Then, the conductive layer 152 is formed on the protrusion 120. In this embodiment, the conductive layer 152 may cover the first upper surface 120a, the second upper surface 120b, the inner surface 120c, the outer surface 120d, and the outer surface 120e of the protrusion 120, and a portion of the substrate 110. Thereafter, the photoresist layer 10 is formed on the conductive layer 152. The photoresist layer 10 that has been patterned covers the protrusion 120 and a portion of the conductive layer 152. Since the protrusion 120 has the concave portion 122 and the convex portion 124, the layers formed to cover the protrusion 120 are formed with the concave portion 162 and the convex portion 164 corresponding to the shape of the protrusion 120, and the depth Dh of the concave portion 162 is substantially equal to the depth D1 of the concave portion 122. The thickness D2 of the photoresist layer 10 located on the concave portion 122 exceeds the depth Dh of the concave portion 162. That is, the thickness D2 of the photoresist layer 10 located on the concave portion 122 exceeds the depth D1 of the concave portion 122.

Figure 7B:
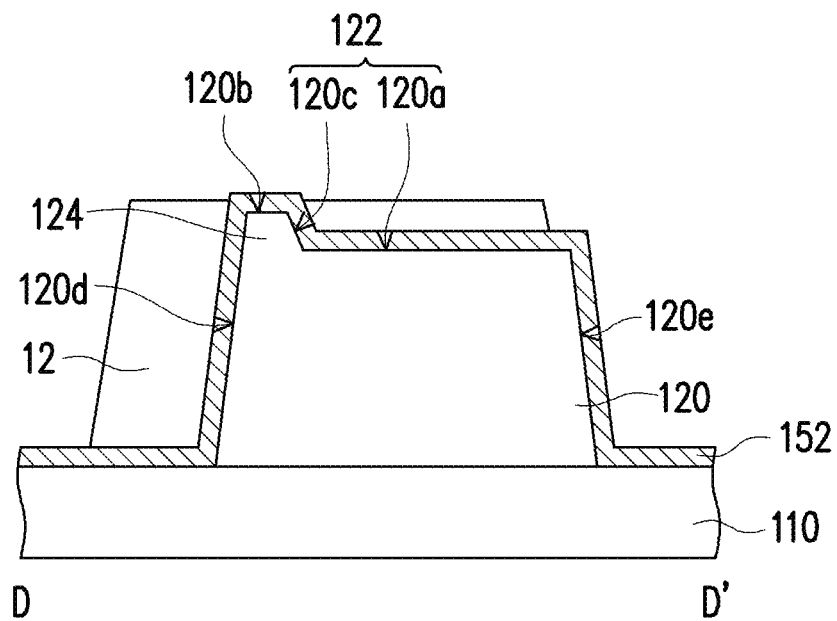

Referring to FIG. 7A and FIG. 7B, then, the photoresist layer 10 is thinned, so as to form the patterned photoresist layer 12. The patterned photoresist layer 12 covers the conductive layer 152 located on the first upper surface 120a, the inner surface 120c, and the outer surface 120d of the protrusion 120 and exposes the conductive layer 152 located on the second upper surface 120b and the outer surface 120e of the protrusion 120.

Figure 7C:
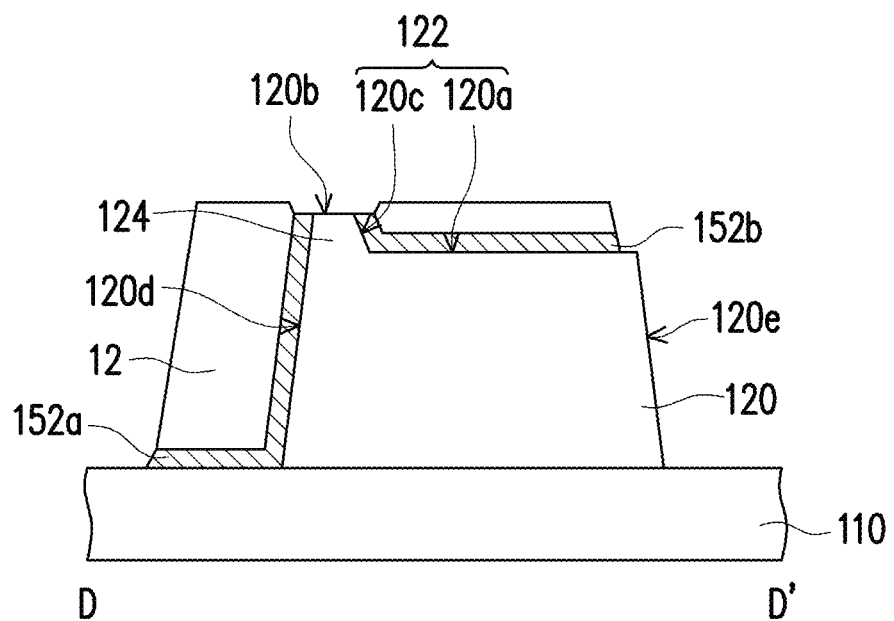

Referring to FIG. 7B and FIG. 7C, next, the conductive layer 152 is patterned with the patterned photoresist layer 12 as an etching mask, so as to remove the portion of the conductive layer 152 not covered by the patterned photoresist layer 12 and to form the first electrode 152a on the outer surface 120d of the protrusion 120 and form the second electrode 152b on the concave portion 122 of the protrusion 120. The first electrode 152a and the second electrode 152b are separated by the convex portion 124 of the protrusion 120. In this embodiment, the first electrode 152a is located on the outer surface 120d of the protrusion 120, and the second electrode 152b is located on the inner surface 120c and the first upper surface 120a of the protrusion 120.

Figure 7D:
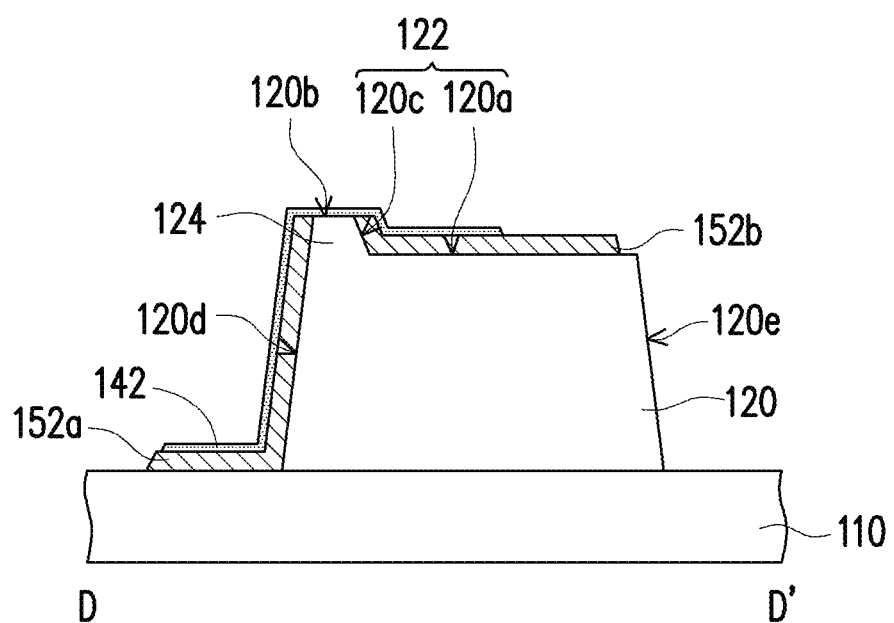
Figure 7E:
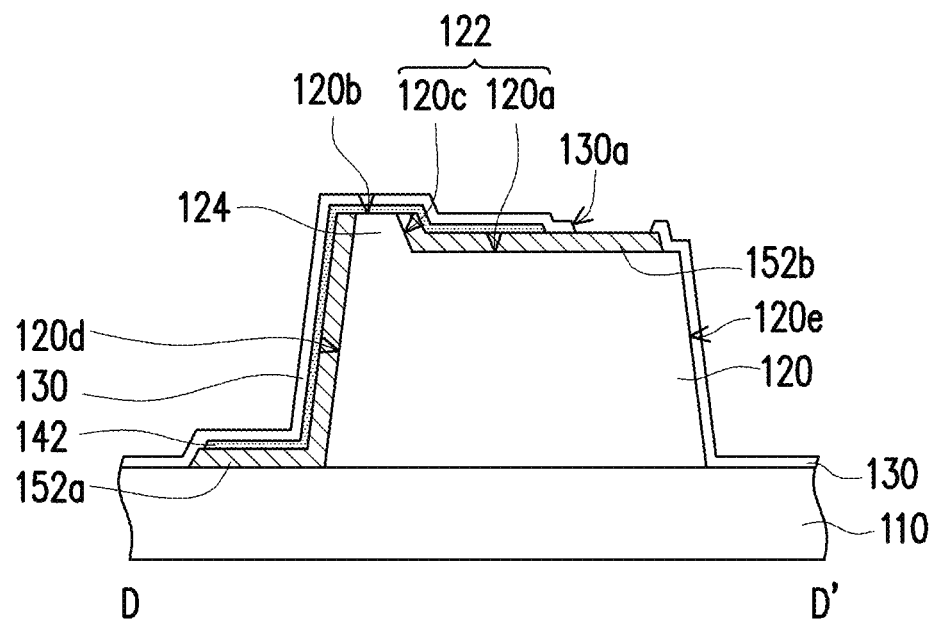

Referring to FIG. 7C and FIG. 7D, thereafter, the patterned photoresist layer 12 is removed. Referring to FIG. 7D, then, the semiconductor layer 142 is formed to cover a portion of the first electrode 152a, the second upper surface 120b of the protrusion 120, and a portion of the second electrode 152b. The semiconductor layer 142 is electrically connected to the first electrode 152a and the second electrode 152b. Referring to FIG. 7E, next, the gate insulation layer 130 is formed to cover the first electrode 152a, the semiconductor layer 142 located on the second upper surface 120b of the protrusion 120, and a portion of the second electrode 152b. In this embodiment, the gate insulation layer 130 may have the opening 130a. The opening 130a overlaps the second electrode 152b. In other embodiments, the opening 130a may overlap the second electrode 152b and the semiconductor layer 142 electrically connected to the second electrode 152b. In this embodiment, the opening 130a may be located on the concave portion 122 of the protrusion 120, but the invention is not limited thereto.

Figure 7F:
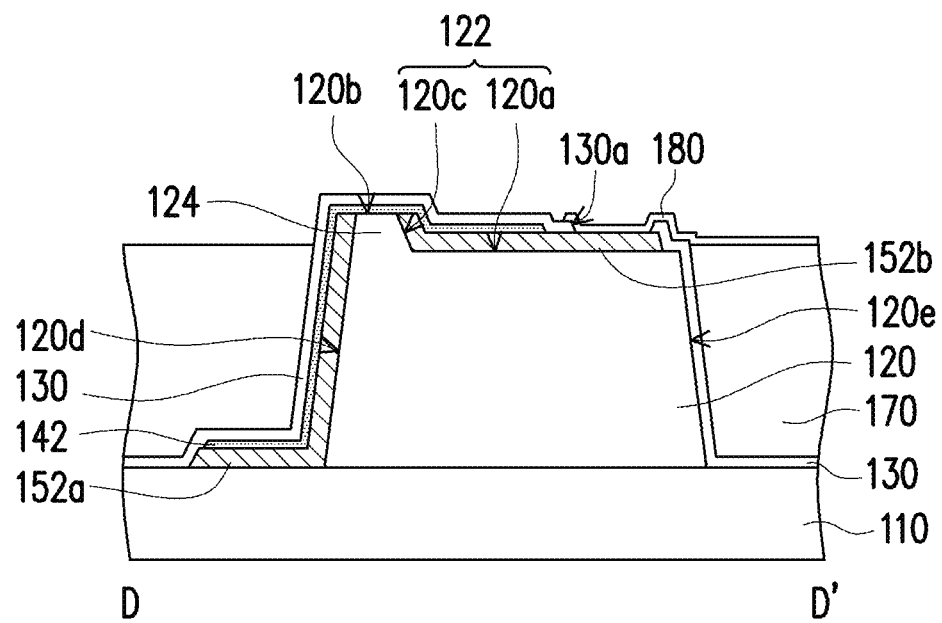
Figure 7G:
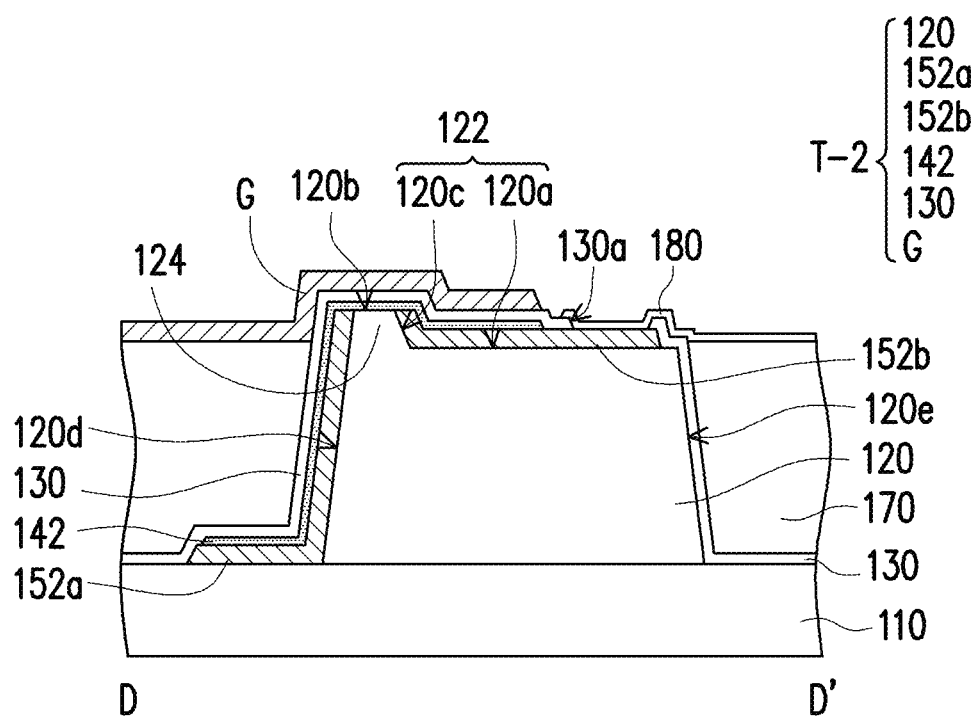

Referring to FIG. 7F, thereafter, in this embodiment, the planarization layer 170 and the pixel electrode 180 may be formed sequentially. The pixel electrode 180 is electrically connected to the second electrode 152b of the active device T. In this embodiment, the pixel electrode 180 may be electrically connected to the second electrode 152b via the opening 130a of the gate insulation layer 130. Referring to FIG. 7G, then, the gate G may be formed on the gate insulation layer 130. Thereby, an active device T-2 of this embodiment is completed. In this embodiment, the gate G may be located above the semiconductor layer 142, and the active device T-2 is a top gate TFT, for example. Specifically, in this embodiment, the first electrode 152a and the second electrode 152b and the gate G may be located respectively on an upper side and a lower side of the semiconductor layer 142 (or located on two different sides of the semiconductor layer 142), and the active device T-2 may be a staggered top gate TFT.

Figure 7H:
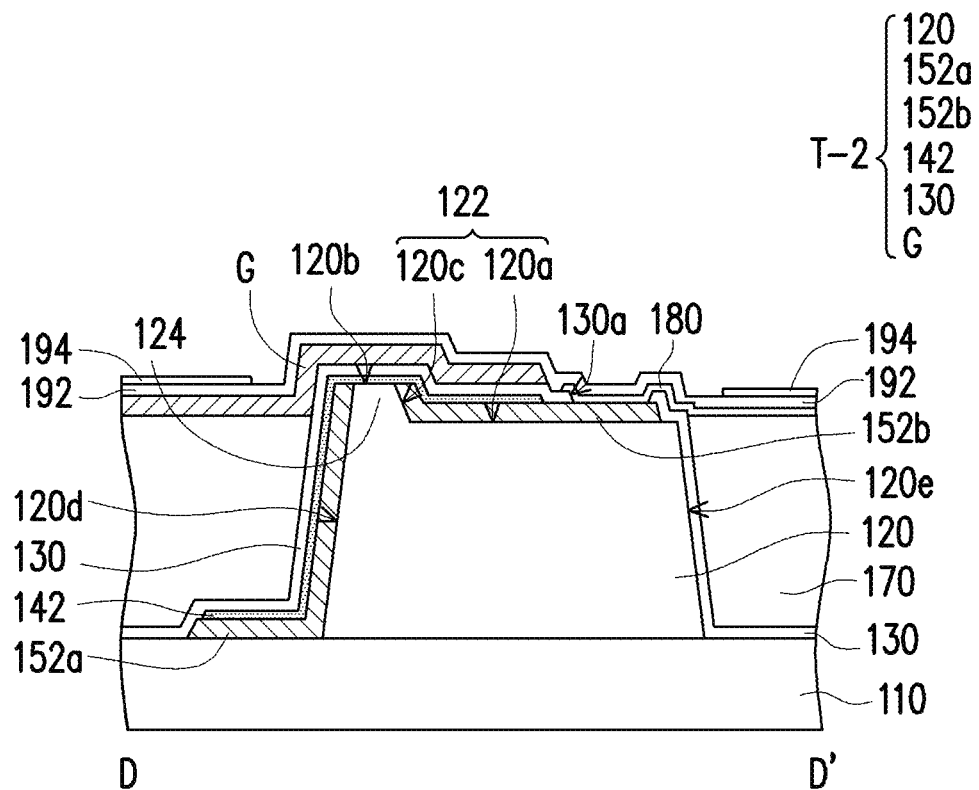

Referring to FIG. 7H, next, in this embodiment, the dielectric layer 192 and the common electrode 194 may be selectively formed sequentially. Thereby, the active device substrate 100-2 of this embodiment is completed. The dielectric layer 192 covers the pixel electrode 180. The common electrode 194 is disposed on the dielectric layer 192 and overlaps the pixel electrode 180. The common electrode 194 may have a plurality of openings (not shown), and an electric field between the edges of the openings and the pixel electrode 180 may be used to drive a display medium. The active device array substrate 100-2 of this embodiment may be used in a liquid crystal display panel in a fringe field switching (FFS) mode. However, the invention is not limited thereto. The active device array substrate 100-2 including the active device T-2 may also be used in a liquid crystal display panel in modes, such as in-plane switching (IPS), twisted nematic (TN), super twisted nematic (STN), vertical alignment (VA), polymer sustained alignment (PSA), optically compensated birefringence (OCB), or other suitable modes. The active device array substrate 100-2 including the active device T-2 may also be used in a non-liquid crystal display panel, such as organic light emitting diode (OLED) display panel, electro-phoretic display (EPD) panel, electrowetting display (EWD) panel, or other types of display panels.

FIG. 9A to FIG. 9G are schematic cross-sectional views showing a fabricating process of an active device substrate according to yet another embodiment of the invention. FIG. 10A to FIG. 10G are schematic top views of the active device substrate according to yet another embodiment of the invention. Particularly, FIG. 9A to FIG. 9G respectively correspond to the section line E-E' of FIG. 10A to FIG. 10G. An active device substrate 100-3 and a fabricating process thereof of this embodiment are similar to the active device substrate 100-2 and the fabricating process thereof as described above, and thus the same or similar components are assigned with the same or similar reference numerals. The following mainly describes the difference, and what the two substrates have in common or the similar parts will be omitted.

Figure 9A:
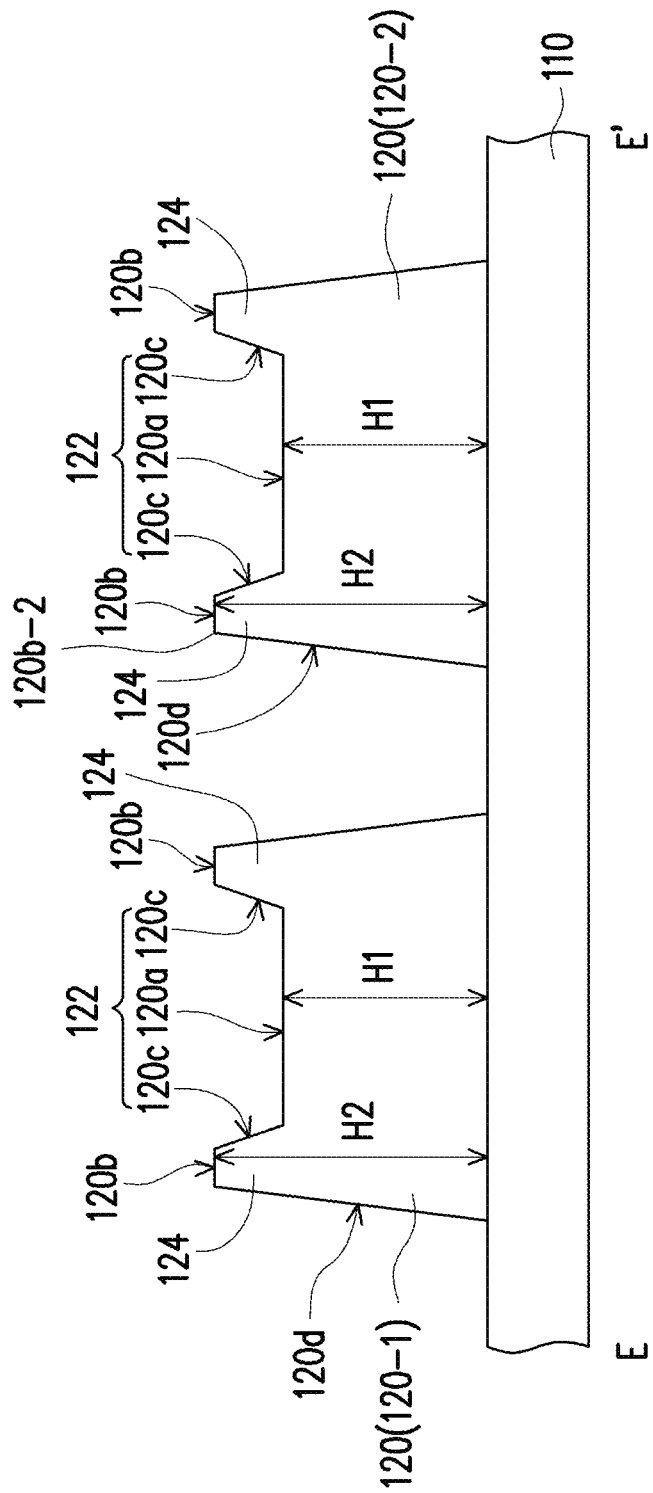
FIG. 9A to FIG. 9G are schematic cross-sectional views showing a fabricating process of an active device substrate according to yet another embodiment of the invention.
Figure 10A:
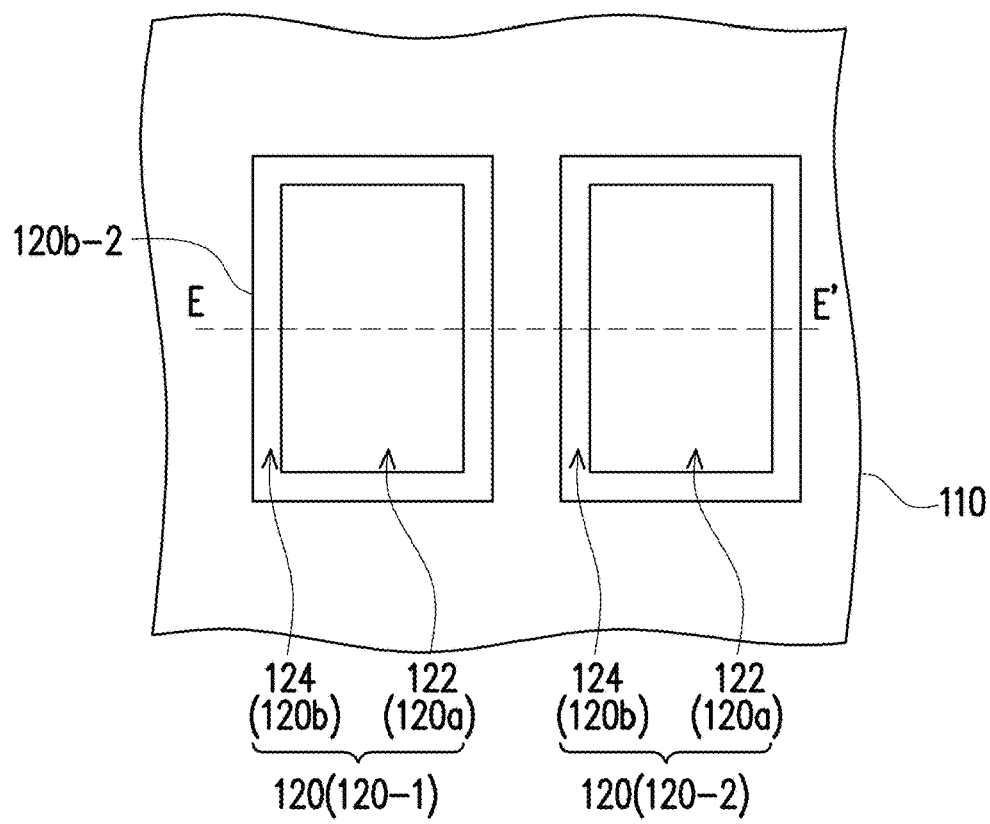
FIG. 10A to FIG. 10G are schematic top views of the active device substrate according to yet another embodiment of the invention.

Referring to FIG. 9A and FIG. 10A, first, a first protrusion 120-1 and a second protrusion 120-2 adjacent to each other are formed on the substrate 110. The first protrusion 120-1 (and the second protrusion 120-2) has the first upper surface 120a, the second upper surface 120b, the inner surface 120c, and the outer surface 120d. The distance H2 between the second upper surface 120b and the substrate 110 is longer than the distance H1 between the first upper surface 120a and the substrate 110. The inner surface 120c connects between the first upper surface 120a and the second upper surface 120b. The inner surface 120c and the first upper surface 120a define the concave portion 122. The outer surface 120d is connected to on at least one side 120b-2 of the second upper surface 120b. The inner surface 120c, the second upper surface 120b, and the outer surface 120d define the convex portion 124. In this embodiment, the convex portion 124 is a hollow square projection, for example, but the invention is not limited thereto.

Figure 14:
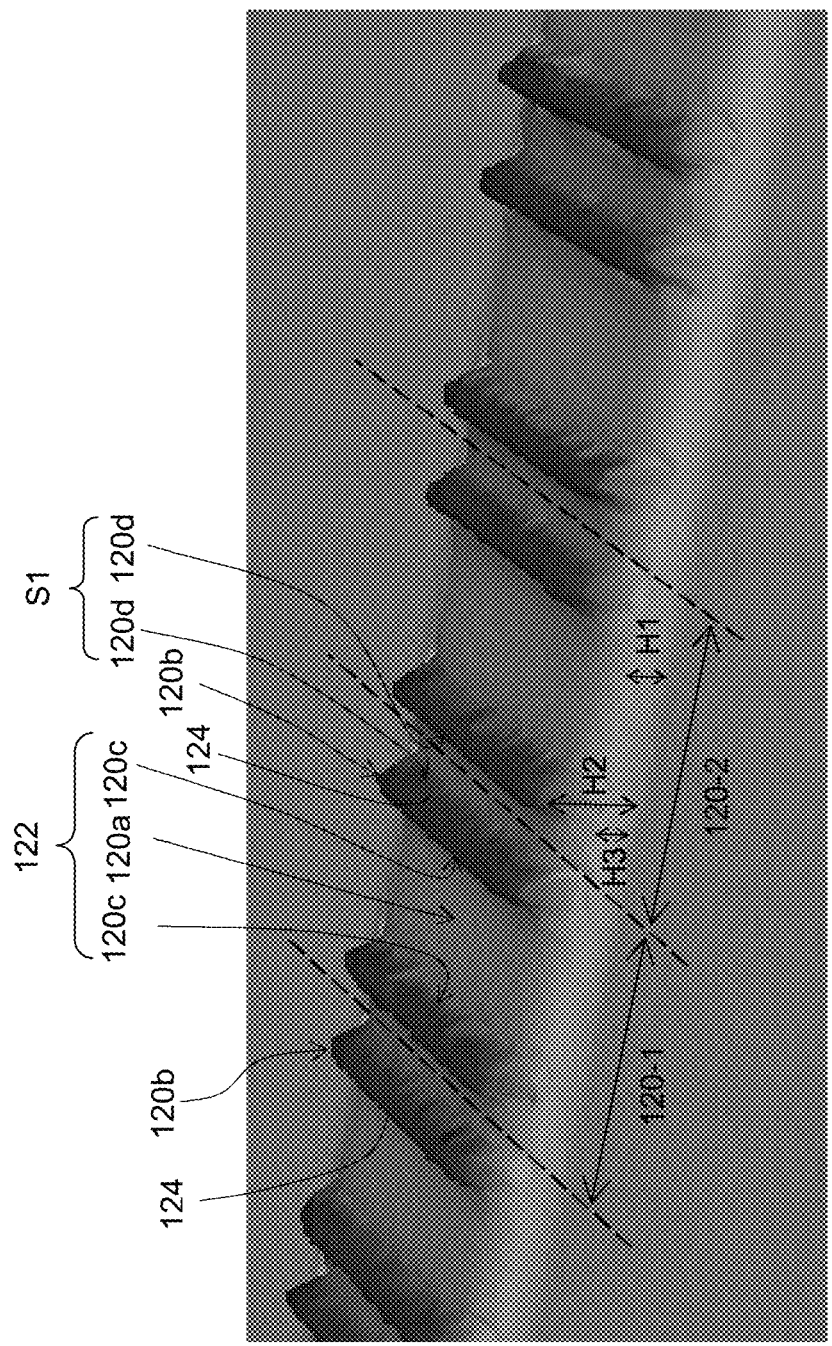
FIG. 14 is a picture of adjacent first protrusion and second protrusion, captured by a laser microscope, according to another embodiment of the invention.

FIG. 14 is a picture of the adjacent first protrusion 120-1 and second protrusion 120-2, captured by a laser microscope, according to another embodiment of the invention. Referring to FIG. 14, in the embodiment of FIG. 14, the convex portion 124 may include two straight projections. Moreover, in the embodiment of FIG. 9A, the first protrusion 120-1 and the second protrusion 120-2 are slightly separated; in other words, the outer surface 120d of the second protrusion 120-2 may be selectively not directly connected to the first protrusion 120-1. However, the invention is not limited thereto. In the embodiment of FIG. 14, the convex portions 124 of the first protrusion 120-1 and the second protrusion 120-2 that are adjacent to each other are separated, but a bottom of the first protrusion 120-1 and a bottom of the second protrusion 120-2 may be directly connected; that is, the outer surfaces 120d of the first protrusion 120-1 and the second protrusion 120-2 that face each other may be directly connected, so as to form a concave surface Si shared by the first protrusion 120-1 and the second protrusion 120-2. A distance H3 between the lowest point of the concave surface Si and the substrate 110 is shorter than the distance H2 between the second upper surface 120b and the substrate 110. In another embodiment, an insulation layer (not shown) may be disposed to cover the first protrusion 120-1 and the second protrusion 120-2 that are adjacent to each other after the first protrusion 120-1 and the second protrusion 120-2 are completed, so as to protect the integrity of the protrusion structure in the subsequent processes.

Figure 9B:
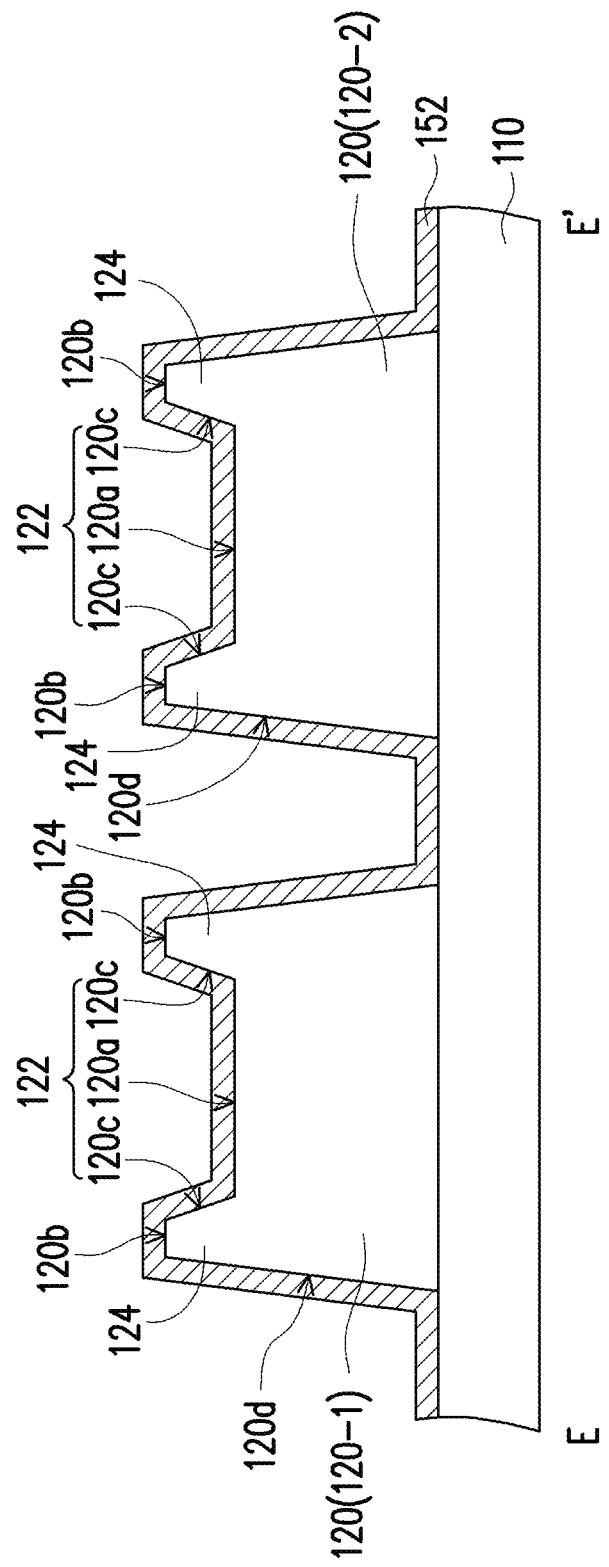
Figure 9C:
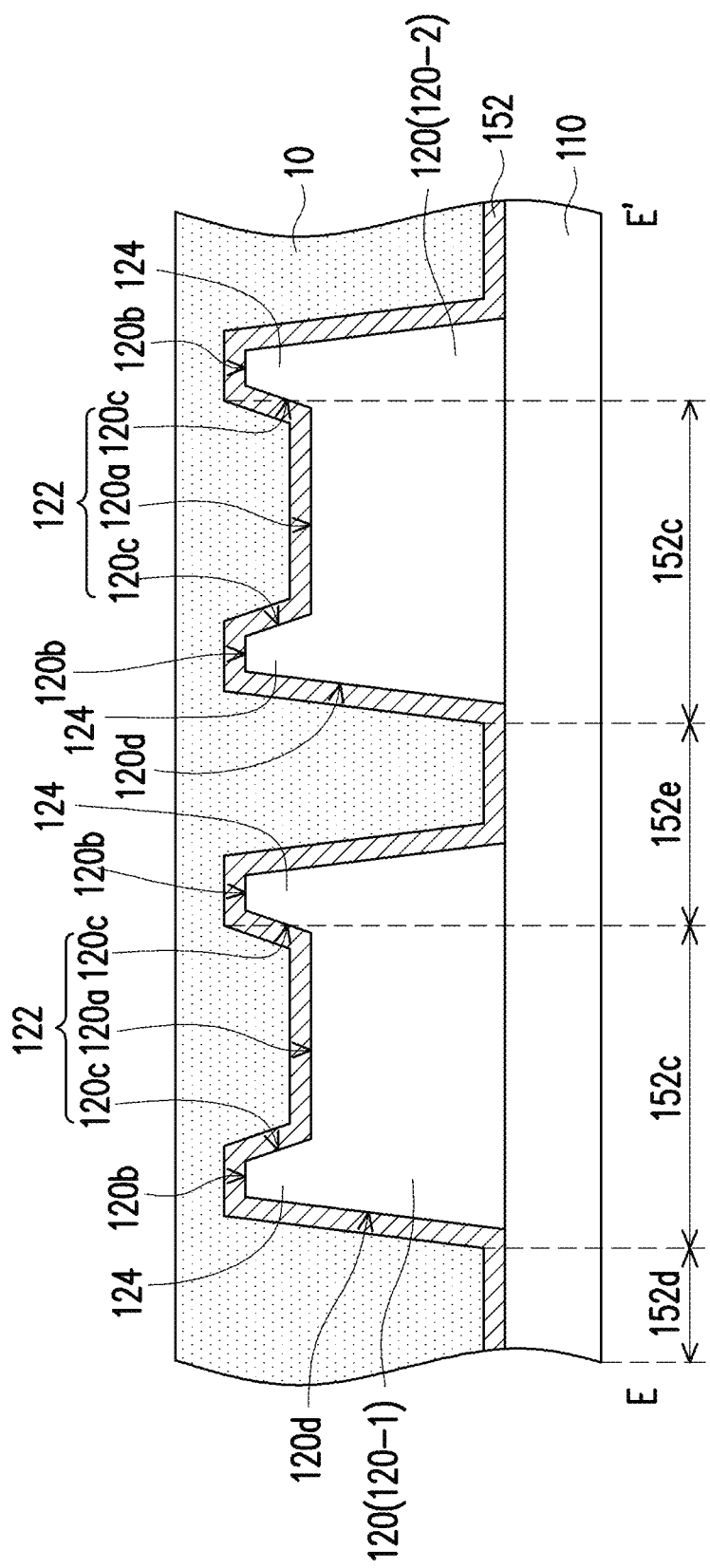
Figure 9E:
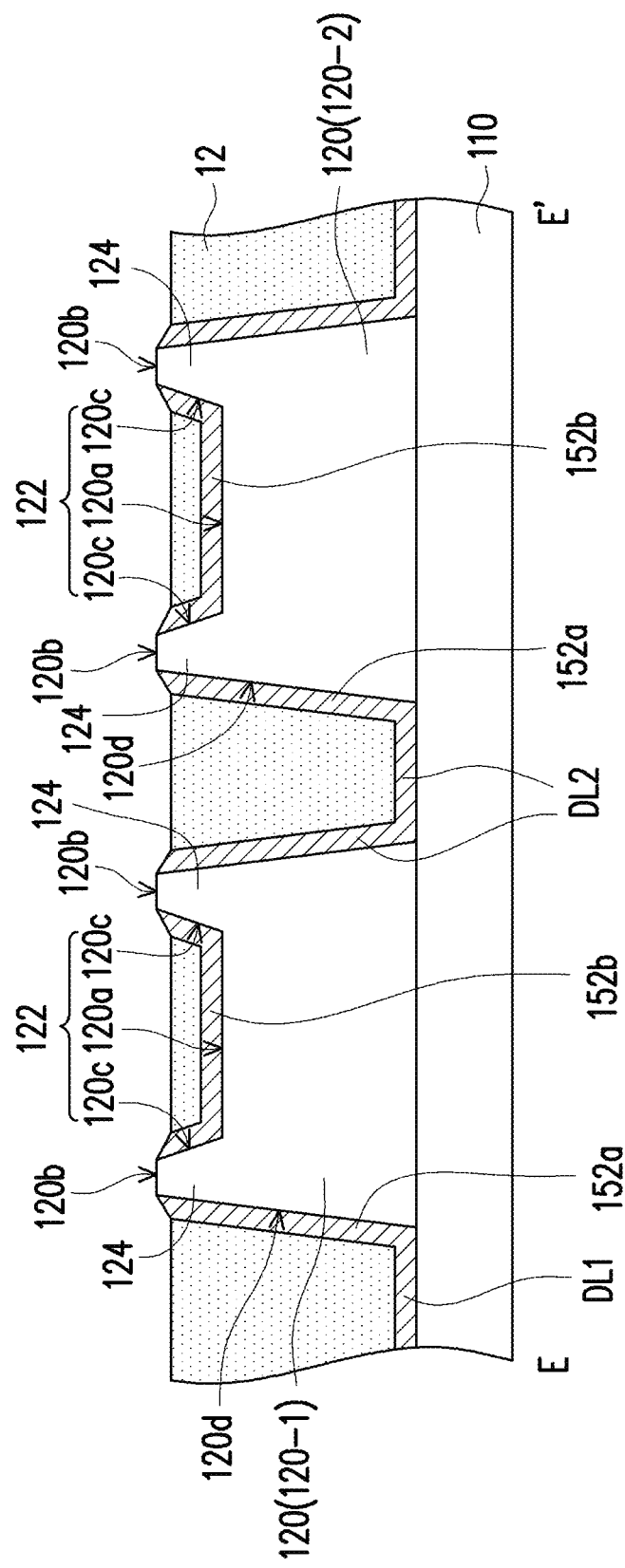
Figure 10B:
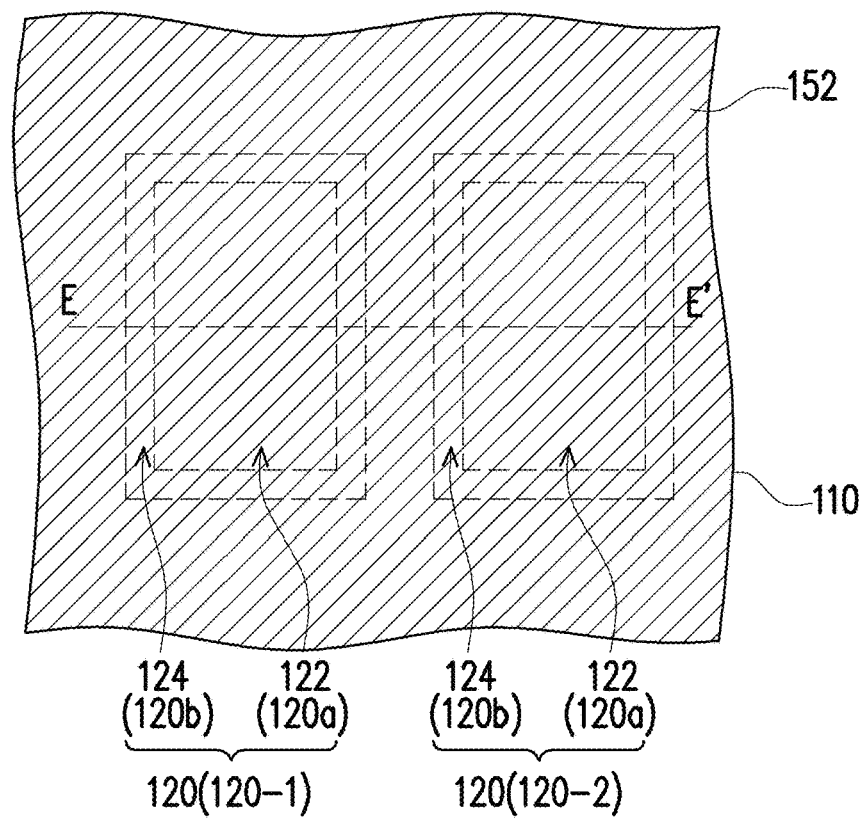
Figure 10C:
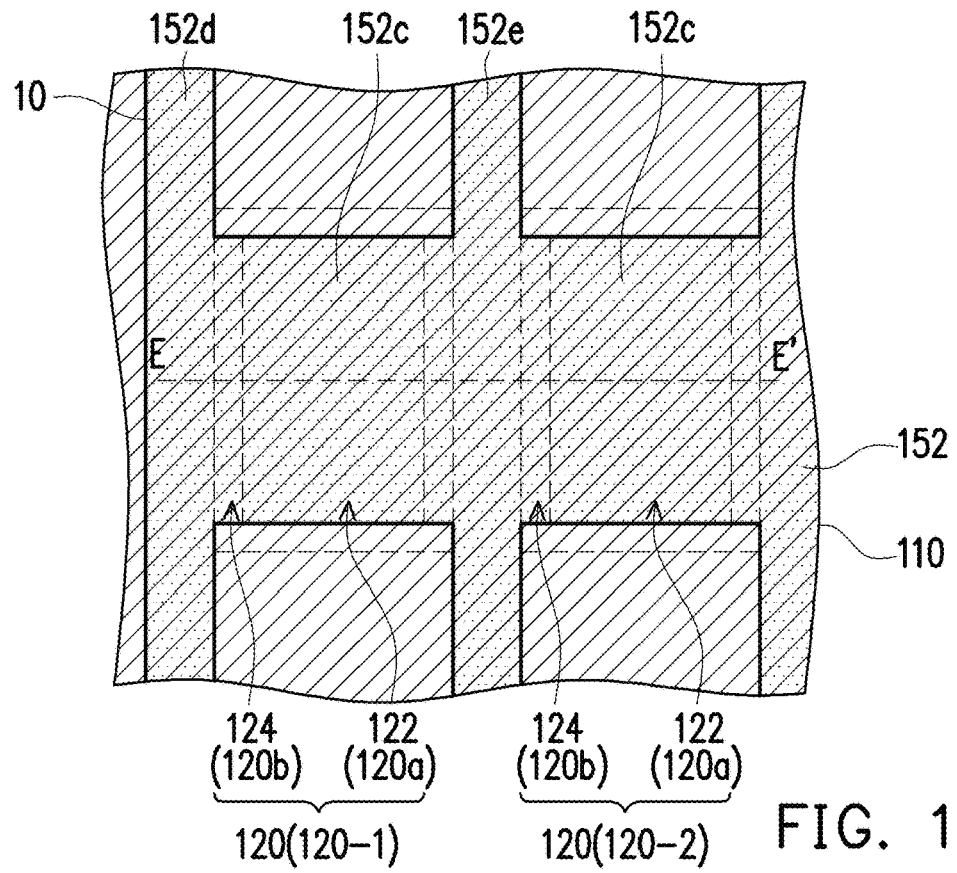

Referring to FIG. 9B and FIG. 10B, next, the conductive layer 152 is formed to cover the first protrusion 120-1, the second protrusion 120-2, and a portion of the substrate 110. Referring to FIG. 9C and FIG. 10C, then, the photoresist layer 10 is formed on the conductive layer 152. The photoresist layer 10 that has been patterned covers a conductive block 152c (for forming the first electrode 152a and the second electrode 152b as marked in FIG. 9E and FIG. 10E later) of the conductive layer 152 and a conductive block 152d and a conductive block 152e (for forming a first data line DL1 and a second data line DL2 as marked in FIG. 9E and FIG. 10E later) of the conductive layer 152. Particularly, in this embodiment, the conductive block 152c on the first protrusion 120-1 is directly connected between the adjacent conductive blocks 152d and 152e when the conductive layer 152 is formed.

Figure 9D:
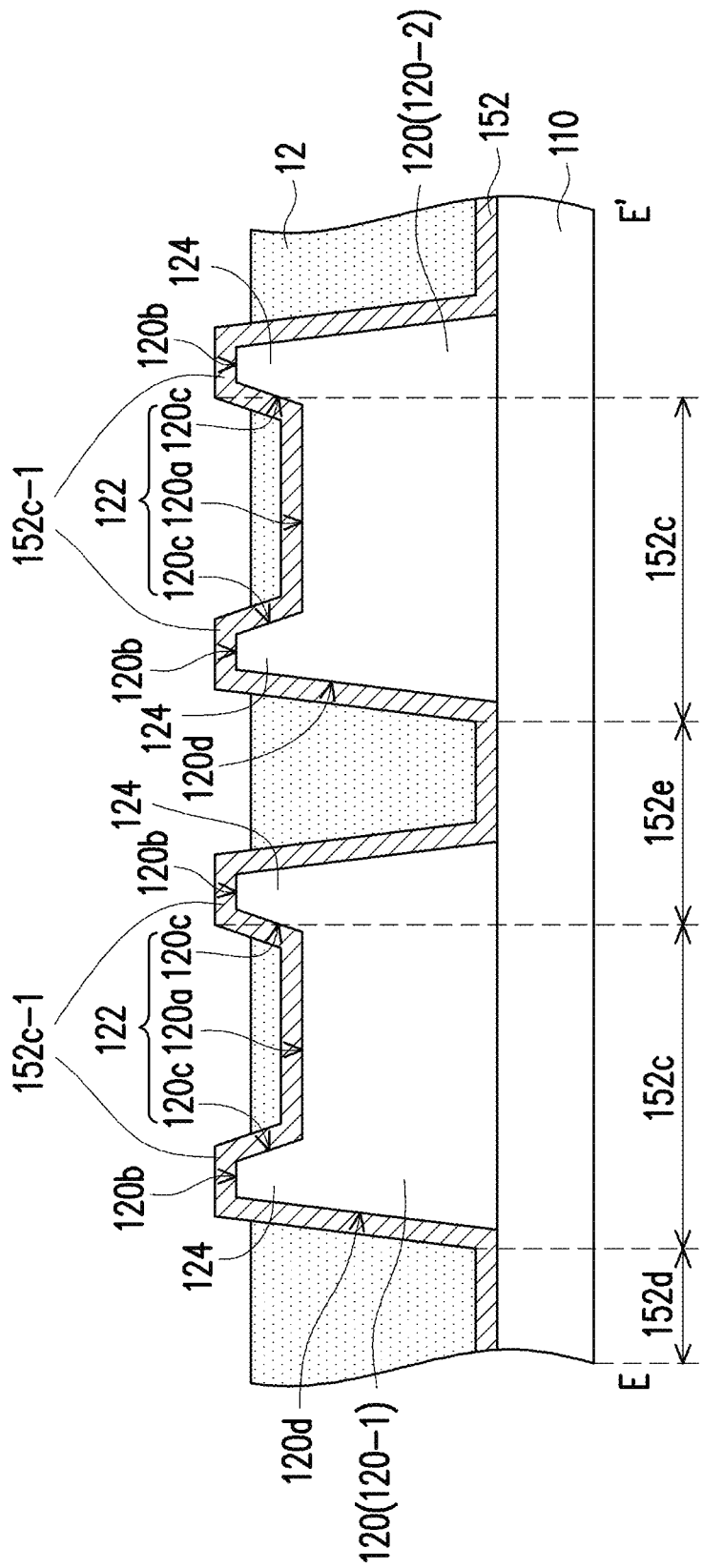
Figure 10D:
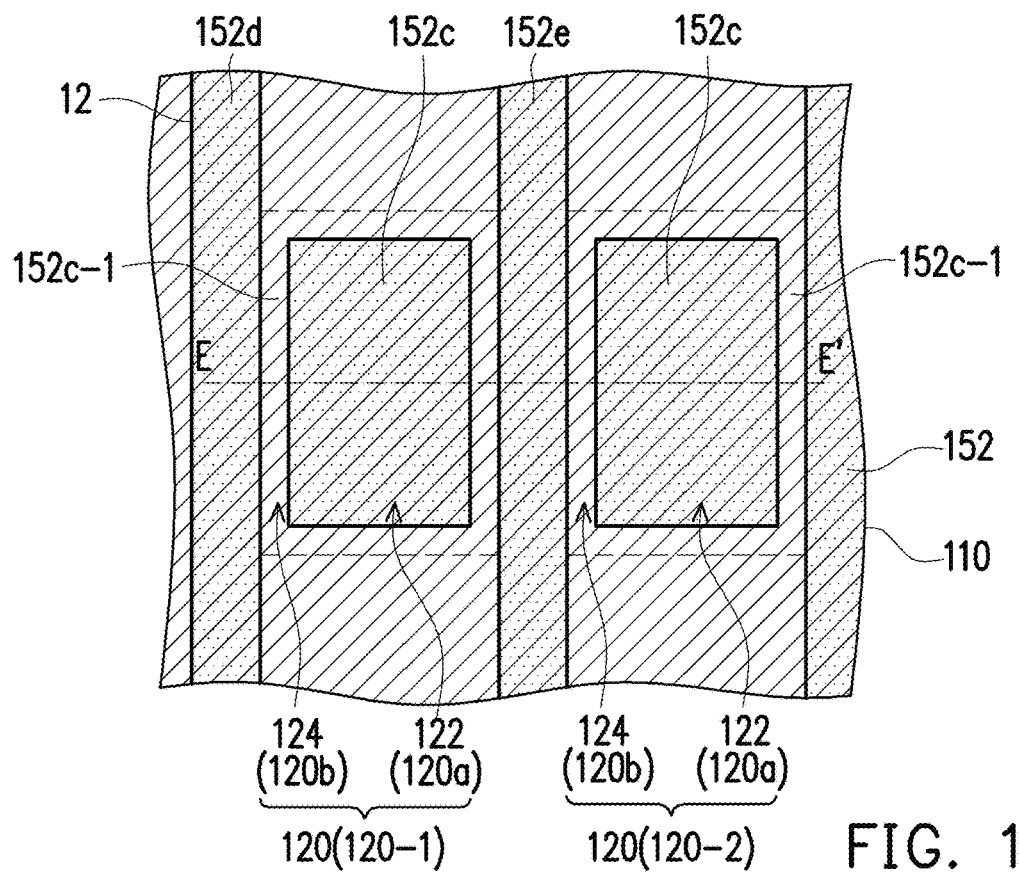

Referring to FIG. 9D and FIG. 10D, next, the photoresist layer 10 is thinned, so as to form the patterned photoresist layer 12. The patterned photoresist layer 12 covers the portion of the conductive block 152c located on the first upper surface 120a, the inner surface 120c, and the outer surface 120d of the first protrusion 120-1 (and the second protrusion 120-2) and the conductive blocks 152d and 152e between adjacent protrusions 120. The patterned photoresist layer 12 exposes a portion of a conductive block 152c-1 located on the second upper surface 120b of the first protrusion 120-1 (and the second protrusion 120-2).

Figure 10E:
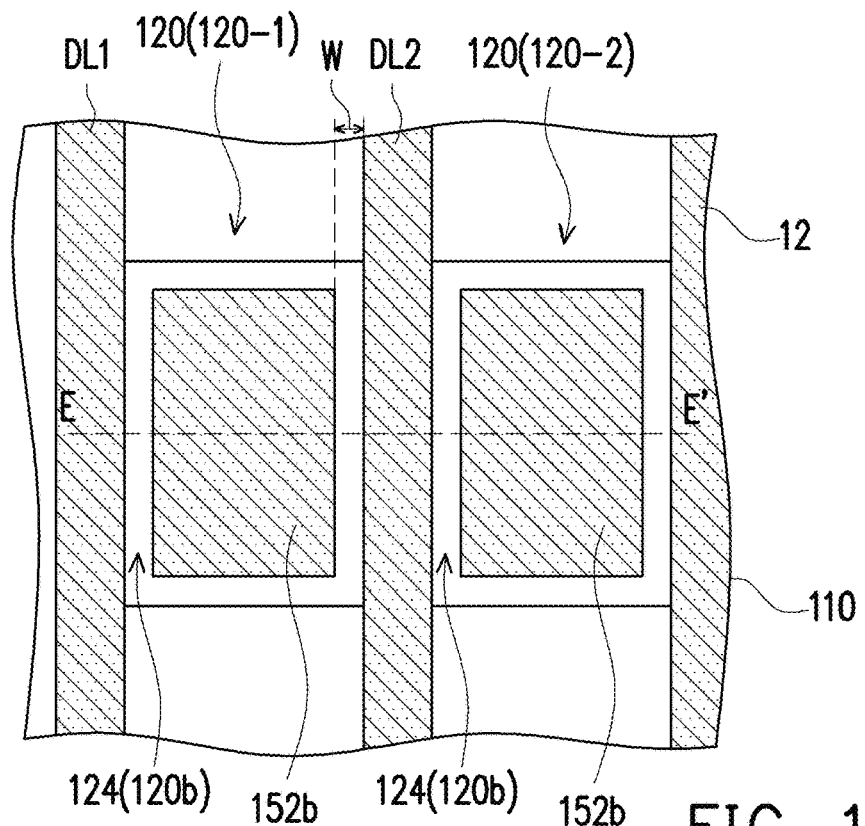

Referring to FIG. 9E and FIG. 10E, thereafter, the conductive layer 152 (as shown in FIG. 9D and FIG. 10D) is patterned with the patterned photoresist layer 12 as an etching mask, so as to form the first electrode 152a on the outer surface 120d of the first protrusion 120-1 (and the second protrusion 120-2) and form the second electrode 152b on the concave portion 122 of the first protrusion 120-1 (and the second protrusion 120-2). Particularly, the first data line DL1 and the second data line DL2 may be formed simultaneously when the first electrode 152a and the second electrode 152b are formed. The first data line DL1 and the second data line DL2 are electrically connected to the first electrode 152a on the first protrusion 120-1 and the first electrode 152a on the second protrusion 120-2 respectively. The second electrode 152b and the second data line DL2 on the first protrusion 120-1 are separated by the convex portion 124 of the first protrusion 120-1. In other words, the distance between the second data line DL2 and the second electrode 152b on the first protrusion 120-1 may be determined by a width W of the convex portion 124. Since the width W of the convex portion 124 may be made smaller (e.g., about 1 μm), the second data line DL2 and the second electrode 152b on the first protrusion 120-1 may be closer to each other, so as to achieve a display panel with high resolution.

Figure 9F:
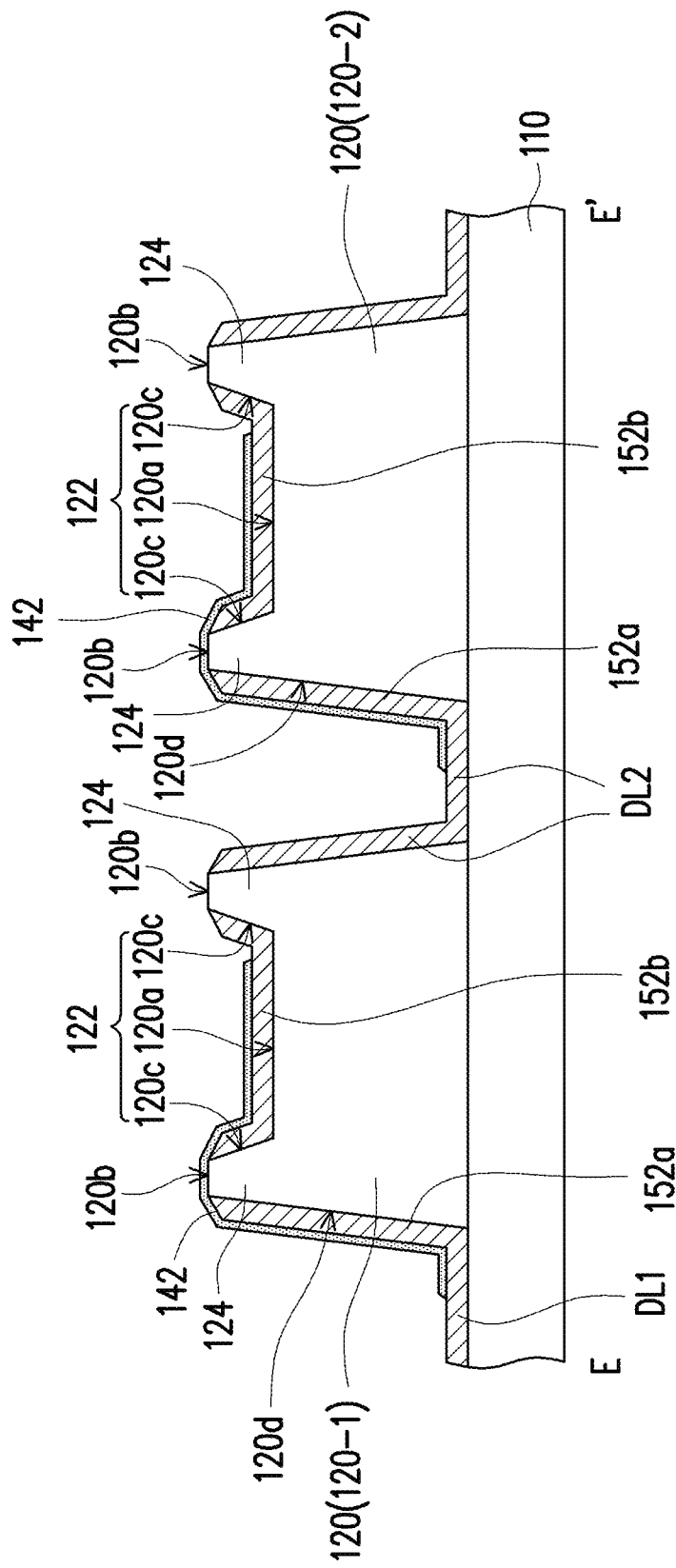
Figure 9G:
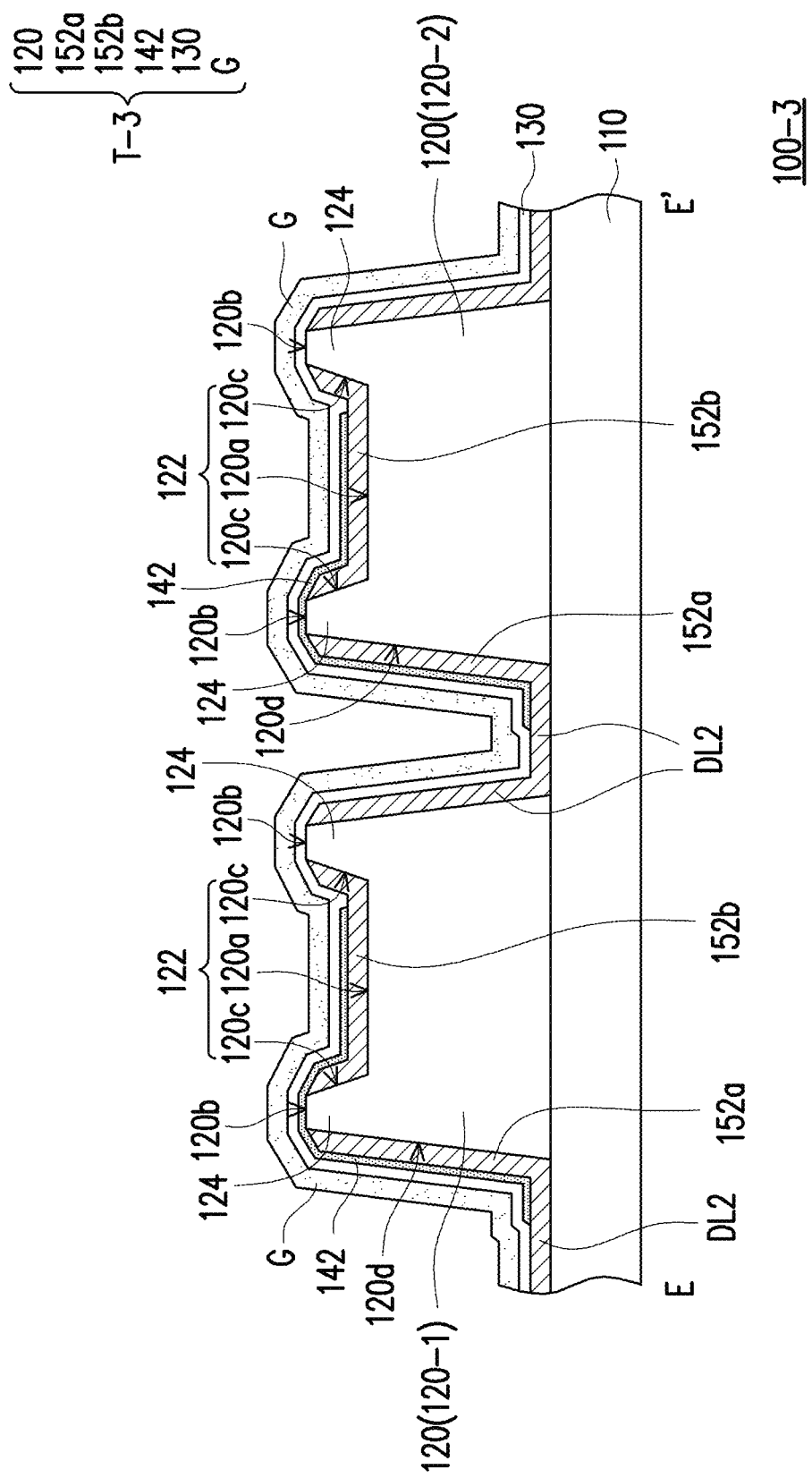
Figure 10F:
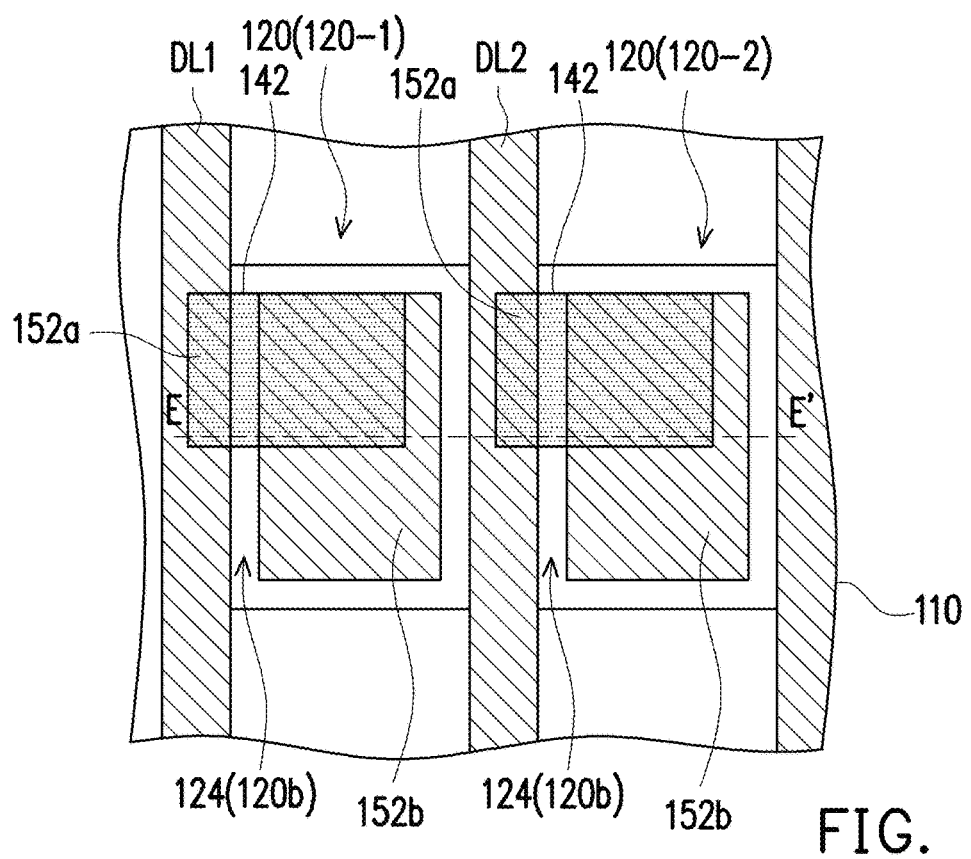

Referring to FIG. 9F and FIG. 10F, thereafter, the patterned photoresist layer 12 is removed. Then, the semiconductor layer 142 is formed to cover the first electrode 152a on the first protrusion 120-1 (and the second protrusion 120-2), the second upper surface 120b of the first protrusion 120-1 (and the second protrusion 120-2), and the second electrode 152b on the first protrusion 120-1 (and the second protrusion 120-2). The first electrode 152a and the second electrode 152b on the first protrusion 120-1 (and the second protrusion 120-2) are electrically connected to the semiconductor layer 142. Referring to FIG. 9G, in this embodiment, the outer surface of the first protrusion 120-1 includes the outer surface 120d (i.e., first outer surface) on the left side and the outer surface 120d (i.e., second outer surface) on the right side, and the first electrode 152a on the first protrusion 120-1 and a portion of the semiconductor layer 142 are located on the left outer surface 120d of the first protrusion 120-1, and a portion of the second data line DL2 is located on the right outer surface 120d of the first protrusion 120-1.

Figure 10G:
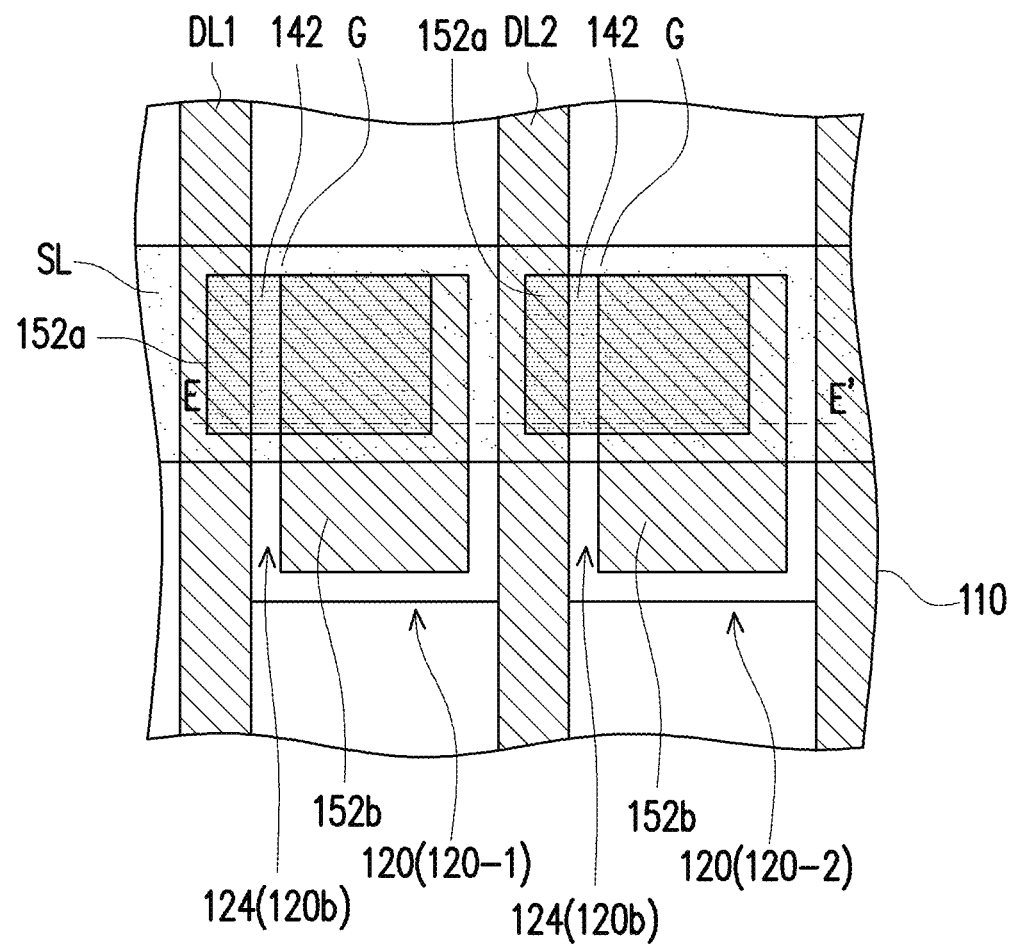
Figure 11A:
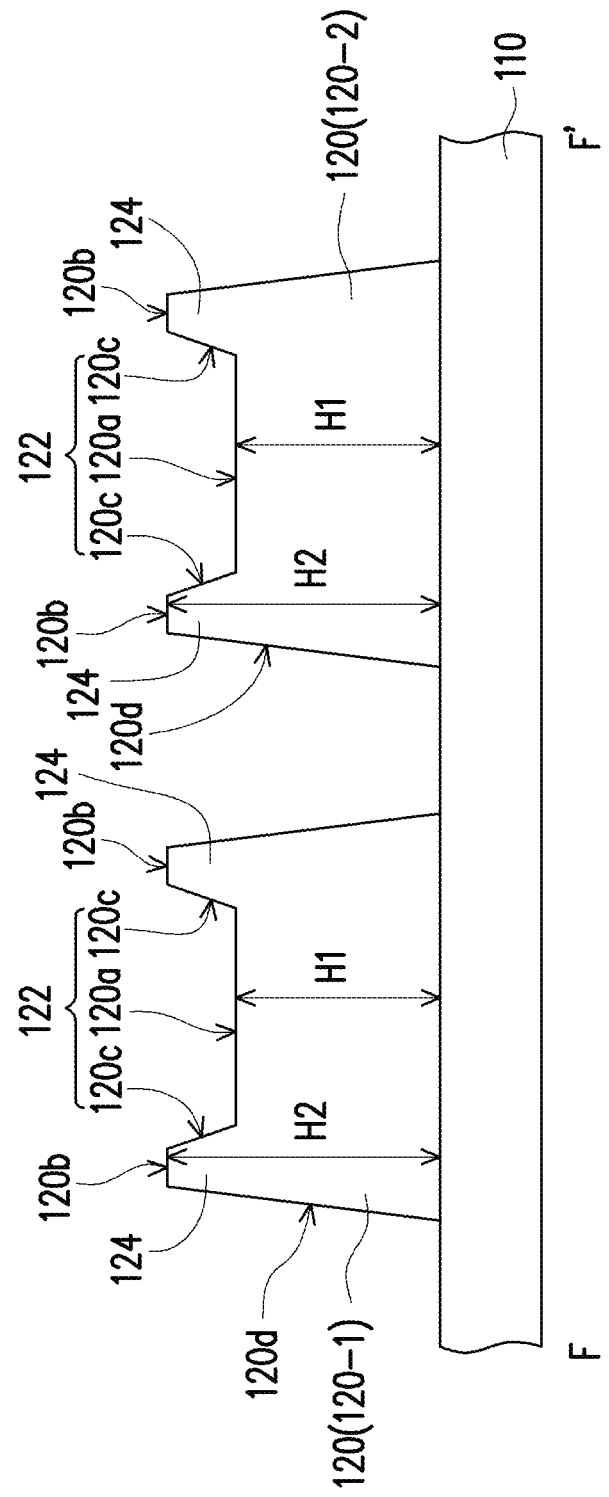
FIG. 11A to FIG. 11G are schematic cross-sectional views showing a fabricating process of an active device substrate according to an embodiment of the invention.
Figure 11B:
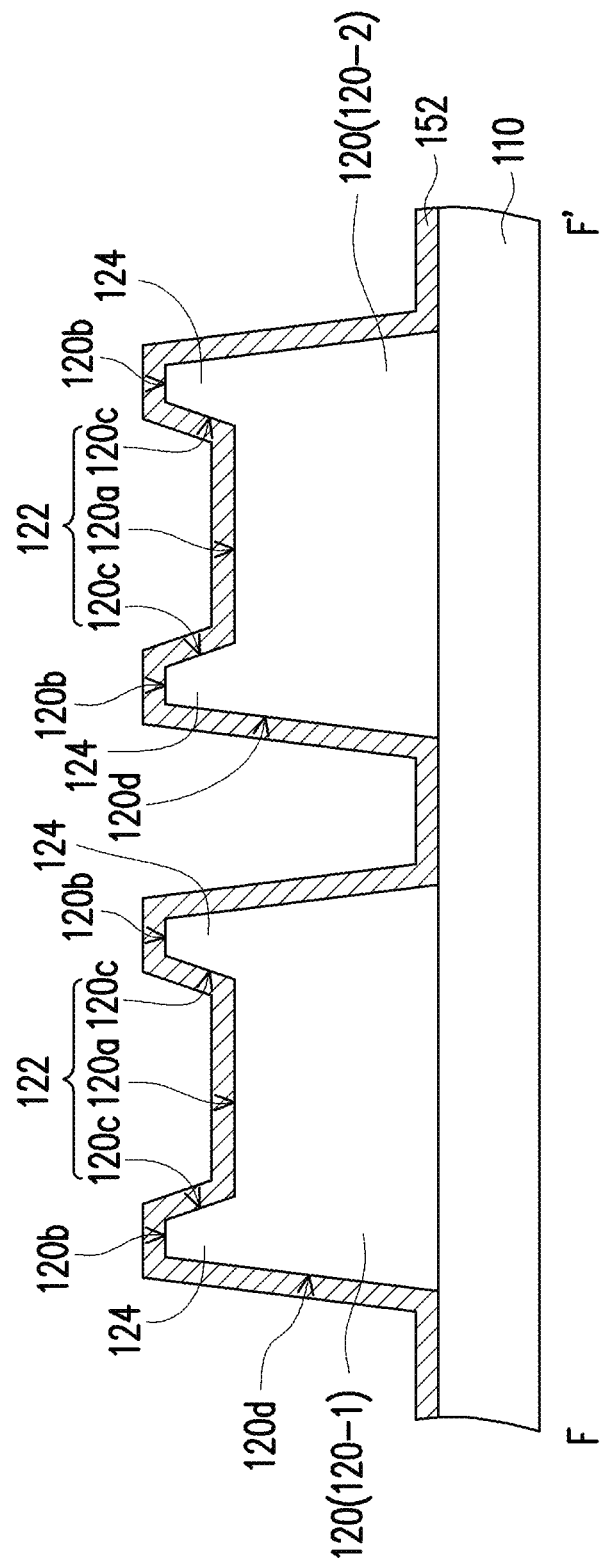
Figure 11C:
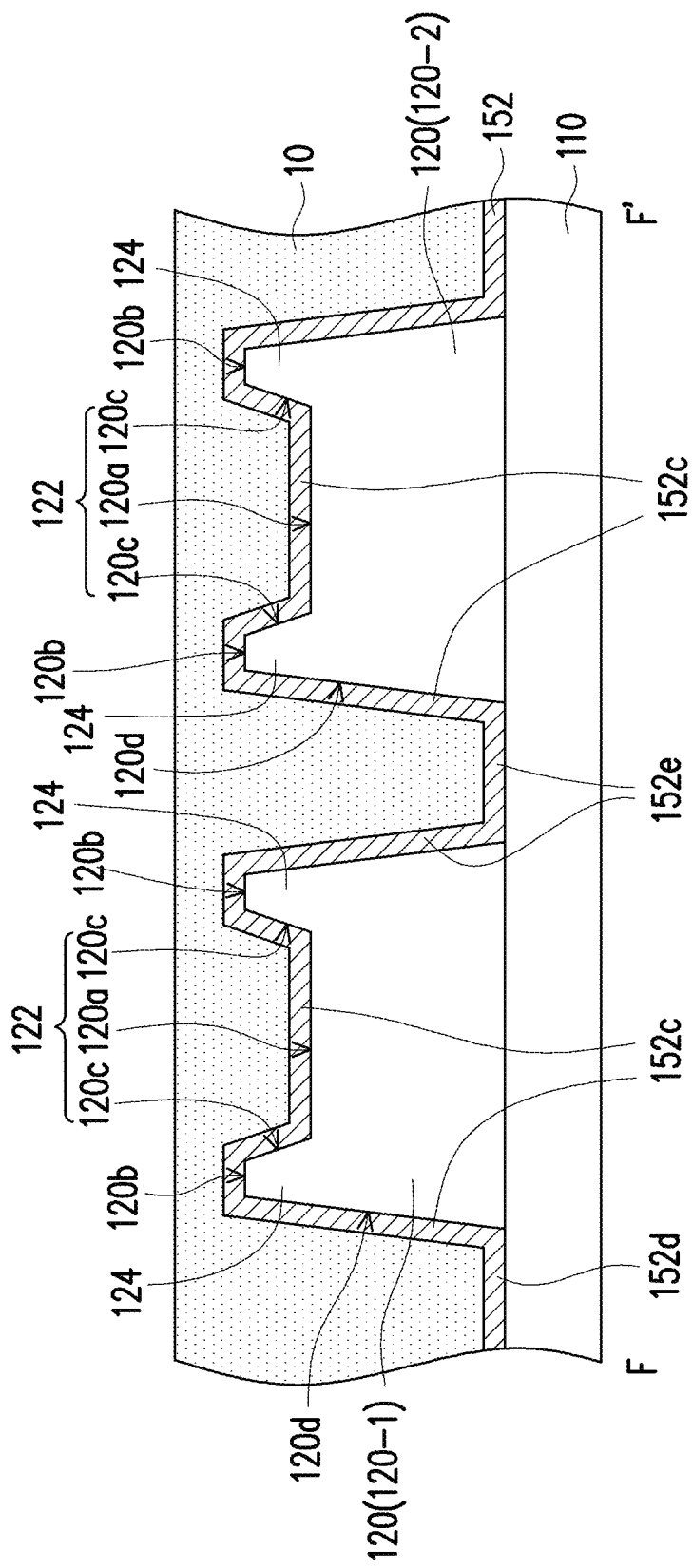
Figure 11D:
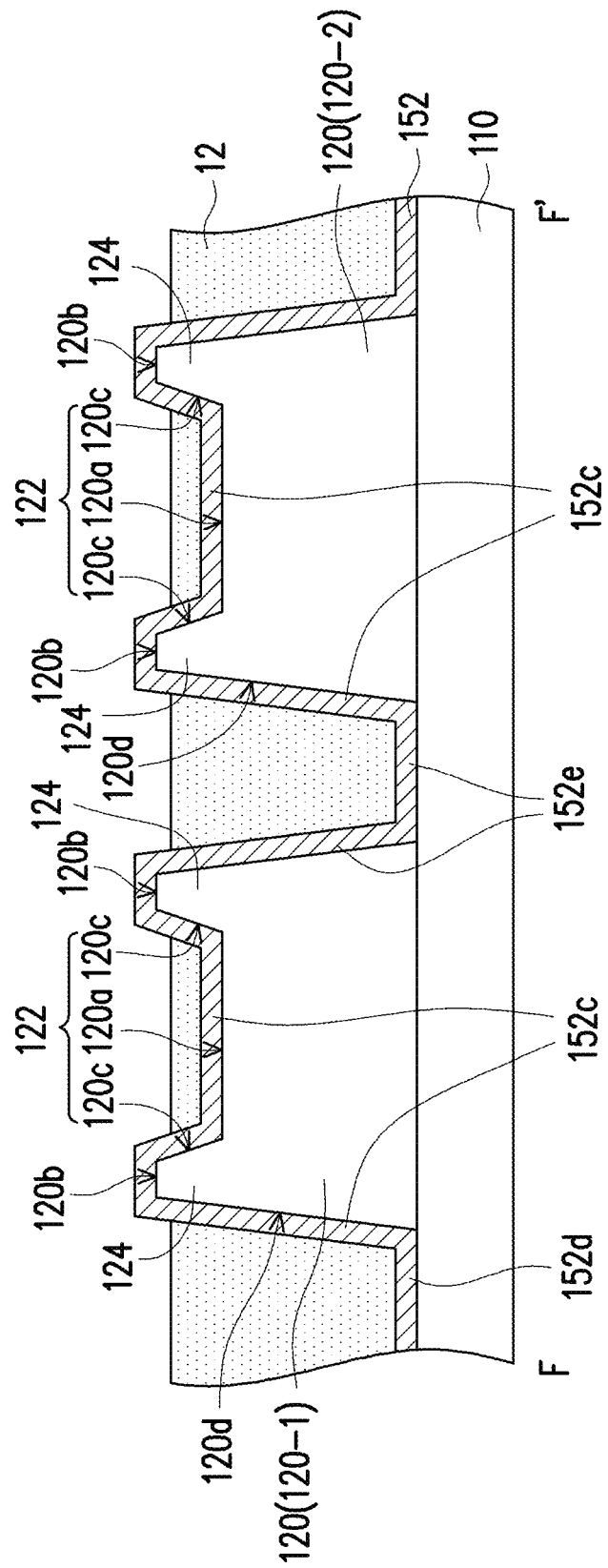
Figure 11E:
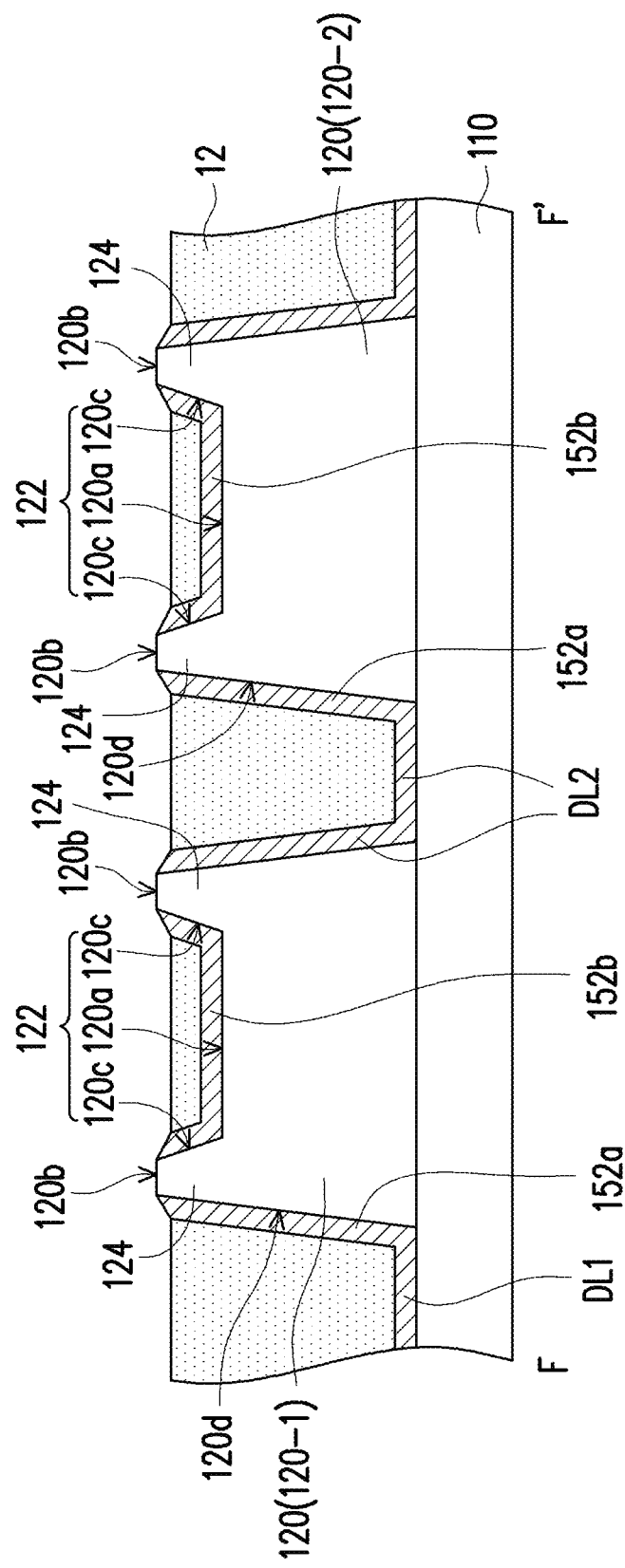
Figure 11F:
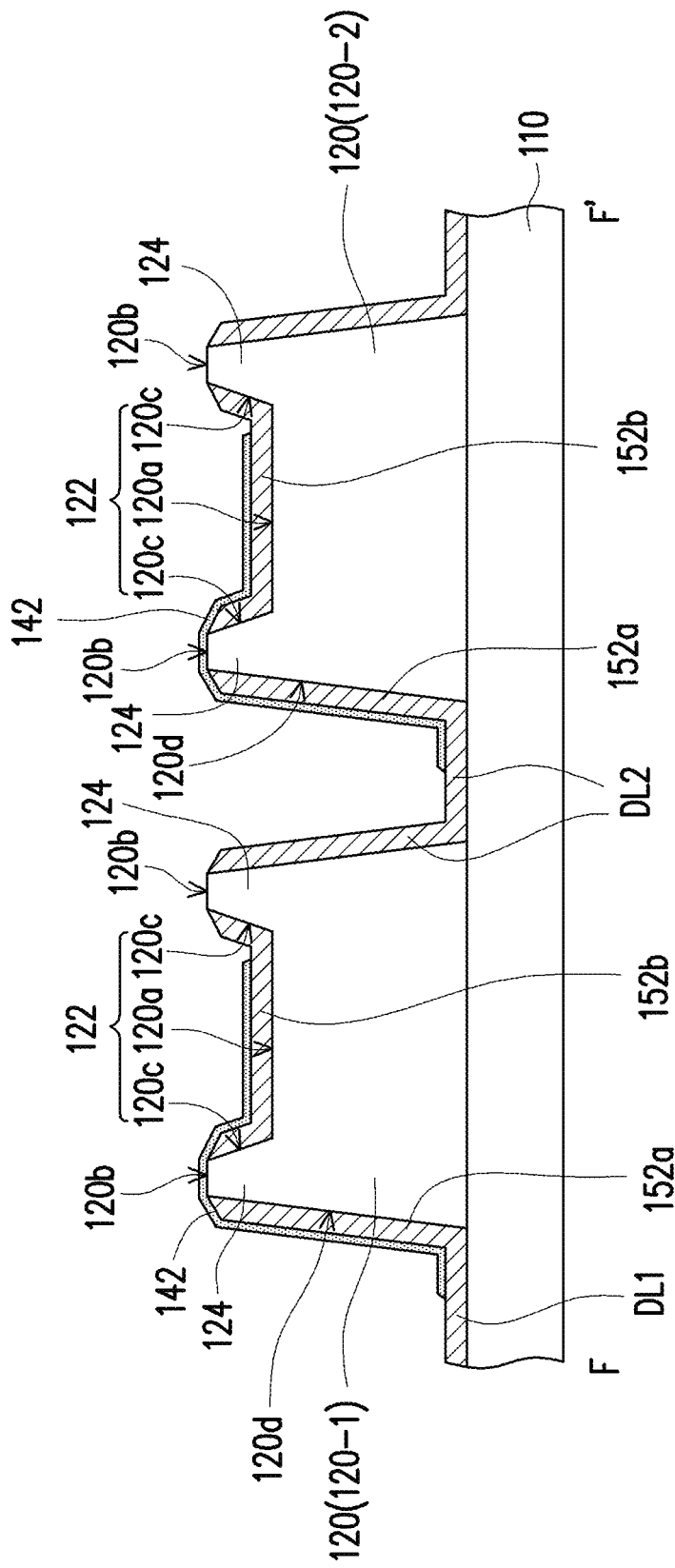
Figure 11G:
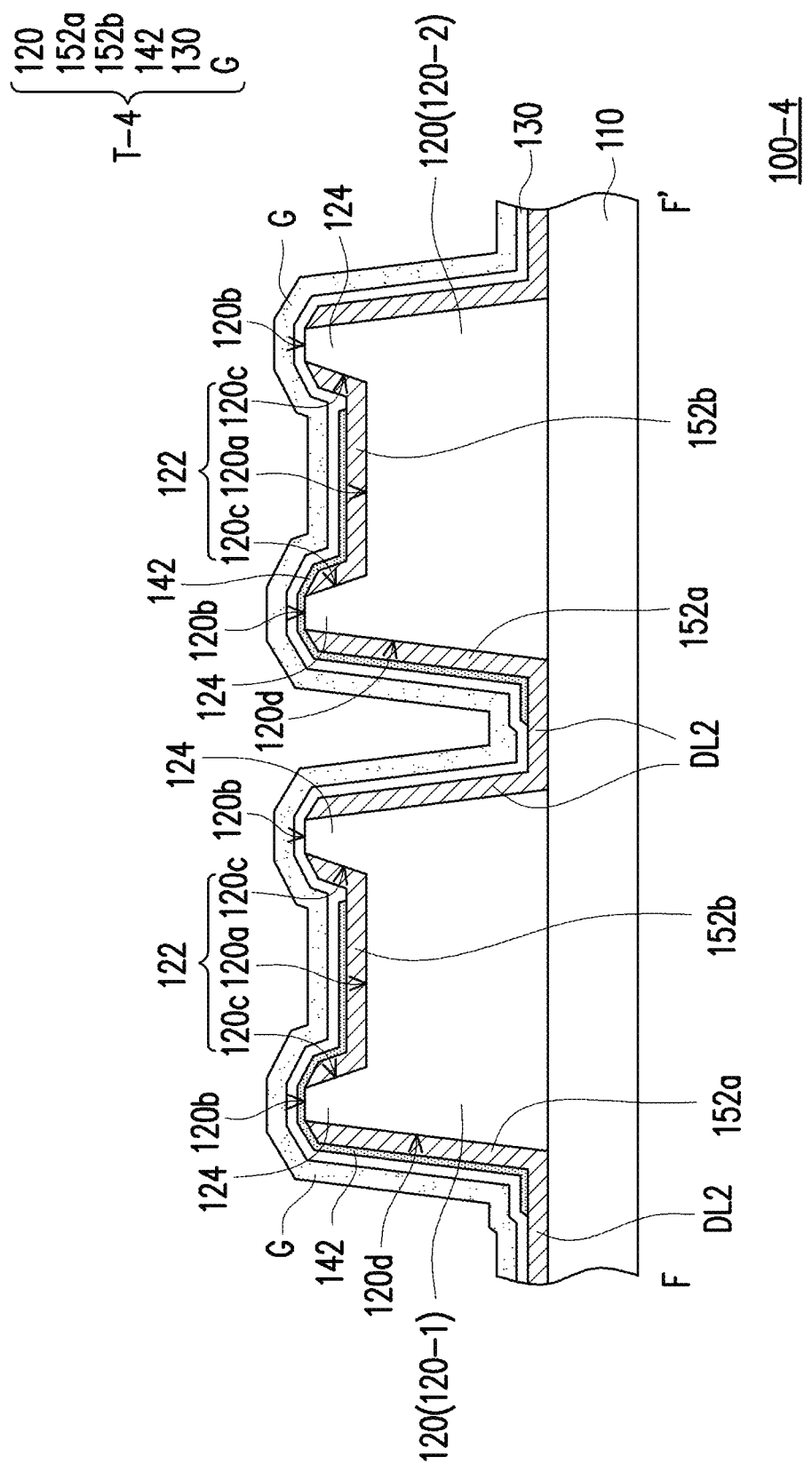

Referring to FIG. 9G and FIG. 10G, next, the gate insulation layer 130 is formed to cover the first electrode 152a, the semiconductor layer 142 located on the second upper surface 120b of the protrusion 120, and the second electrode 152b. Thereafter, the gate G and the scan line SL may be formed to cover the gate insulation layer 130. Thereby, an active device T-3 of this embodiment is formed, and the active device array substrate 100-3 is roughly completed. Likewise, a pixel electrode (not shown) and/or other components may be formed on the substrate 110 to be electrically connected to the active device T-3, which could be realized by those skilled in the art based on the descriptions above and thus is not repeated hereinafter.

Figure 12A:
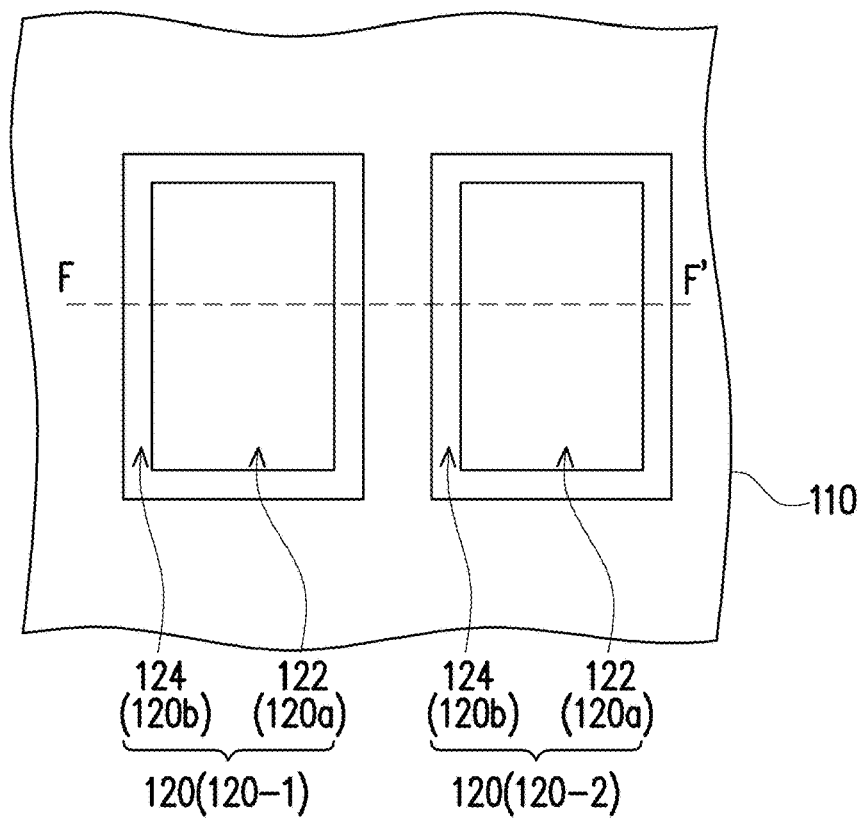
FIG. 12A to FIG. 12G are schematic top views of the active device substrate according to an embodiment of the invention.
Figure 12B:
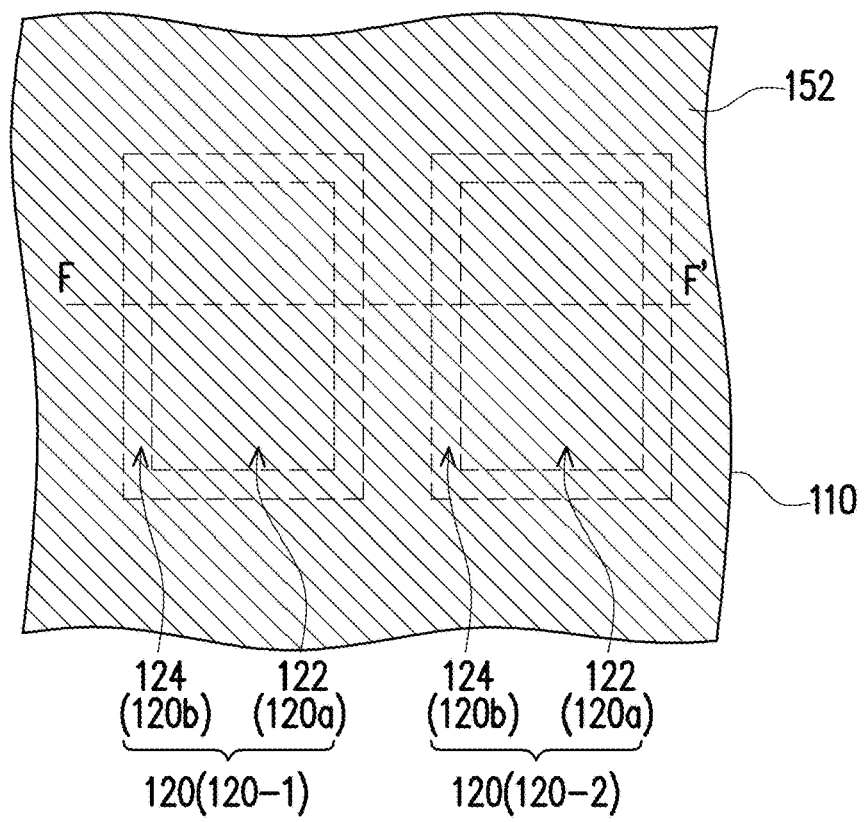
Figure 12C:
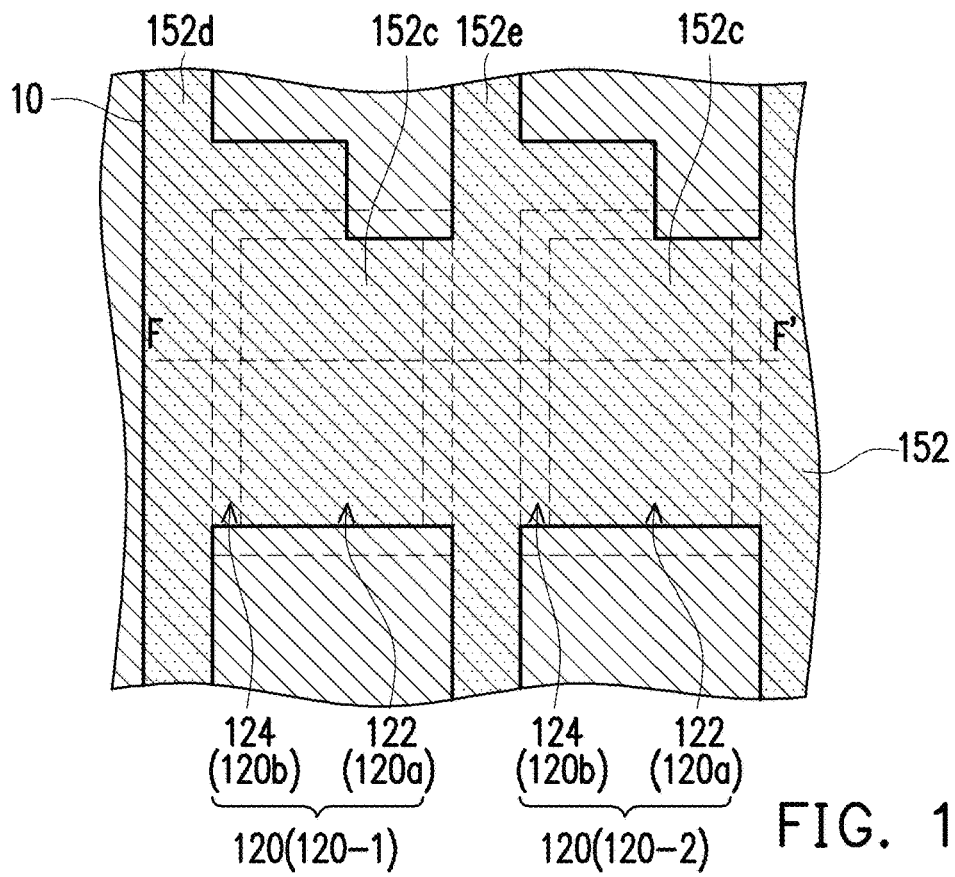
Figure 12D:
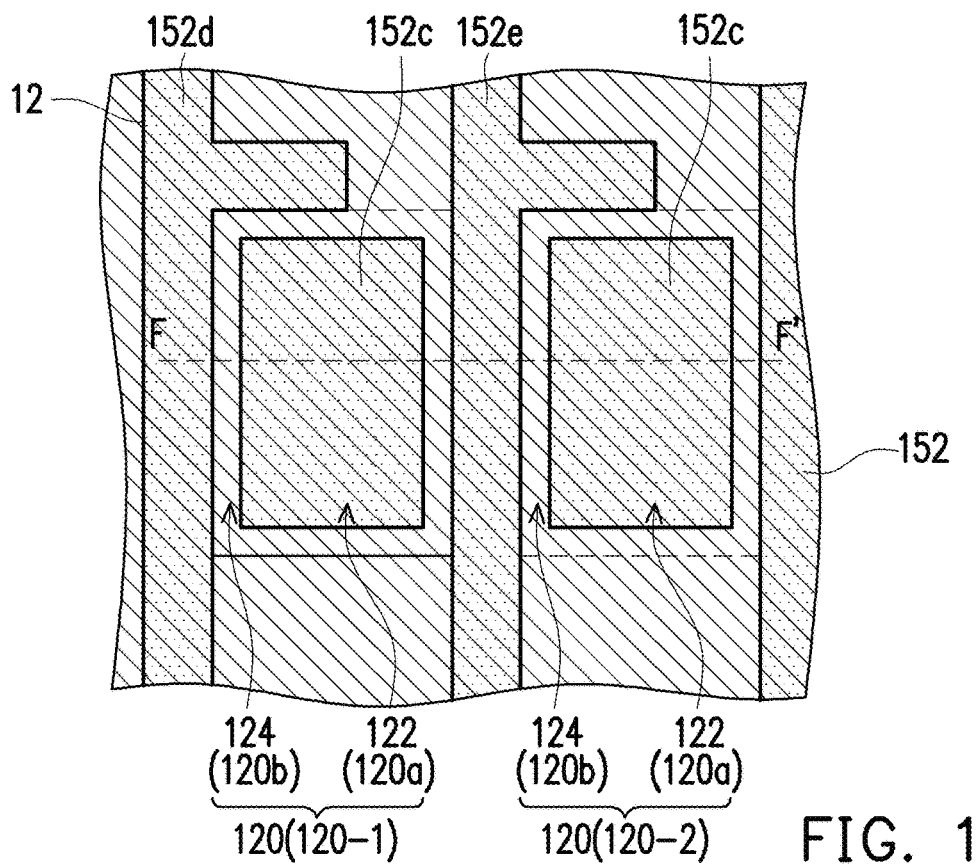
Figure 12E:
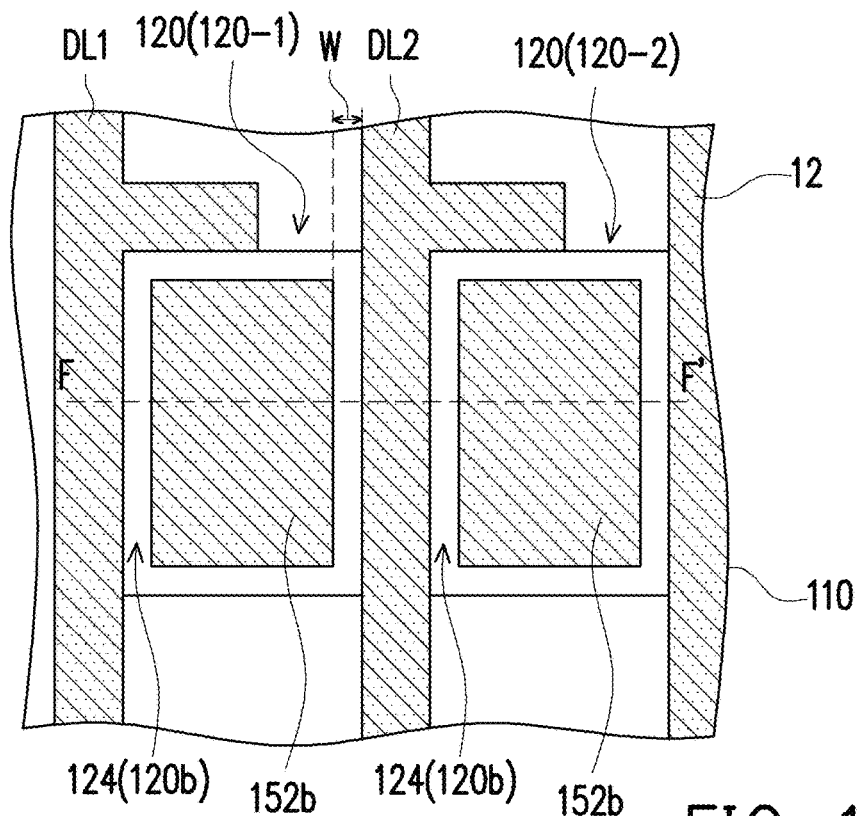
Figure 12F:
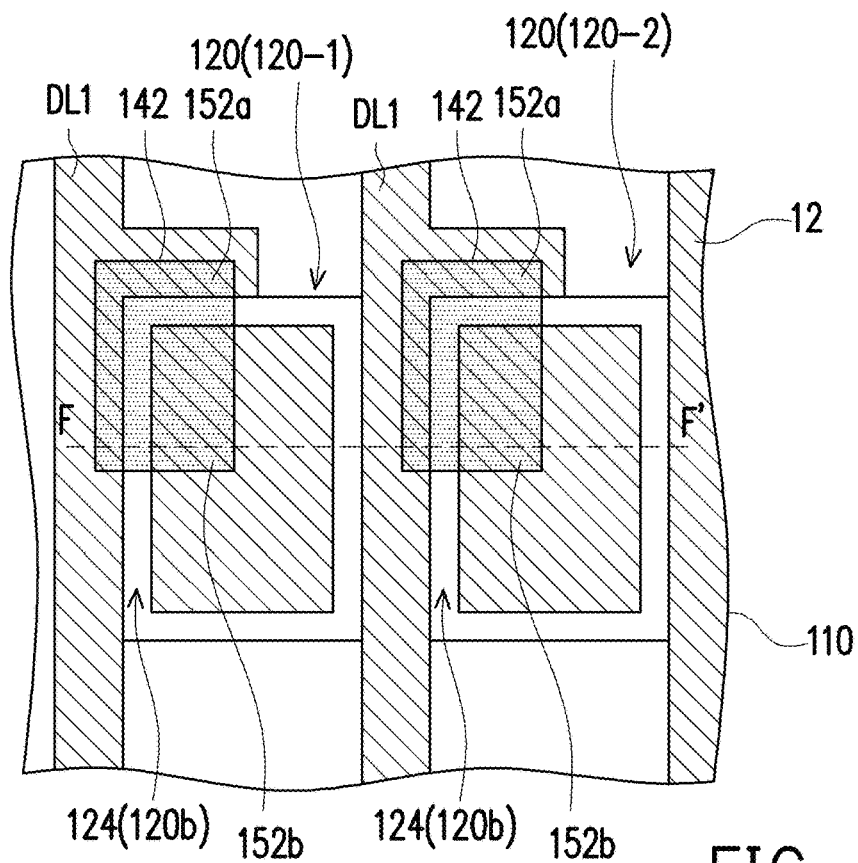
Figure 12G:
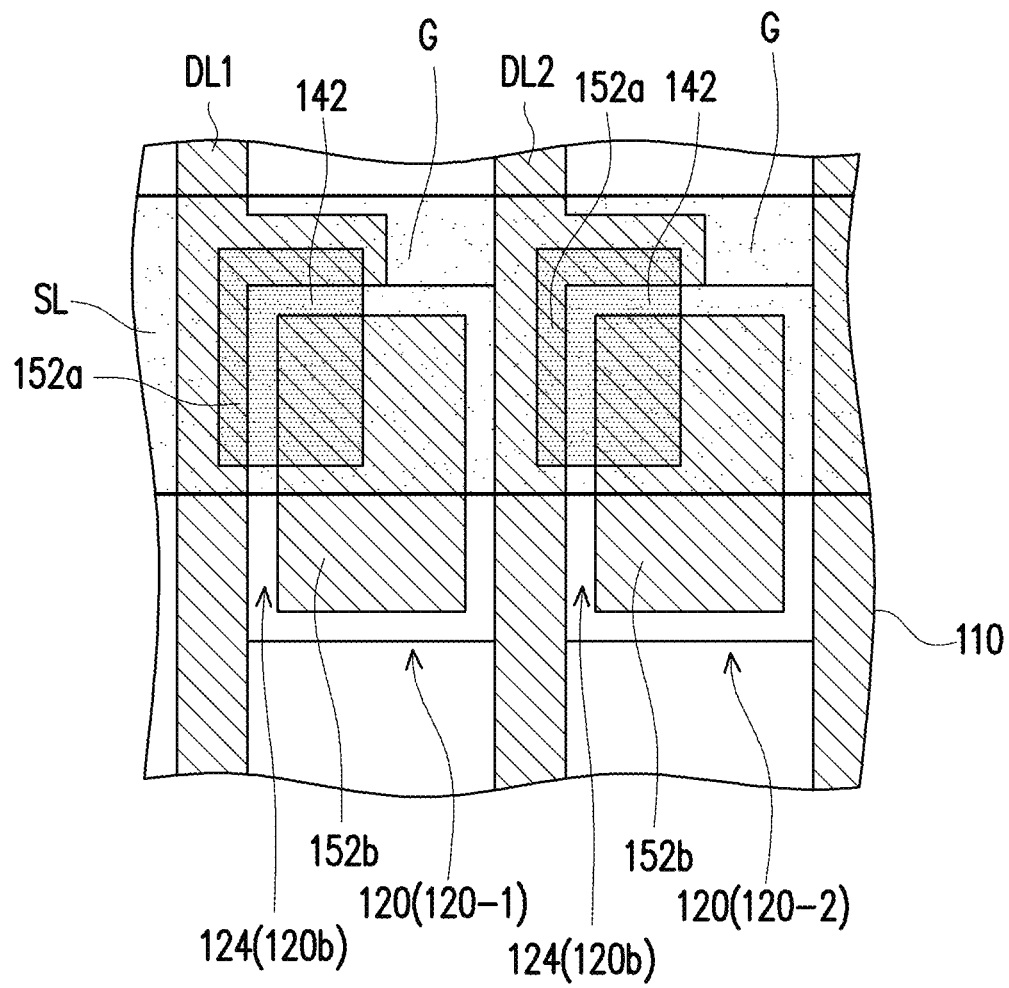

FIG. 11A to FIG. 11G are schematic cross-sectional views showing a fabricating process of an active device substrate according to an embodiment of the invention. FIG. 12A to FIG. 12G are schematic top views of the active device substrate according to an embodiment of the invention. Particularly, FIG. 11A to FIG. 11G correspond to the section line F-F' of FIG. 12A to FIG. 12G. An active device substrate 100-4 and a fabricating process thereof of this embodiment are similar to the active device substrate 100-3 and the fabricating process thereof as described above, and thus the same or similar components are assigned with the same or similar reference numerals. A main difference between the two substrates is that: the first electrode 152a of the active device substrate 100-3 has a straight shape (as shown in FIG. 10G) while the first electrode 152a of the active device substrate 100-4 has an inverted L shape (as shown in FIG. 12G). The active device substrate 100-4 and the fabricating process thereof are similar to the active device substrate 100-3 and the fabricating process thereof as described above. Those skilled in the art could realize the active device substrate 100-4 based on the above descriptions of the active device substrate 100-3 and the fabricating process, FIG. 11A to FIG. 11G, and FIG. 12A to FIG. 12G, and thus details thereof are not repeated hereinafter. Furthermore, the methods of forming the first electrode 152a, the second electrode 152b, and the data lines DL1 and DL2 of FIG. 9B to FIG. 9E may be used in the fabricating process of the bottom gate TFT, and those skilled in the art could complete another active device substrate, which is similar to FIG. 9G but includes a bottom gate thin film transistor T-3 instead, based on the forming methods of the first electrode 152a, the second electrode 152b, and the data lines DL1 and DL2 of FIG. 9B to FIG. 9E and part of the fabricating process (corresponding to FIG. 1B to FIG. 1G) of the active device substrate 100 including the bottom gate TFT T.

Figure 13:
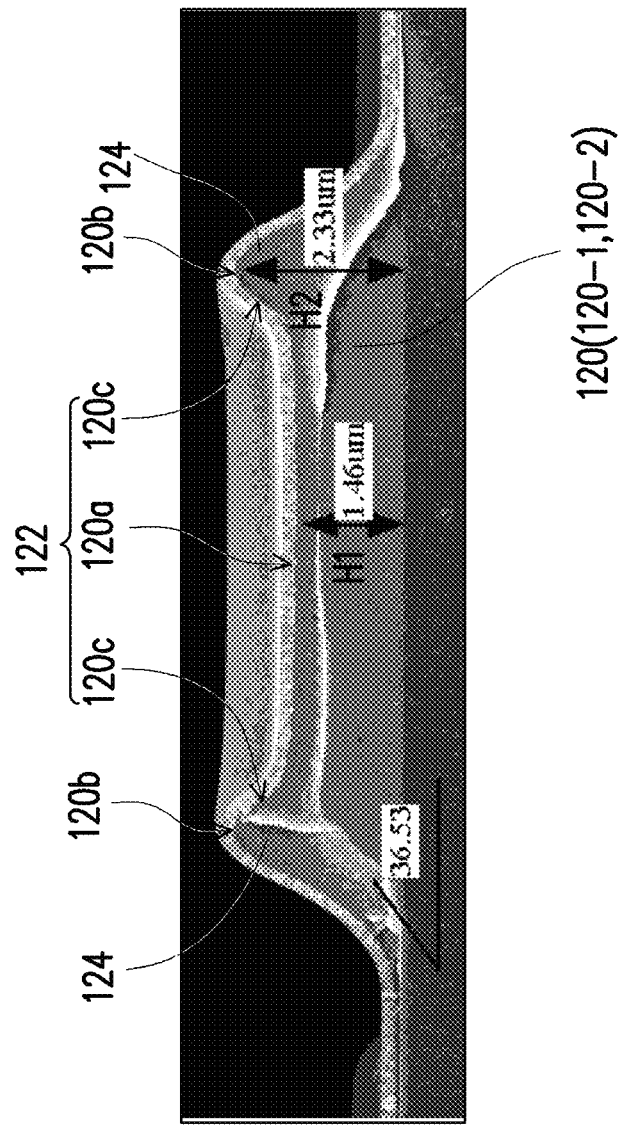
FIG. 13 is a picture of a cross-section of a protrusion, captured by an electron microscope, according to an embodiment of the invention.

FIG. 13 is a picture of a cross-section of the protrusion, captured by an electron microscope, according to an embodiment of the invention. Referring to FIG. 13, the actual cross-section of the protrusion 120, 120-1, or 120-2 described above may be the cross-section of the protrusion 120, 120-1, or 120-2 as shown in FIG. 13. It should be noted that the cross-section of the second upper surface 120b of the protrusion 120, 120-1, or 120-2 shown in the drawings (e.g., FIG. 1A, FIG. 9A, and so on) before FIG. 13 is a horizontal straight line, for example, so as to facilitate the illustration. However, as shown in FIG. 13, the actual cross-section of the second upper surface 120b may be a curved line, instead of a straight line. In other words, the second upper surface 120b of the protrusion 120, 120-1, or 120-2 is not necessarily a flat surface, and in fact, the second upper surface 120b of the protrusion 120, 120-1, or 120-2 may be a convex surface.

To sum up, the fabricating method of the active device substrate according to an embodiment of the invention includes: forming the photoresist layer to cover the concave-convex structure (i.e., the aforementioned concave portion and convex portion) of the protrusion and the conductive layer disposed on the concave-convex structure of the protrusion; thinning the photoresist layer to form the patterned photoresist layer that exposes the convex portion of the protrusion; and patterning the conductive layer with the patterned photoresist layer as an etching mask to form the first electrode and the second electrode of the active device. In other words, the size of the gap between the first electrode and the second electrode is determined by the convex portion of the protrusion. The portion of the semiconductor layer that overlaps the gap between the first electrode and the second electrode may be regarded as a channel of the active device. Since there are readily available processes for forming the protrusion having the concave portion and the convex portion, the size of the convex portion of the protrusion can be precisely controlled. Thus, the channel size defined by the convex portion of the protrusion can be precisely controlled as well. Therefore, the variations among the channel sizes of multiple active devices of the active device substrate are suppressed to make the electrical characteristics of the active devices more consistent, and thus the active device substrate is suitable for mass production.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. An active device substrate, comprising:
a substrate;
at least an active device disposed on the substrate and comprising:
   a protrusion disposed on the substrate and having:
      a first upper surface;
      a second upper surface, wherein a distance between the second upper surface and the substrate is longer than a distance between the first upper surface and the substrate;
      an inner surface connecting between the first upper surface and the second upper surface, wherein the inner surface and the first upper surface define a concave portion; and
      an outer surface, wherein the outer surface is connected to at least one side of the second upper surface, and the inner surface, the second upper surface, and the outer surface define a convex portion;
   a gate covering the protrusion;
   a semiconductor layer disposed on the first upper surface, the inner surface, the second upper surface, and the outer surface of the protrusion;
   a gate insulation layer disposed between the gate and the semiconductor layer;
   a first electrode disposed on at least a portion of the outer surface of the protrusion and electrically connected to the semiconductor layer; and
   a second electrode disposed in the concave portion of the protrusion and electrically connected to the semiconductor layer, wherein the first electrode and the second electrode are separated by the convex portion of the protrusion; and
at least a pixel electrode electrically connected to the second electrode of the corresponding active device.

2. The active device substrate according to claim 1, wherein the first electrode covers at least a portion of the outer surface of the protrusion, the second electrode covers the first upper surface and the inner surface of the protrusion, and the first electrode and the second electrode do not cover the second upper surface of the protrusion.

3. The active device substrate according to claim 1, wherein:
the gate is disposed on the first upper surface, the inner surface, the second upper surface, and the outer surface of the protrusion;
the gate insulation layer covers the gate;
the semiconductor layer covers the gate insulation layer located on the first upper surface, the inner surface, the second upper surface, and the outer surface of the protrusion;
the first electrode is disposed on the semiconductor layer located on the outer surface of the protrusion; and
the second electrode is disposed on the semiconductor layer located on the first upper surface and the inner surface of the protrusion.

4. The active device substrate according to claim 3, further comprising:
a protection layer covering the first electrode, the semiconductor layer located on the second upper surface of the protrusion, and a portion of the second electrode, wherein the pixel electrode is in contact with another portion of the second electrode that is not covered by the protection layer.

5. The active device substrate according to claim 1, wherein:

the first electrode is disposed on the outer surface of the protrusion;

the second electrode is disposed on the inner surface and the first upper surface of the protrusion;

the semiconductor layer covers the first electrode, the second upper surface of the protrusion, and the second electrode;

the gate insulation layer covers the semiconductor layer; and the gate covers the gate insulation layer.

6. The active device substrate according to claim 1, wherein:

the semiconductor layer is disposed on the first upper surface, the inner surface, the second upper surface, and the outer surface of the protrusion;

the first electrode is disposed on the semiconductor layer located on the outer surface of the protrusion;

the second electrode is disposed on the semiconductor layer located on the first upper surface and the inner surface of the protrusion;

the gate insulation layer covers the first electrode, the semiconductor layer located on the second upper surface of the protrusion, and the second electrode; and the gate covers the gate insulation layer.

7. The active device substrate according to claim 1, wherein the at least one active device comprises a first active device and a second active device adjacent to each other, the at least one pixel electrode comprises a first pixel electrode and a second pixel electrode separated from each other, a second electrode of the first active device and a second electrode of the second active device are electrically connected to the first pixel electrode and the second pixel electrode respectively, and the active device substrate further comprises:

a scan line electrically connected to a gate of the first active device and a gate of the second active device; and a first data line and a second data line electrically connected to a first electrode of the first active device and a first electrode of the second active device respectively.

8. The active device substrate according to claim 7, wherein an outer surface of a protrusion of the first active device has a first outer surface and a second outer surface arranged opposite to each other, the first electrode of the first active device and a portion of the semiconductor layer are disposed on the first outer surface of the protrusion, and a portion of the second data line is disposed on the second outer surface of the protrusion of the first active device.

9. The active device substrate according to claim 1, wherein the substrate comprises a display region and a peripheral region outside the display region, the active device substrate further comprises a plurality of peripheral active devices located in the peripheral region, and the peripheral active devices have structures the same as the at least one active device, wherein a plurality of gates of the peripheral active devices are electrically connected, a plurality of first electrodes of the peripheral active devices are electrically connected, and a plurality of second electrodes of the peripheral active devices are electrically connected.

10. The active device substrate according to claim 9, further comprising:

a scan line electrically connected to the gate of the active device located in the display region; and a gate driver-on-array located in the peripheral region and electrically connected to the scan line, wherein the peripheral active devices are a portion of the gate driver-on-array.

11. A fabricating method of an active device substrate, comprising:

forming at least a protrusion on a substrate, wherein the protrusion has a first upper surface, a second upper surface, an inner surface, and an outer surface, wherein a distance between the second upper surface and the substrate is longer than a distance between the first upper surface and the substrate, the inner surface connects between the first upper surface and the second upper surface, the inner surface and the first upper surface define a concave portion, the outer surface is connected to at least one side of the second upper surface, and the inner surface, the second upper surface, and the outer surface define a convex portion;

forming a gate on the protrusion;

forming a semiconductor layer on the first upper surface, the inner surface, the second upper surface, and the outer surface of the protrusion;

forming a gate insulation layer between the gate and the semiconductor layer;

forming a conductive layer on the substrate and the first upper surface, the inner surface, the second upper surface, and the outer surface of the protrusion;

forming a patterned photoresist layer, wherein the patterned photoresist layer covers the conductive layer located on the first upper surface, the inner surface, and the outer surface of the protrusion, and exposes the conductive layer located on the second upper surface of the protrusion;

patterning the conductive layer with the patterned photoresist layer as an etching mask, so as to form a first electrode on the outer surface of the protrusion and form a second electrode on the concave portion of the protrusion, wherein the gate, the semiconductor layer, the first electrode, and the second electrode form an active device; and forming at least a pixel electrode electrically connected to the corresponding second electrode.

12. The fabricating method of the active device substrate according to claim 11, wherein the first electrode covers at least a portion of the outer surface of the protrusion, the second electrode covers the first upper surface and the inner surface of the protrusion, and the first electrode and the second electrode do not cover the second upper surface of the protrusion.

13. The fabricating method of the active device substrate according to claim 11, wherein:

the gate is formed on the first upper surface, the inner surface, the second upper surface, and the outer surface of the protrusion;

the gate insulation layer covers the gate;

the semiconductor layer covers the gate insulation layer located on the first upper surface, the inner surface, the second upper surface, and the outer surface of the protrusion;

the first electrode is disposed on the semiconductor layer located on the outer surface of the protrusion; and the second electrode is disposed on the semiconductor layer located on the first upper surface and the inner surface of the protrusion.

14. The fabricating method of the active device substrate according to claim 13, wherein after forming the first electrode and the second electrode, the fabricating method further comprises:

forming a protection layer to cover the first electrode, the semiconductor layer located on the second upper surface of the protrusion, and a portion of the second electrode, wherein the pixel electrode is in contact with another portion of the second electrode that is not covered by the protection layer.

15. The fabricating method of the active device substrate according to claim 11, wherein:

the first electrode is disposed on the outer surface of the protrusion;

the second electrode is disposed on the inner surface and the first upper surface of the protrusion;

the semiconductor layer covers the first electrode, the second upper surface of the protrusion, and the second electrode;

the gate insulation layer covers the semiconductor layer; and the gate covers the gate insulation layer.

16. The fabricating method of the active device substrate according to claim 11, wherein:

the semiconductor layer is disposed on the first upper surface, the inner surface, the second upper surface, and the outer surface of the protrusion;

the first electrode is disposed on the semiconductor layer located on the outer surface of the protrusion;

the second electrode is disposed on the semiconductor layer located on the first upper surface and the inner surface of the protrusion;

the gate insulation layer covers the first electrode, the semiconductor layer located on the second upper surface of the protrusion, and the second electrode; and the gate covers the gate insulation layer.

17. The fabricating method of the active device substrate according to claim 11, wherein:

forming the at least one protrusion comprises: forming a first protrusion and a second protrusion adjacent to each other; and patterning the conductive layer with the patterned photoresist layer as the etching mask comprises: respectively forming a first electrode on an outer surface of the first protrusion and the second protrusion, and forming a second electrode on a concave portion of the first protrusion and the second protrusion, and forming a first data line and a second data line simultaneously, wherein the first data line and the second data line are electrically connected to the first electrode on the first protrusion and the first electrode on the second protrusion respectively.

18. The fabricating method of the active device substrate according to claim 17, wherein the outer surface of the first protrusion has a first outer surface and a second outer surface arranged opposite to each other, the first electrode on the first protrusion and a portion of the semiconductor layer are disposed on the first outer surface of the first protrusion, and a portion of the second data line is disposed on the second outer surface of the first protrusion.

19. The fabricating method of the active device substrate according to claim 11, wherein the substrate comprises a display region and a peripheral region outside the display region, and forming the at least one protrusion comprises: forming a plurality of peripheral protrusions on the peripheral region to form active devices on the peripheral protrusions respectively, wherein a plurality of gates on the peripheral protrusions are electrically connected, a plurality of first electrodes on the peripheral protrusions are electrically connected, and a plurality of second electrodes on the peripheral protrusions are electrically connected.

20. The fabricating method of the active device substrate according to claim 19, wherein:

a conductive pattern is further formed on the peripheral region as the at least one pixel electrode is formed, so as to electrically connect a plurality of second electrodes on the peripheral protrusions.

\* \* \* \* \*